United States Patent
Duan et al.

(10) Patent No.: US 11,637,245 B2
(45) Date of Patent: Apr. 25, 2023

(54) ORGANIC ELECTROLUMINESCENCE DEVICE, PREPARATION METHOD THEREOF AND DISPLAY APPARATUS

(71) Applicants: KunShan Go-Visionox Opto-Electronics Co., Ltd, Kunshan (CN); TSINGHUA UNIVERSITY, Beijing (CN)

(72) Inventors: Lian Duan, Kunshan (CN); Minghan Cai, Kunshan (CN); Xiaozeng Song, Kunshan (CN); Jinbei Wei, Kunshan (CN)

(73) Assignees: KunShan Go-Visionox Opto-Electronics Co., Ltd, Kunshan (CN); TSINGHUA UNIVERSITY, Beijing (CN)

( * ) Notice: Subject to any disclaimer, the term of this patent is extended or adjusted under 35 U.S.C. 154(b) by 713 days.

(21) Appl. No.: 16/804,406

(22) Filed: Feb. 28, 2020

(65) Prior Publication Data
US 2020/0203651 A1 Jun. 25, 2020

Related U.S. Application Data

(63) Continuation of application No. PCT/CN2019/080590, filed on Mar. 29, 2019.

(30) Foreign Application Priority Data

Aug. 31, 2018 (CN) .......................... 201811014627.7

(51) Int. Cl.
*H01L 51/00* (2006.01)
*H01L 51/50* (2006.01)
*C09K 11/06* (2006.01)

(52) U.S. Cl.
CPC .......... *H01L 51/0067* (2013.01); *C09K 11/06* (2013.01); *H01L 51/008* (2013.01);
(Continued)

(58) Field of Classification Search
None
See application file for complete search history.

(56) References Cited

U.S. PATENT DOCUMENTS

| 9,985,233 B2 * | 5/2018 | Hashimoto | H01L 51/5016 |
| 2015/0001502 A1 * | 1/2015 | Seo | H01L 51/5024 257/40 |

(Continued)

FOREIGN PATENT DOCUMENTS

| CN | 102448946 A | 5/2012 |
| CN | 105602553 A | 5/2016 |

(Continued)

OTHER PUBLICATIONS

Sarma et al. "Exciplex: an intermolecular charge-transfer approach for TADF." ACS applied materials & interfaces 10.23 (2018): 19279-19304. (Year: 2018).*

(Continued)

*Primary Examiner* — Robert S Loewe
(74) *Attorney, Agent, or Firm* — Maier & Maier, PLLC

(57) ABSTRACT

An organic electroluminescence device and a display apparatus, where the organic electroluminescence device includes an organic light emitting layer which includes a host material, a sensitizer material, and a resonance thermally activated delayed fluorescent material, where the host material is a wide bandgap material, and the sensitizer material is an exciplex material, a singlet state energy level for the wide bandgap material is greater than a singlet state energy level for the exciplex, and a triplet state energy level for the wide bandgap material is greater than a triplet state (Continued)

energy level for the exciplex, and a singlet state energy level for the exciplex material is greater than a singlet state energy level for the resonance delayed fluorescent material, and a triplet state energy level for the exciplex material is greater than a triplet state energy level for the resonance delayed fluorescent material.

16 Claims, 1 Drawing Sheet

(52) U.S. Cl.
CPC ...... *H01L 51/0059* (2013.01); *H01L 51/0072* (2013.01); *H01L 51/5028* (2013.01); *C09K 2211/1022* (2013.01)

(56) References Cited

U.S. PATENT DOCUMENTS

| | | | |
|---|---|---|---|
| 2017/0346029 A1* | 11/2017 | Kim | H01L 51/5016 |
| 2018/0033987 A1* | 2/2018 | Kim | H01L 51/506 |
| 2018/0151821 A1* | 5/2018 | Peng | H01L 51/5096 |
| 2019/0013478 A1* | 1/2019 | Iijima | H01L 51/0071 |
| 2019/0019971 A1* | 1/2019 | Xie | C09K 11/06 |
| 2020/0321539 A1* | 10/2020 | Zhao | H01L 51/0072 |

FOREIGN PATENT DOCUMENTS

| | | |
|---|---|---|
| CN | 106803543 A | 6/2017 |
| CN | 108409742 A | 8/2018 |
| CN | 108409762 A | 8/2018 |
| CN | 109192874 A | 1/2019 |

OTHER PUBLICATIONS

Liang, Xiao, et al. "Peripheral amplification of multi-resonance induced thermally activated delayed fluorescence for highly efficient OLEDs." Angewandte Chemie 130.35 (2018): 11486-11490. (Year: 2018).*

Hatakeyama, Takuji, et al. "Ultrapure blue thermally activated delayed fluorescence molecules: efficient HOMO-LUMO separation by the multiple resonance effect." Advanced Materials 28.14 (2016): 2777-2781. (Year: 2016).*

International Search Report and Written Opinion dated Jun. 5, 2019 in corresponding International application No. PCT/CN2019/080590; 11 pages including Partial English-language translation.

Chinese Office Action dated Jun. 4, 2019 in corresponding Chinese application No. 201811014627.7; 5 pages.

Tao, "Designs, Synthesis and Properties of Aryl Phosphine Organic Optoelectronic Materials", Nanjing University of Posts and Telecommunications for the Degree of Doctor of Philosophy, 2016; 149 pages including English-language Abstract translation.

* cited by examiner

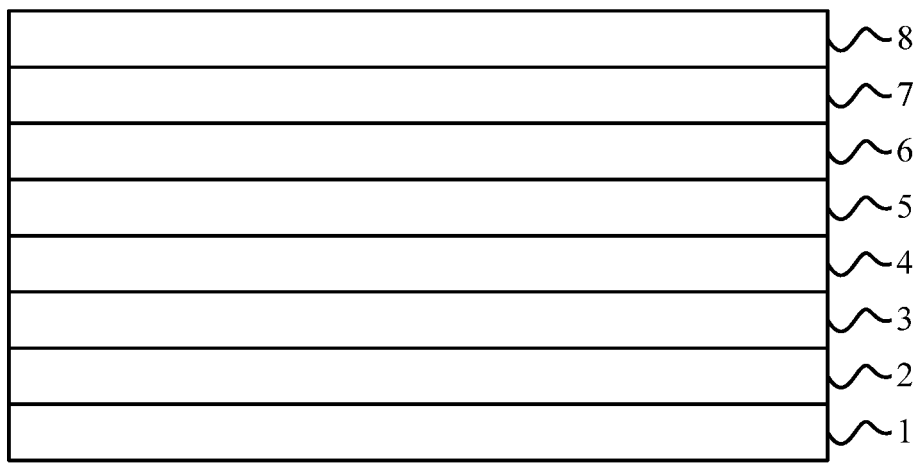

ORGANIC ELECTROLUMINESCENCE DEVICE, PREPARATION METHOD THEREOF AND DISPLAY APPARATUS

CROSS-REFERENCE TO RELATED APPLICATIONS

This application is a continuation of International Application No. PCT/CN2019/080590, filed on Mar. 29, 2019, which claims the priority benefit of China Patent Application No. 201811014627.7, filed on Aug. 31, 2018. The contents of the above identified applications are incorporated herein by reference in their entireties.

FIELD

The present application relates to an organic electroluminescence device, a preparation method thereof, and a display apparatus, falling into the technical field of organic electroluminescence.

BACKGROUND

An organic light emitting diode (OLED) is a device that achieves the purpose of light emission when driven by an electrical current. A main feature of OLED comes from the organic light emitting layer therein. When an appropriate voltage is applied thereto, electrons and holes are combined in the organic light emitting layer to generate excitons, emitting light at various wavelengths according to the characteristics of the organic light emitting layer. At present, the light emitting layer is made from a host material and a dopant dye, where the dye is often selected from traditional fluorescent materials and traditional phosphorescent materials.

Compared with traditional phosphorescent materials and traditional fluorescent materials, thermally activated delayed fluorescence (TADF) materials can absorb ambient heat to realize reverse intersystem crossing for the triplet excitons to a singlet state, thus emitting fluorescence from the singlet state, thereby enabling 100% utilization of excitons without the need for any heavy metal. Hence, at present, 100% energy usage efficiency is mostly achieved by doping the host material with the TADF material.

SUMMARY

The application provides an organic electroluminescence device, a preparation method thereof, and a display apparatus. An organic light emitting layer of the device uses a wide bandgap material as a host material, and uses an exciplex as a sensitizer material to assist a sensitized resonance TADF dye to emit light, thereby overcoming the defects of short device service life, high efficiency roll-off and poor color purity caused by existing use of traditional TADF materials to emit light.

The present application provides an organic electroluminescence device including an organic light emitting layer; the organic light emitting layer includes a host material, a sensitizer material, and a resonance thermally activated delayed fluorescent material; the host material is a wide bandgap material; the sensitizer material is an exciplex; a singlet state energy level for the wide bandgap material is greater than a singlet state energy level for the exciplex, and a triplet state energy level for the wide bandgap material is greater than a triplet state energy level for the exciplex; a singlet state energy level for the exciplex is greater than a singlet state energy level for the resonance delayed fluorescent material, and a triplet state energy level for the exciplex is greater than a triplet state energy level for the resonance delayed fluorescent material.

Optionally, the resonance thermally activated delayed fluorescent material has a structure represented by formula [1]:

Formula [1]

X is independently selected from one of B, P, P=O, P=S, $SiR_1$; $R_1$ is selected from hydrogen, substituted or unsubstituted $C_1$-$C_{36}$ alkyl, substituted or unsubstituted $C_6$-$C_{30}$ aryl, substituted or unsubstituted $C_3$-$C_{30}$ heteroaryl;

A is selected from substituted or unsubstituted $C_6$-$C_{30}$ aryl, substituted or unsubstituted $C_3$-$C_{30}$ heteroaryl, substituted or unsubstituted $C_6$-$C_{30}$ arylamino;

$M^1$ and $M^2$ are each independently selected from H, substituted or unsubstituted $C_1$-$C_{36}$ alkyl, substituted or unsubstituted $C_6$-$C_{30}$ aryl, substituted or unsubstituted $C_3$-$C_{30}$ heteroaryl;

at least three of adjacent X, A, $M^1$ and $M^2$ are joined into a ring that includes X;

the 'a' in the formular (I) is an integer of 1-12; preferably, the 'a' in the formular (I) is an integer of 1-6;

when a substituent is presented in the above group, the substituents is individually and independently selected from one or more of halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl.

Optionally, three of adjacent X, A, $M^1$ and $M^2$ are joined into a hexatomic ring comprising two heteroatoms; and the heteroatoms are selected from two of B, P, Si, O, S, N, and Se.

Optionally, the resonance thermally activated delayed fluorescent material has a molecular weight of 200-2000.

Optionally, the resonance thermally activated delayed fluorescent material is a compound having one of the general formulas (F-1) to (F-29) in the present application, where R is individually and independently selected from one or more of hydrogen, halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl, and Y is independently selected from O, S, and Se.

Optionally, the resonance thermally activated delayed fluorescent material is a compound having one of the general formulas (M-1) to (M-72) of the present application.

Optionally, the exciplex includes an electron donor material and an electron acceptor material, the electron donor material being a compound having hole transporting characteristic and containing at least one of carbazolyl, arylamino, silyl, fluorenyl, dibenzothienyl, and dibenzofurylaryl;

and/or, the electron acceptor material being a compound having electron transporting characteristic and containing at least one of pyridyl, pyrimidinyl, triazinyl, imidazolyl, phenanthroline, sulfone, heptazinyl, oxadiazolyl, cyano, and diphenylphosphonyl.

Optionally, the weight ratio of the electron donor material to the electron acceptor material in the exciplex is 1:9-9:1.

Optionally, the wide bandgap material is a compound comprising at least one of carbazolyl, carbolinyl, spirofluorenyl, fluorenyl, silyl, and phosphonooxy.

Optionally, the weight percentage (doping concentration) of the exciplex in the organic light emitting layer is 1 wt %-60 wt %.

Optionally, the weight percentage (doping concentration) of the wide bandgap material in the organic light emitting layer is 20 wt %-98.9 wt %.

Optionally, the percentage of the resonance thermally activated delayed fluorescent material in the organic light emitting layer is 0.1 wt %-20 wt %.

The present application also provides a display apparatus including any one of the organic electroluminescence material described above.

The present application also provides a method for preparing an organic electroluminescence device, including the following steps: forming an organic light emitting layer by co-evaporation plating of a wide bandgap material, an electron donor material, an electron acceptor material, and a resonance thermally activated delayed fluorescent material.

Optionally, before forming the organic light emitting layer, the method further includes: providing a substrate having an anode material thereon; performing evaporation plating of a hole transporting region material onto the substrate to form a hole transporting region, wherein the evaporation plating is performed under conditions of $1 \times 10^{-5} \sim 9 \times 10^{-3}$ Pa at an evaporation plating rate of 0.1 to 0.5 nm/s.

Optionally, after the forming an organic light emitting layer, the method further includes: performing evaporation plating of an electron transporting region material on the organic light emitting layer to form an electron transporting region, where an evaporation plating rate is 0.1-0.5 nm/s.

Optionally, the method further includes a step of forming a cathode over the organic light emitting layer: performing evaporation plating of a cathode material to form a cathode, and an evaporation plating rate is 0.5 to 1 nm/s.

The organic electroluminescence device of the present application uses a wide bandgap material as a host material, and uses an exciplex as an auxiliary host material to sensitize the resonance TADF material to emit light. After the holes and electrons are recombined, the singlet excitons and triplet excitons of the sensitizer material, i.e., the exciplex, can be used and transported to the singlet state and triplet state energy levels, respectively, of the resonance TADF material. Meanwhile, because the resonance TADF materials can experience reverse intersystem crossing, hence being able to emit light using both singlet excitons as well as excitons transiting from triplet state to its own singlet state. In addition, because the sensitizer material, i.e., the exciplex, can convert a part of triplet energy itself into the singlet state, hence inhibiting Dexter energy transfer process and promotes Föster energy transfer. Thus, effectively improving the light emitting efficiency of the organic electroluminescence device of the present application while reducing the efficiency roll-off caused by extensive long triplet state life at high brightness. In addition, as a sensitizer material, the exciplex can at the same time balance the transport of carriers in the light emitting layer, widen the recombination region for the excitons, and further reduce the efficiency roll-off. Meanwhile, the wide bandgap host can effectively dilute the exciton concentration for the sensitizer material and the resonance TADF, reducing the triplet-triplet annihilation (TTA) and triplet-polaron annihilation (TPA), which enhances the stability of the device. In addition, the resonance TADF material used in the present application does not have any significant intramolecular electron transfer, so it is beneficial to narrow the spectrum and improve the color purity of the device.

BRIEF DESCRIPTION OF THE DRAWINGS

FIG. 1 is a schematic structural diagram of an organic electroluminescence device of the present application.

DESCRIPTION OF EMBODIMENTS

FIG. 1 is a schematic structural diagram of an organic electroluminescence device of the present application. As shown in FIG. 1, the organic electroluminescence device of the present application includes a substrate 1, on which an anode 2, a hole transporting region 3, an organic light emitting layer 4, an electron transporting region 5 and cathode 6 are sequentially deposited.

Specifically, the substrate 1 may be made of glass or a polymer material having excellent mechanical strength, thermal stability, water resistance, and transparency. In addition, the substrate 1 to be used as the display may also be provided with a thin film transistor (TFT).

The anode 2 can be formed by sputtering or depositing an anode material on a substrate 1. The anode material can use a transparent and conductive oxide material, such as indium tin oxide (ITO), indium zinc oxide (IZO), tin dioxide ($SnO_2$), zinc oxide (ZnO), etc. and any combination thereof. The cathode 6 can use a metal or an alloy, such as magnesium (Mg), silver (Ag), aluminum (Al), aluminum-lithium (Al—Li), calcium (Ca), magnesium-indium (Mg—In), magnesium-silver (Mg—Ag), etc. and any combination thereof.

An organic material layer in the hole transporting region 3, organic light emitting layer 4, electron transporting region 5 and cathode 6 can be prepared, in sequence, on the anode by methods such as vacuum thermal evaporation plating, spin coating, and printing, etc. A compound used for the organic material layer may be organic micro-molecular, organic macro-molecular, polymers, and combinations thereof.

Now, the organic light emitting layer 4 will be described in detail.

At present, most TADF materials are flawed as dyes to emit light. For example, due to the intramolecular charge transfer in TADF materials, the light emitting spectrum is often too wide and the light color is not pure. Moreover, due to the high triplet state energy level and long lifecycle of the triplet exciton of the TADF materials, the device is resulted in suffering large roll-off and short service life, etc. In addition, most host materials are characterized by unipolar transmission, resulting in uneven transportation of electrons and holes in the light emitting layer, as well as serious efficiency roll-off at high brightness, providing poor spectral stability.

The organic light emitting layer of the present application includes a host material, a sensitizer material, and a resonance thermally activated delayed fluorescent material, where the host material is a wide bandgap material, the sensitizer material is an exciplex, the singlet state energy level for the wide bandgap material is greater than the singlet state energy level for the exciplex, the triplet state energy level for the wide bandgap material is greater than the triplet state energy level for the exciplex; the singlet state energy level for the exciplex is greater than the singlet state energy level for the resonance delayed fluorescent material, the triplet state energy level for the exciplex is greater than the triplet state energy level for the resonance delayed fluorescent material.

The host material of the present application is a wide bandgap material, which can dilute the concentrations of the sensitizer and the resonance TADF material, effectively reducing the exciton density and thereby effectively inhibiting triplet-triplet annihilation (TTA) and excitons-polaron annihilation (TPA), which further enhances the stability of the organic electroluminescence device, improves device life, and reduces efficiency roll-off. In particular, the difference between the HOMO (highest occupied molecular orbital) energy level and the LUMO (lowest unoccupied molecular orbital) energy level of the wide bandgap material of the present application is ≥2 eV, so as to ensure that the singlet state and triplet state of the wide bandgap material are at higher energy levels, which is beneficial for occurring Föster energy transfer process and inhibits Dexter energy transfer process from the wide bandgap material to the sensitizer material.

The sensitizer material of the present application is an exciplex, which is the material used to assist the wide bandgap material to sensitize the resonance TADF. The exciplex has a thermally activated delayed fluorescence effect, that is, a triplet exciton of the exciplex can transit to a singlet state by absorbing ambient heat, that is, performing the reverse intersystem crossing.

The resonance TADF material of the present application emits light as a dye. Since the resonance TADF molecules mostly have a rigid planar aromatic structure, the structure is stable. In resonance TADF molecules, the different resonance effects of different atoms lead to the spatial separation of HOMO and LUMO of molecule in different atoms, with small overlap areas, which leads to small energy level difference between the singlet state and triplet state of the resonance TADF. Thus, the resonance TADF material can experience reverse intersystem crossing. Preferably, the energy level difference between the singlet state and the triplet state of the resonance TADF of the present application is 0.3 eV or less, and is capable of performing the reverse intersystem crossing by absorbing ambient heat. Meanwhile, there is no significant donor group and acceptor group in the resonance TADF molecule, so the resonance TADF molecule has weak intramolecular charge transfer and high stability.

In the present application, the host material is a wide bandgap material, the sensitizer material is an exciplex, the singlet state energy level for the host material is greater than the singlet state energy level for the sensitizer material, and the singlet state energy level for the sensitizer is greater than the singlet state energy level for the resonance TADF. The triplet state energy level for the host material is greater than the triplet state energy level for the sensitizer material, and the triplet state energy level for the sensitizer material is greater than the triplet state energy level for the resonance TADF. Therefore, when the organic electroluminescence device is electrically excited, energy of both the singlet and triplet excitons of the wide bandgap material can be respectively transferred to the singlet and triplet states of the sensitizer material, or the holes and electrons are directly recombined on the sensitizer. Since the sensitizer material is an exciplex having characteristic of activated delayed fluorescent, the triplet exciton of the sensitizer material will transit to the singlet state of the sensitizer material, and then the energy will be transferred from the singlet state of the sensitizer material to the singlet state of the resonance TADF. In addition, the triplet excitons of the resonance TADF also occurs the reverse intersystem crossing to their own singlet state. As a result, energy of both the singlet state and triplet state in the organic electroluminescence device are fully utilized, improving light emitting efficiency of the organic electroluminescence device. Meanwhile, the sensitizer material can convert its triplet excitons into singlet state, which effectively inhibits the Dexter energy transfer between the sensitizer material and the resonance dye and promotes the Föster energy transfer process. Thus, the present application can effectively reduce the concentration of triplet excitons, thereby solving the problem of significant reduce of roll-off at high brightness and effectively enhancing the stability of the organic electroluminescence device.

In addition, the present application uses the resonance TADF as the dye for light emitting. Since there is no significant intramolecular charge transfer excitation state in the resonance TADF molecule, a narrow light emitting spectrum can be obtained.

The present application introduces innovation into the composition of the organic light emitting layer by using the exciplex as the sensitizer material to assist the wide bandgap material to sensitize the resonance TADF, allowing for not only improving the service life of the organic electroluminescence device, reducing roll-off, narrowing the spectrum, but also great significance in industrial applications.

In order to further solve the problem of serious efficiency roll-off for the device, the percentage of the exciplex in the organic light emitting layer is 1 wt %-60 wt %, the percentage of the wide bandgap material in the organic light emitting layer is 20 wt %-98.9 wt %, and the percentage of the resonance thermally activated delayed fluorescent material in the organic light emitting layer is 0.1 wt %-20 wt %.

Furthermore, the above-mentioned resonance thermally activated delayed fluorescent material has a structure represented by formula [1]:

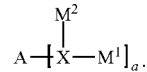

Formula [1]

X is independently selected from one of B, P, P=O, P=S, $SiR_1$; $R_1$ is selected from hydrogen, substituted or unsubstituted $C_1$-$C_{36}$ alkyl, substituted or unsubstituted $C_6$-$C_{30}$ aryl, substituted or unsubstituted $C_3$-$C_{30}$ heteroaryl; A is selected from substituted or unsubstituted $C_6$-$C_{30}$ aryl, substituted or unsubstituted $C_3$-$C_{30}$ heteroaryl, substituted or unsubstituted $C_6$-$C_{30}$ arylamino; $M^1$ and $M^2$ are each independently selected from H, substituted or unsubstituted $C_1$-$C_{36}$ alkyl, substituted or unsubstituted $C_6$-$C_{30}$ aryl, substituted or unsubstituted $C_3$-$C_{30}$ heteroaryl; at least three of adjacent X, A, $M^1$ and $M^2$ are joined into a ring that includes X; a is an integer from 1 to 12; when a substituent is presented in the above group, the substituent is individually and independently selected from one or more of halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl.

When X is independently selected from P=O and P=S, P is connected to $M^1$ and $M^2$ respectively, and when X is selected from $SiR_1$, Si is connected to $M^1$ and $M^2$ respectively.

It should be emphasized that in the structure of Formula [1], the X, $M^1$ and $M^2$ with the amount of a can be selected independently of each other, i.e., each unit containing the X, $M^1$ and $M^2$ can be the same or different, and the $M^1$ and $M^2$ in each unit may be the same or different. Furthermore, in the resonance TADF of the present application, at least one ring is created by joining at least three of adjacent X, A, $M^1$ and $M^2$.

Furthermore, in the resonance TADF shown in Formula [1] of the present application, adjacent X, A, $M^1$, and $M^2$ are joined into a hexatomic ring including two heteroatoms, where the heteroatoms are selected from two of B, P, Si, O, S, N, and Se.

Specifically, adjacent X, A and $M^1$ may be joined into a hexatomic ring including two heteroatoms, adjacent X, A and $M^2$ may be joined into a hexatomic ring including two heteroatoms, and adjacent X, $M^1$ and $M^2$ may be joined into a hexatomic ring including two heteroatoms.

One heteroatom in the hexatomic ring comes from X, which may specifically be B, P or Si, and the other heteroatom is selected from one of O, S, N and Se. When the heteroatom is N, since the N atom is trivalent, it can be connected to a hydrogen atom as well as an alkyl substituent. Specifically, the substituent may be one or more of cyano, $C_1$-$C_{10}$ alkyl or cycloalkyl, $C_2$-$C_6$ alkenyl or cycloalkenyl, $C_1$-$C_6$ alkoxy or thioalkoxy, $C_6$-$C_{30}$ aryl, and $C_3$-$C_{30}$ heteroaryl.

As a preferred solution, the present application selects a resonance TADF material with a molecular weight of 200-2000 as the dye because a resonance TADF material whose molecule is too large is undesirable for evaporation plating in practice operating process.

As an implementation, the controlling of the molecular weight of the resonance TADF can be achieved by limiting the a to an integer of 1-6. That is, the resonance TADF of the present application may include 1-6 units having X, $M^1$ and $M^2$.

Preferably, the resonance TADF material of the present application may have a structure represented by one of the following general formulas (F-1) to (F-29):

F-1
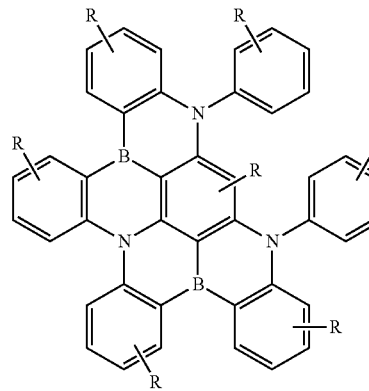

F-2
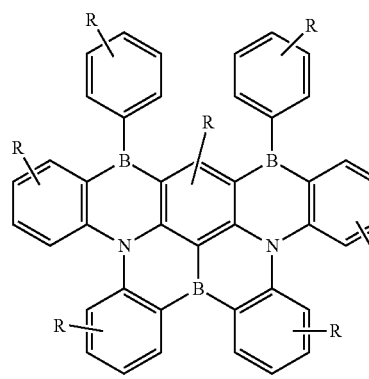

F-3
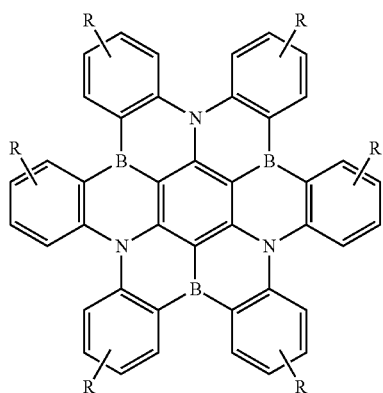

F-4
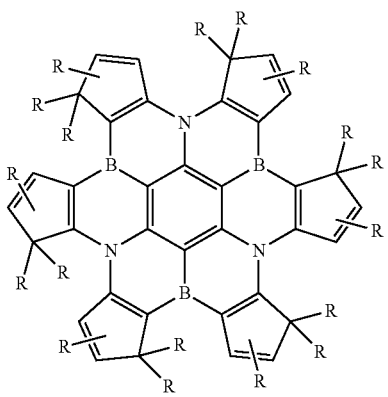

F-5
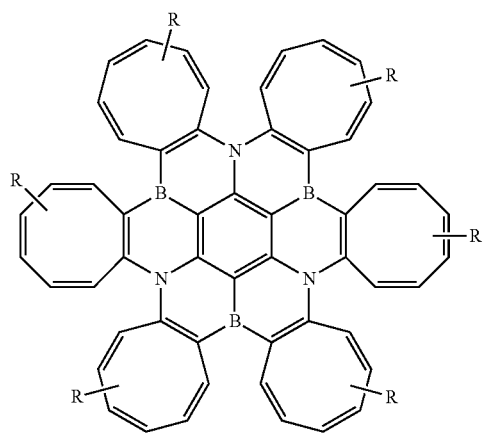

F-6
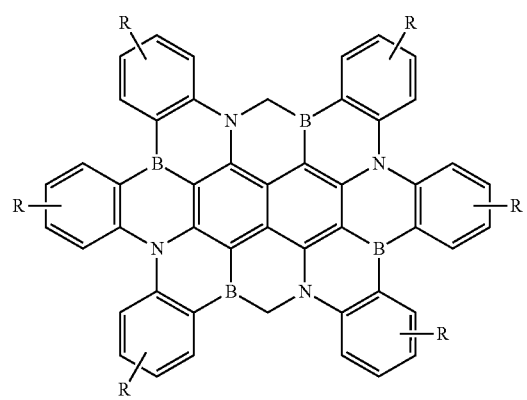

-continued
F-7
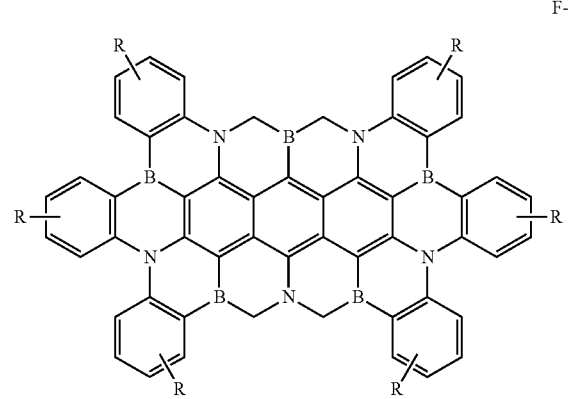
F-8
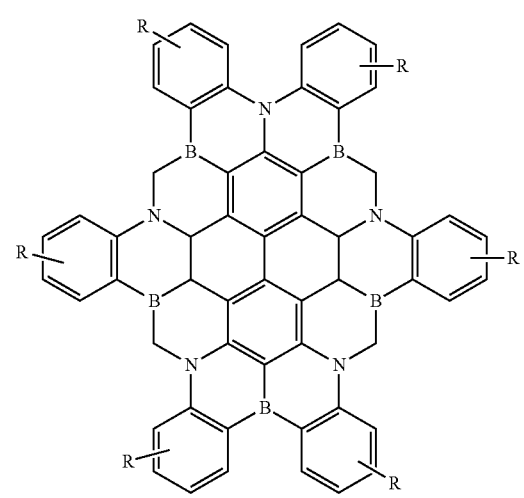
F-9
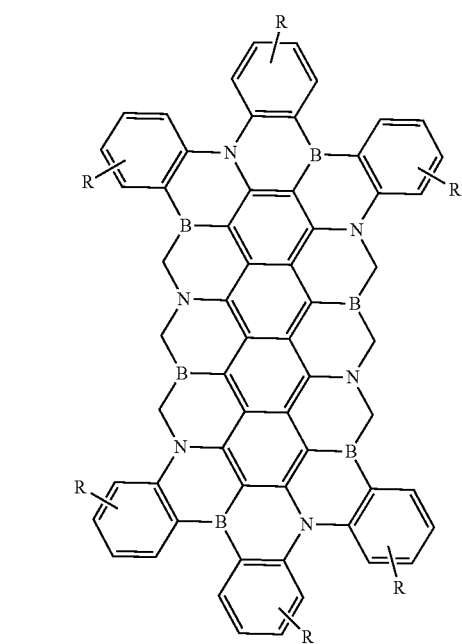
-continued
F-10
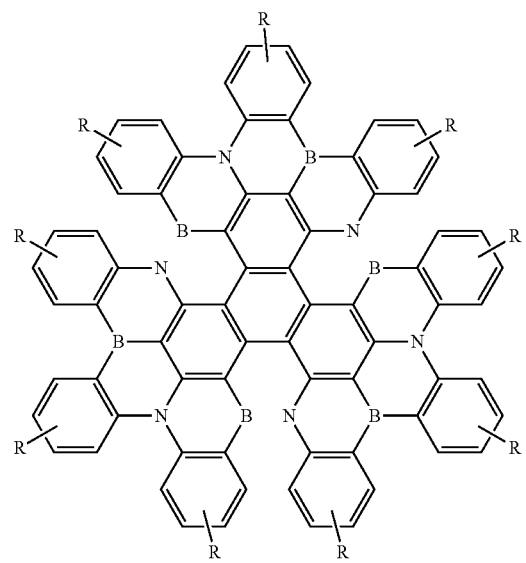
F-11
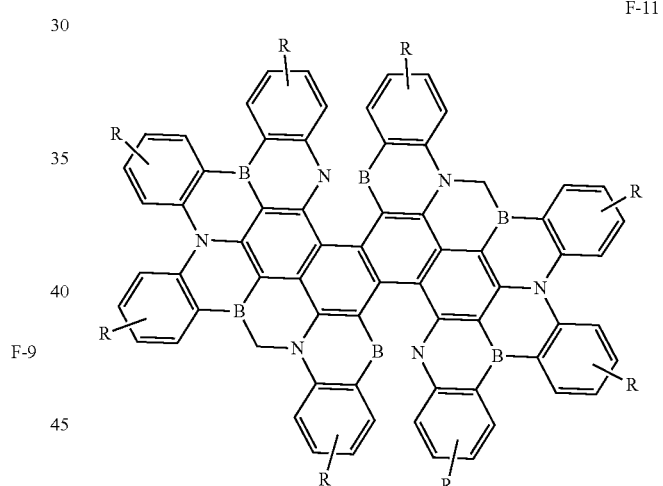
F-12
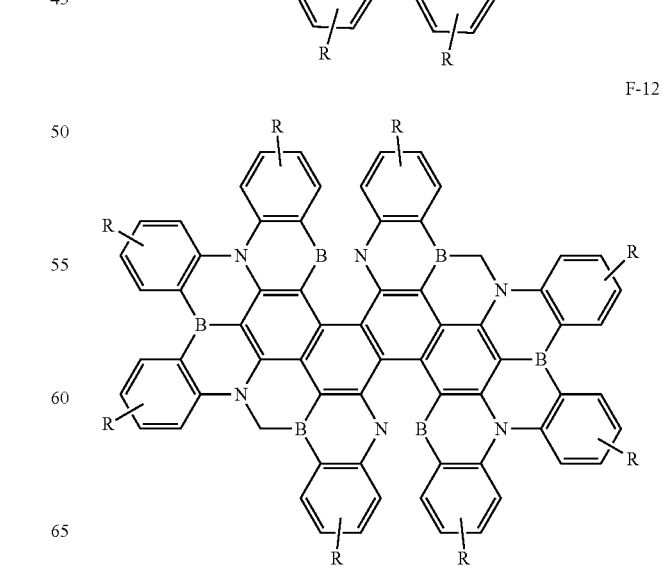

F-13
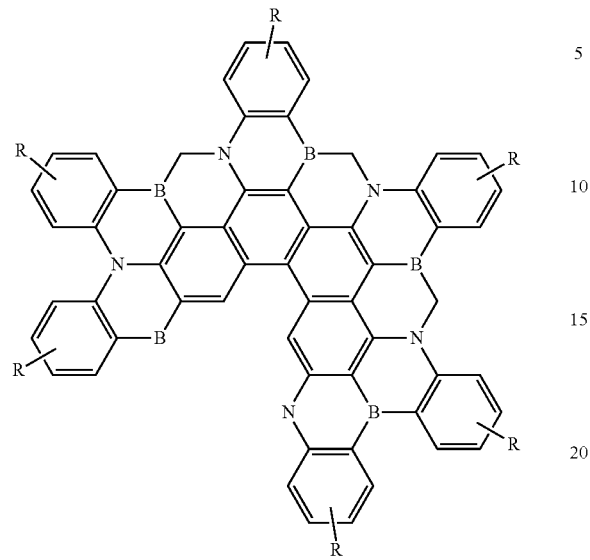
F-14
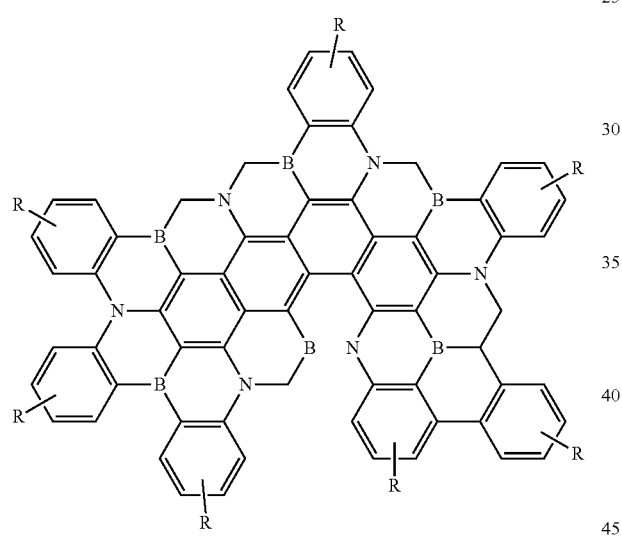
F-15
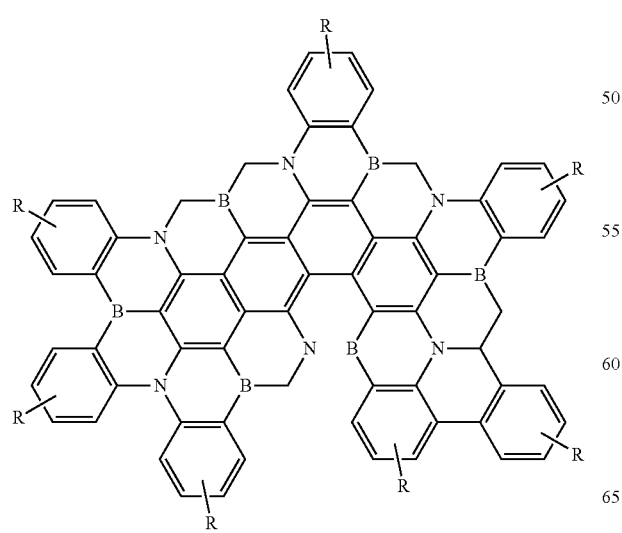
F-16
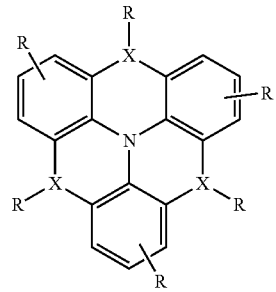
F-17
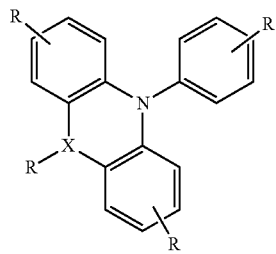
F-18
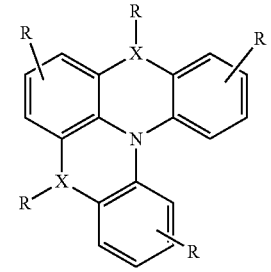
F-19
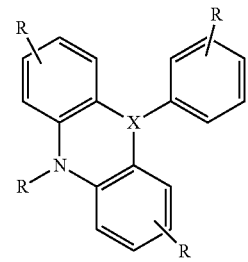
F-20
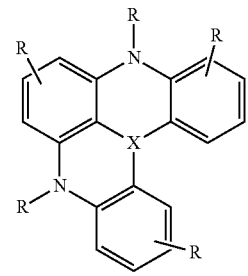

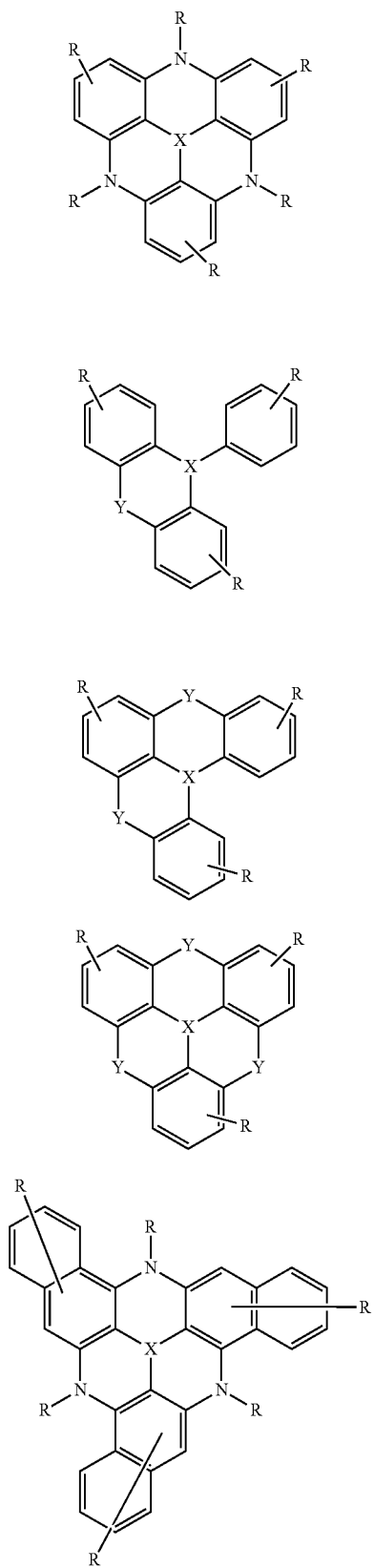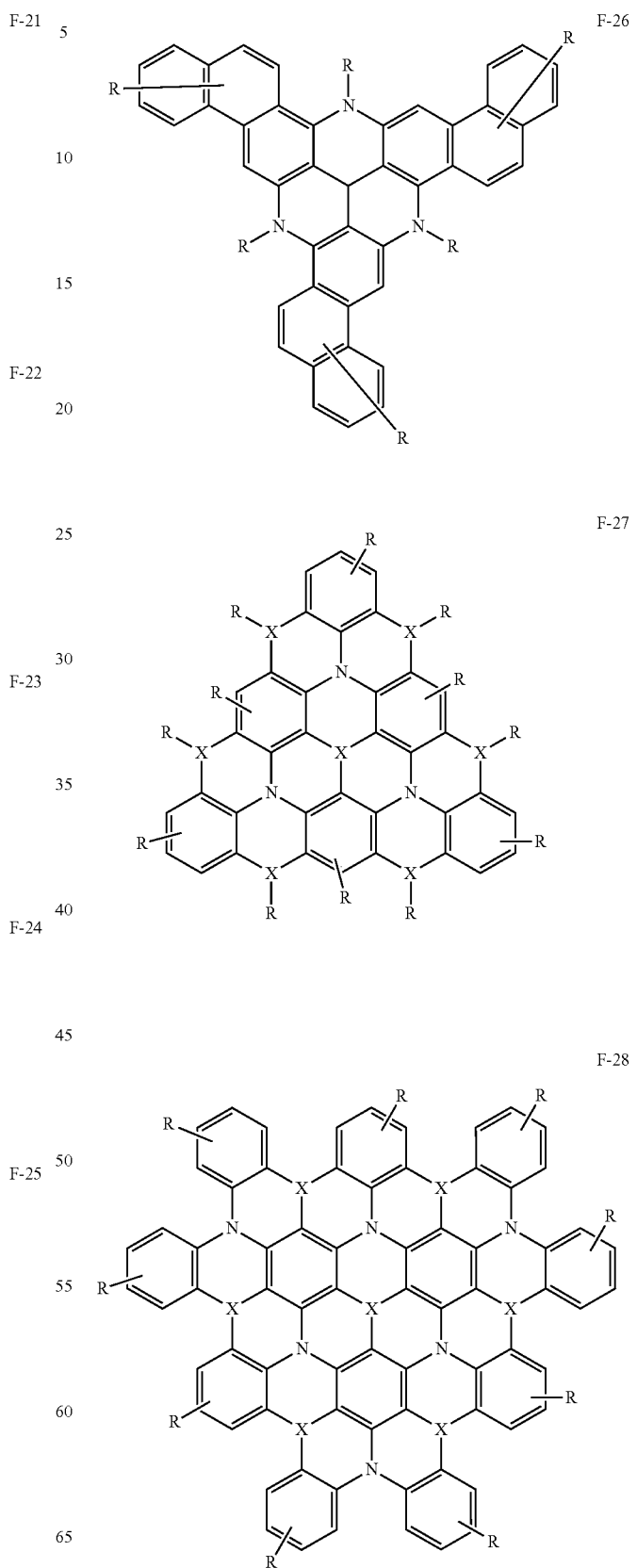

-continued

F-29

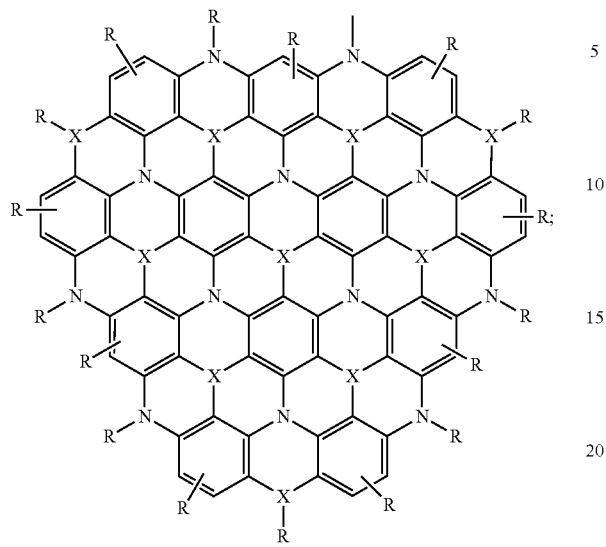

R is individually and independently selected from one or more of hydrogen, halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl; and Y is independently selected from O, S, and Se.

Further preferably, the resonance thermally activated delayed fluorescent material of the present application is a compound having one of the following structures:

M-1

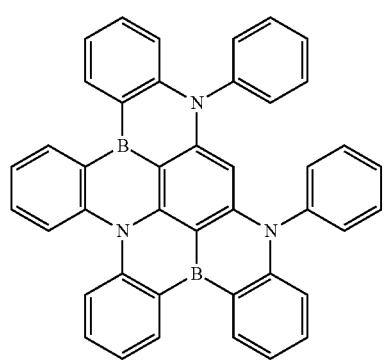

M-2

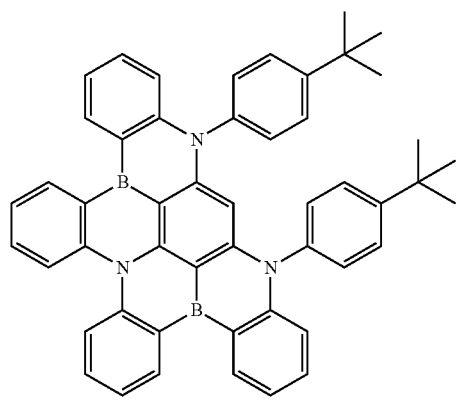

M-3
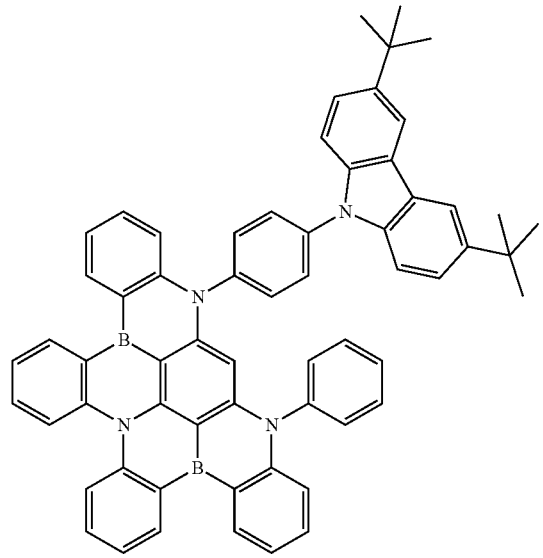
M-4
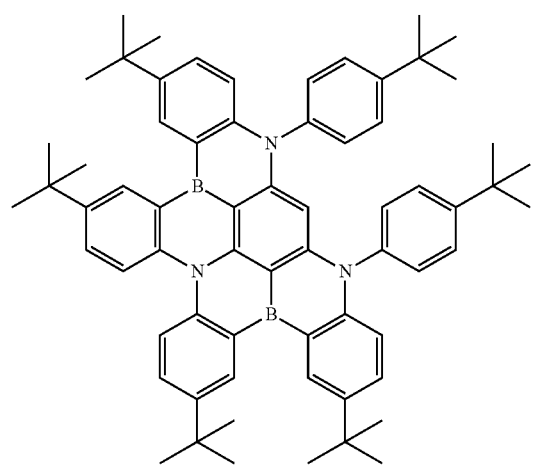
M-5
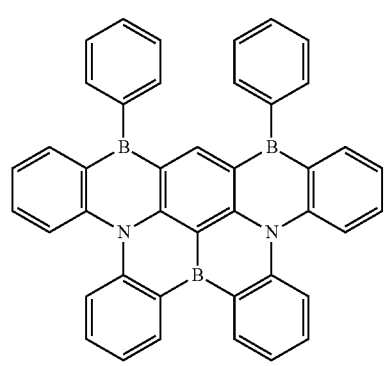

M-6
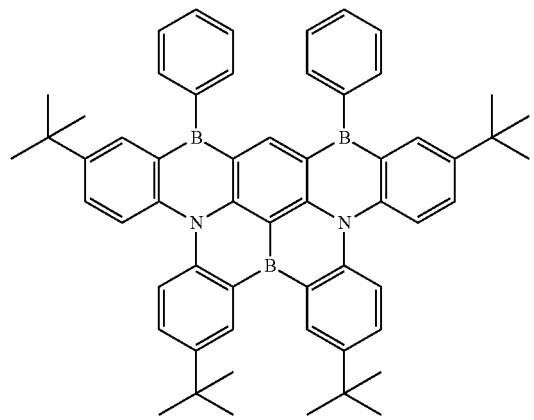
M-7
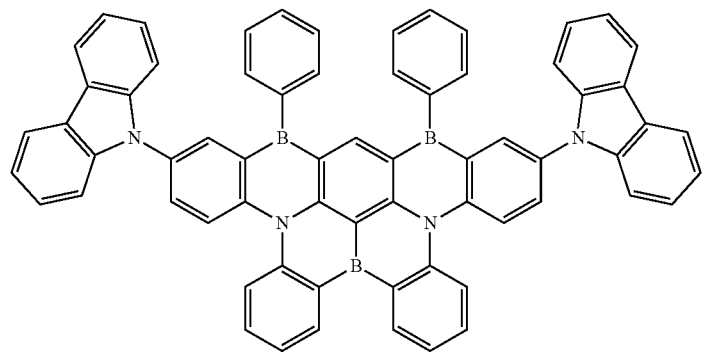
M-8
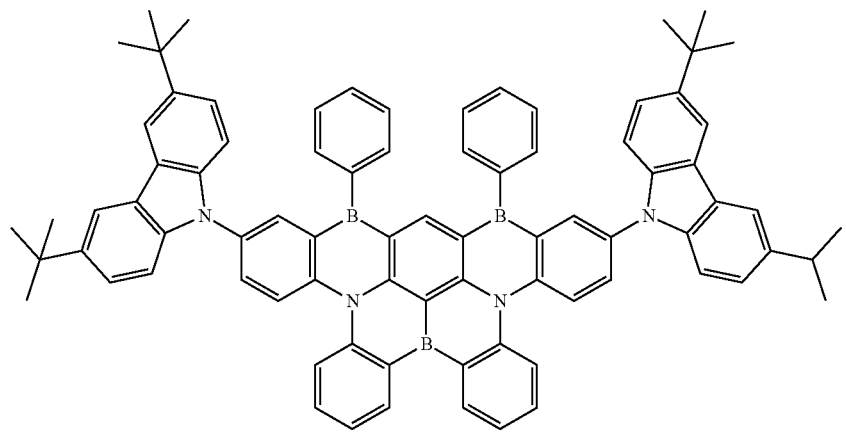
M-9
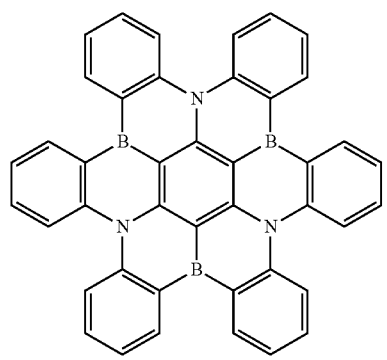

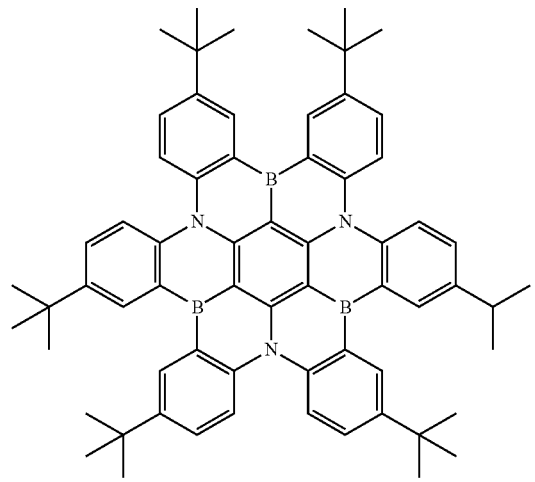
M-10
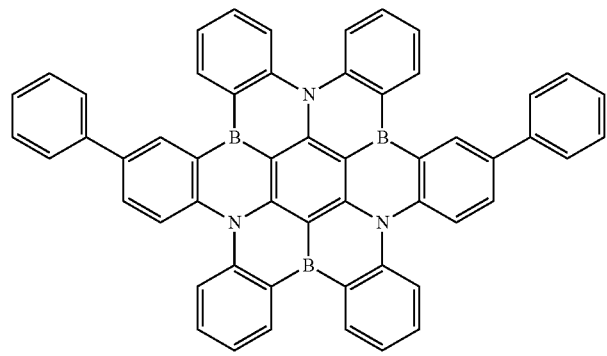
M-11
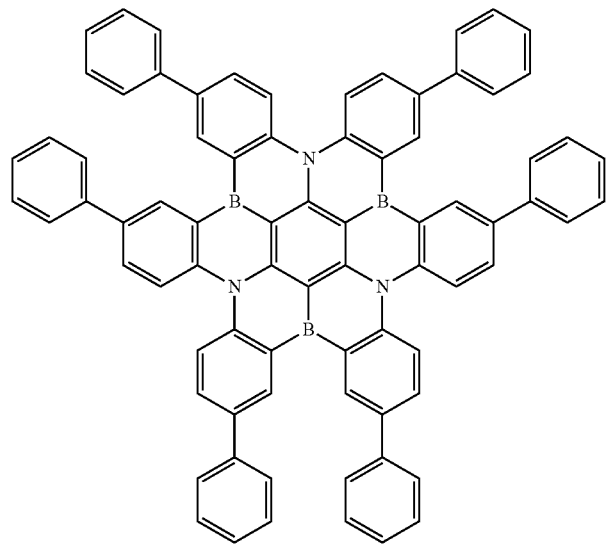
M-12

M-13
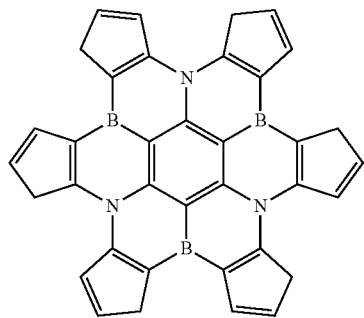
M-14
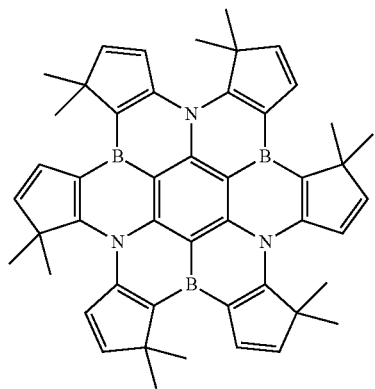
M-15
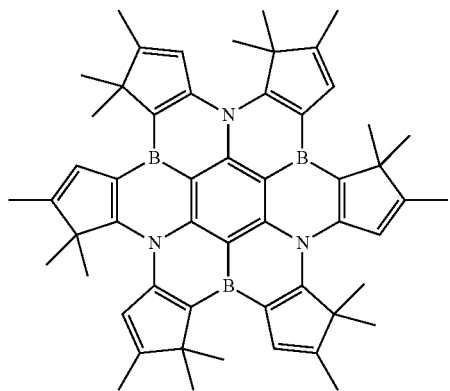

M-16
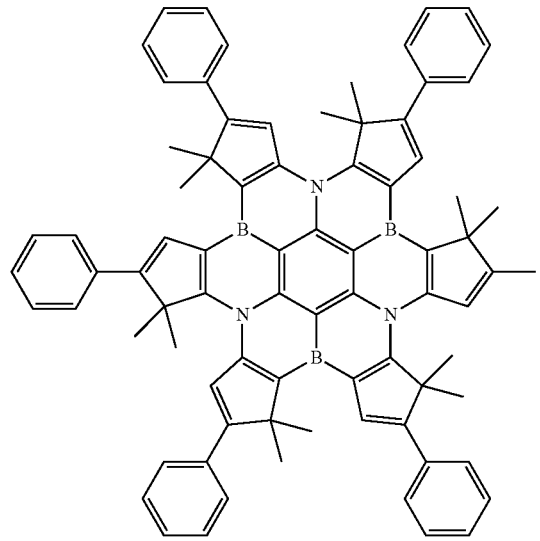
M-17
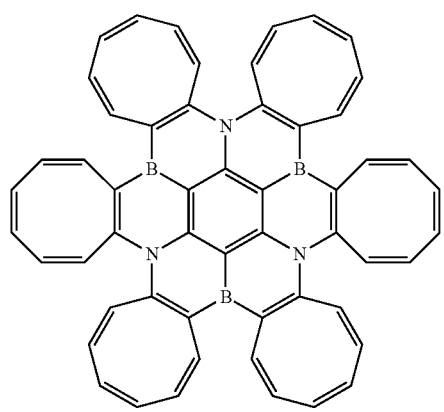
M-18
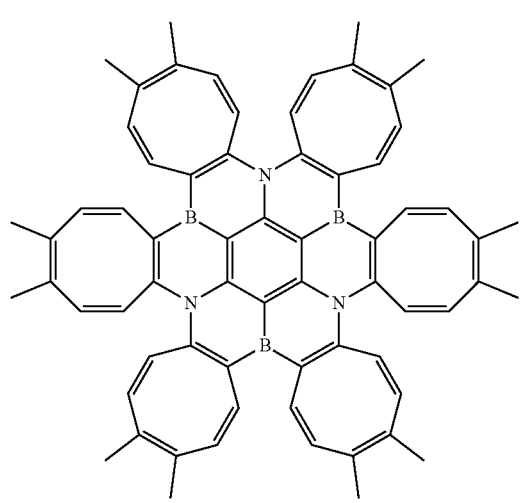

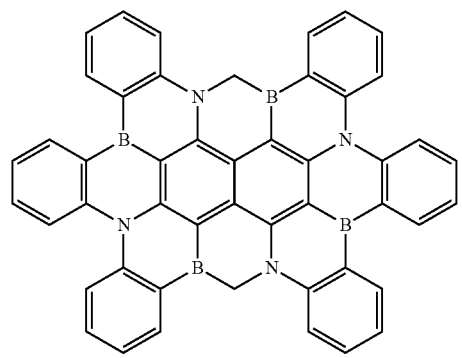
M-19
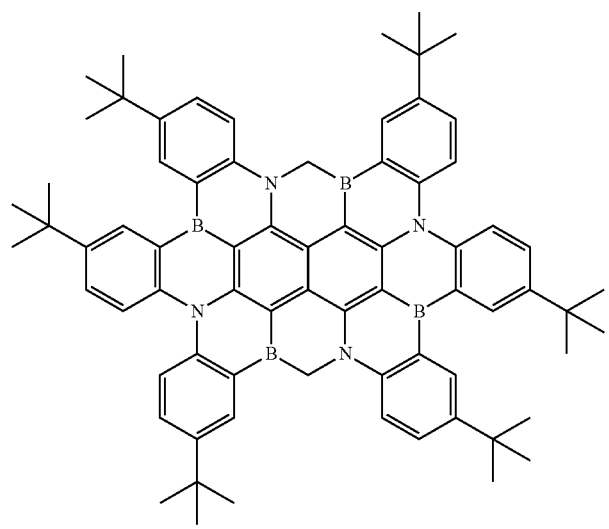
M-20
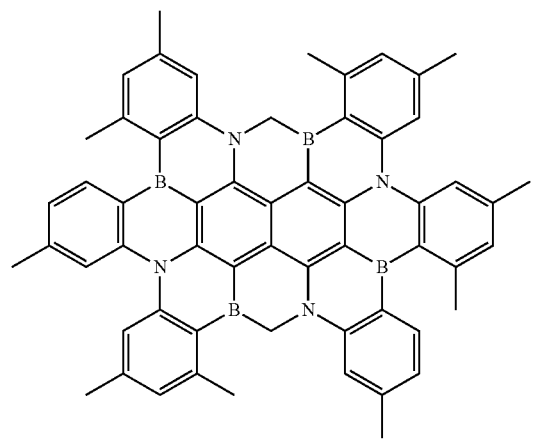
M-21

M-22
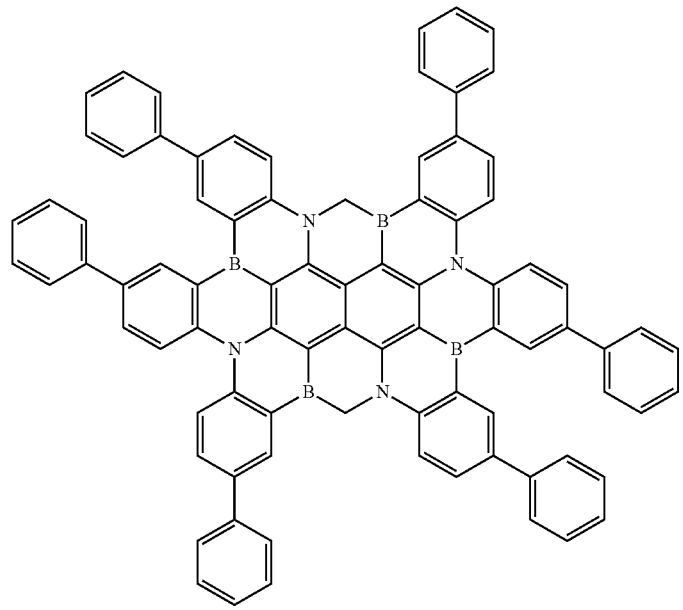
M-23
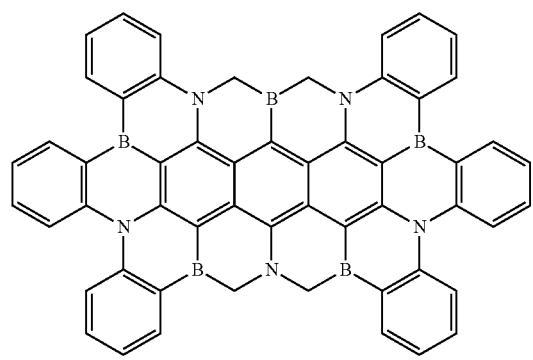
M-24
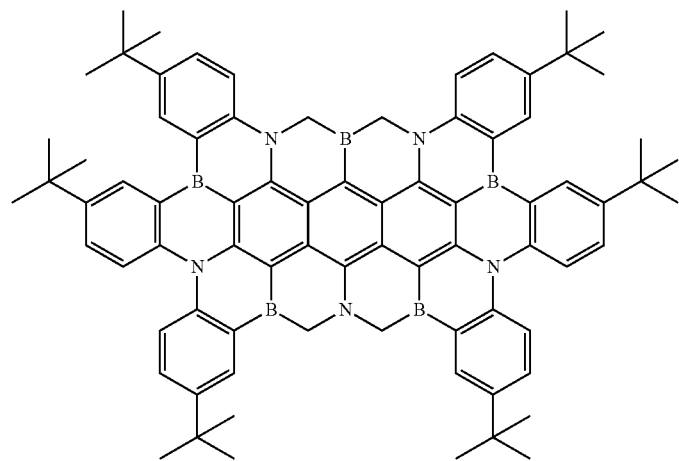

M-25
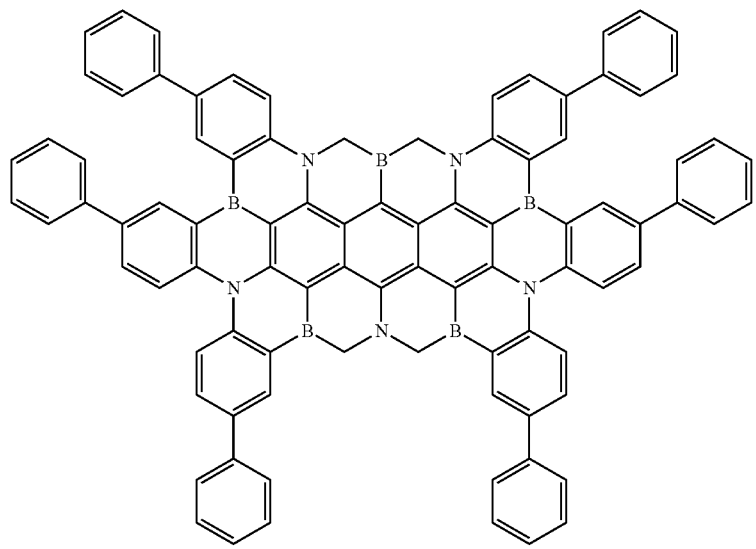
M-26
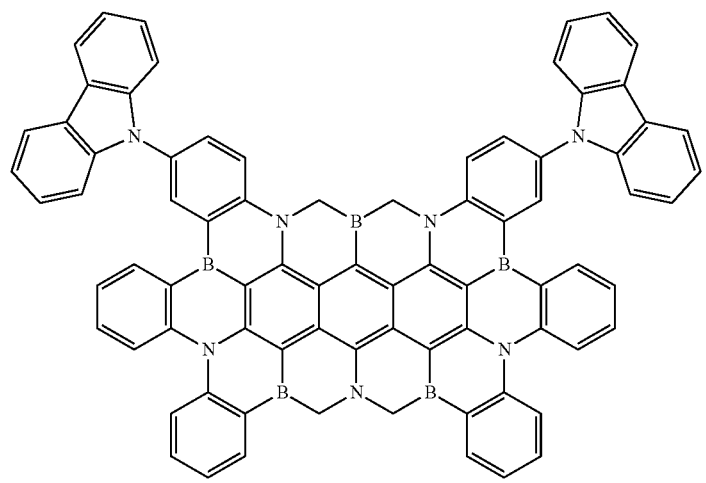
M-27
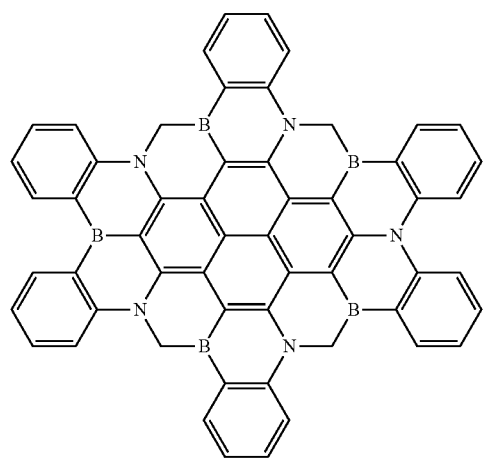

M-28
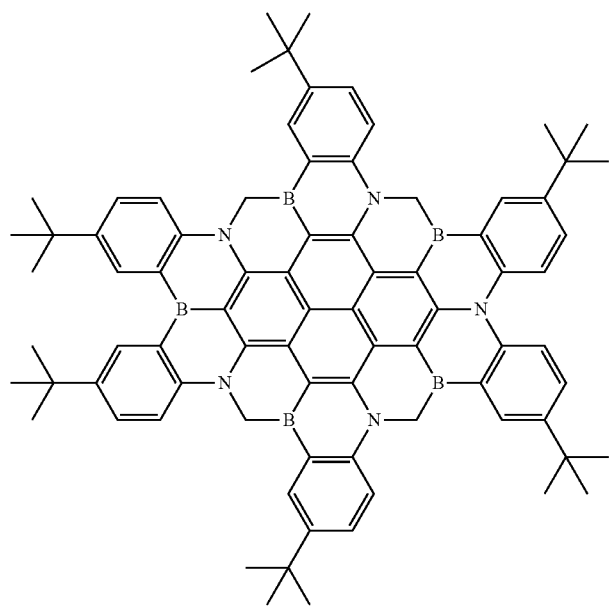
M-29
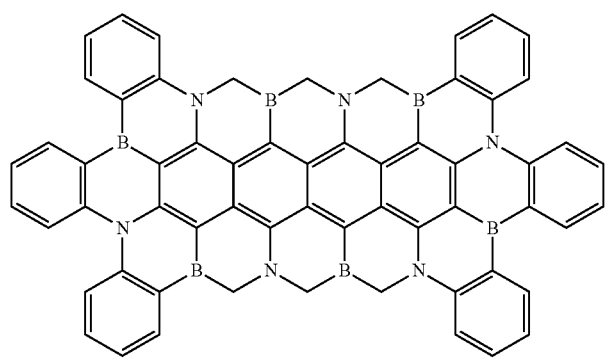
M-30
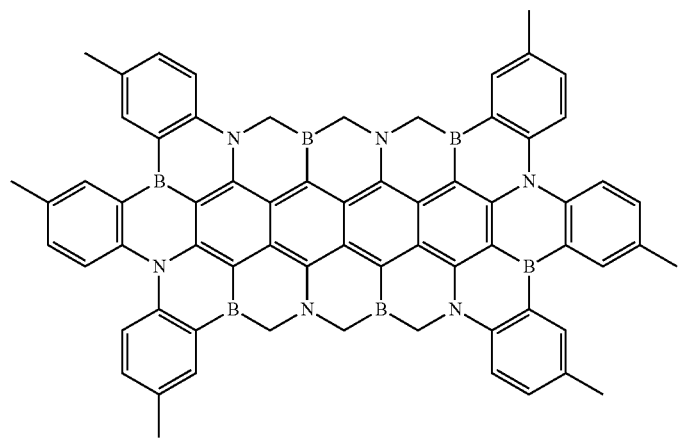

M-31
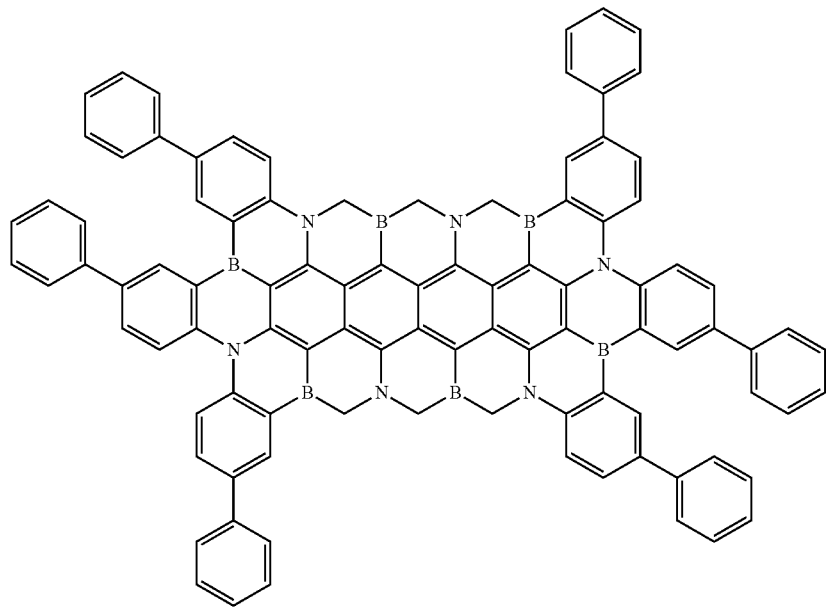
M-32
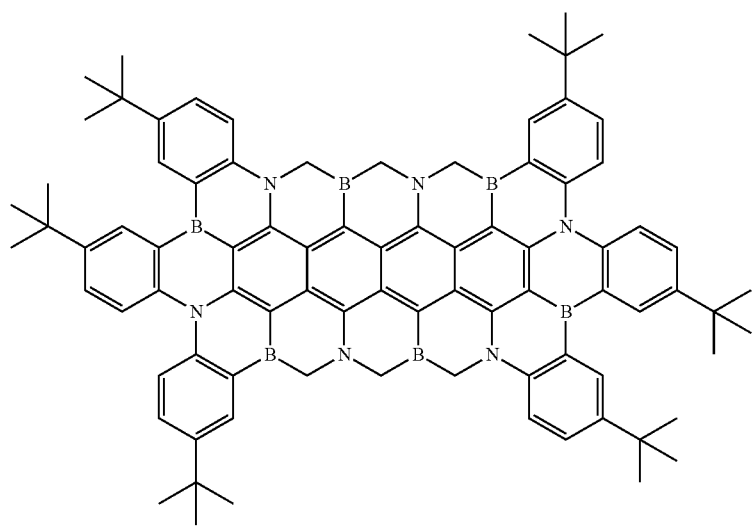
M-33
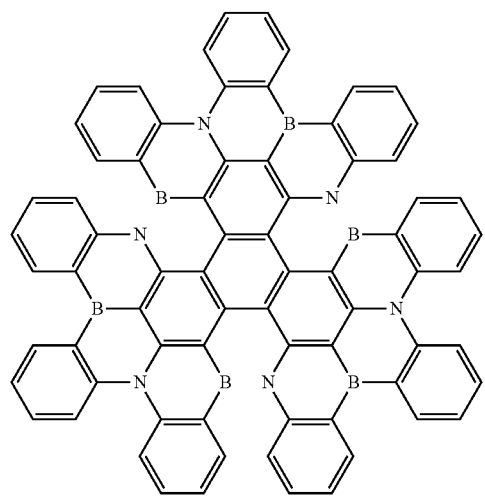

-continued
M-34
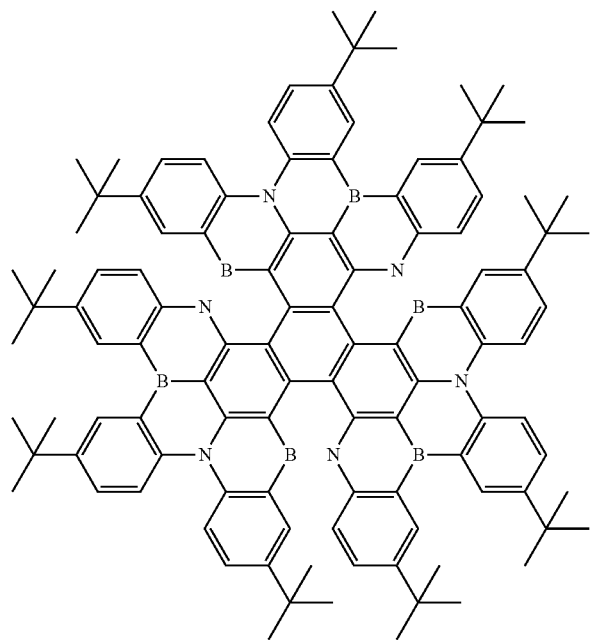
M-35
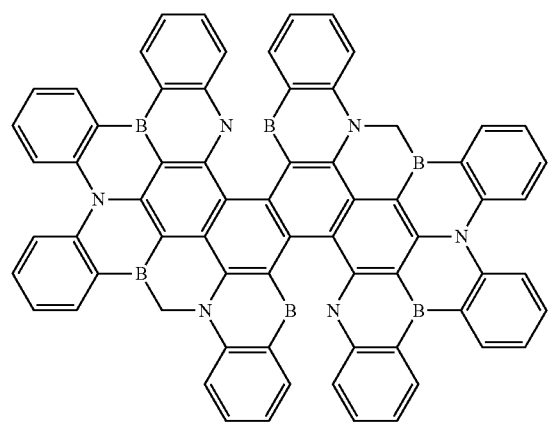
M-36
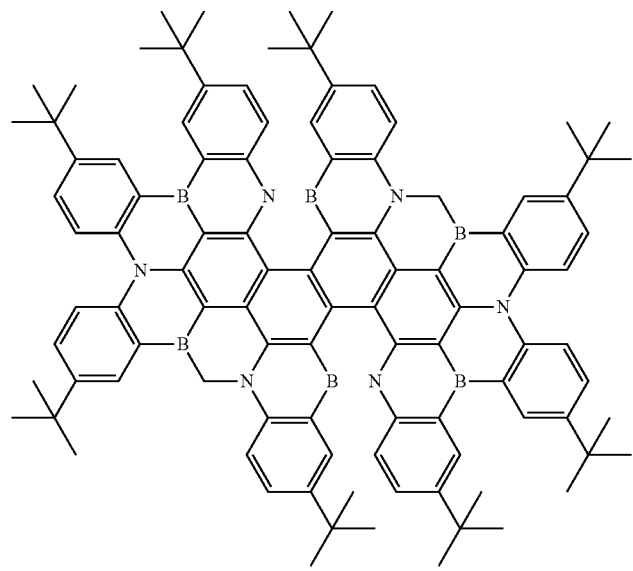

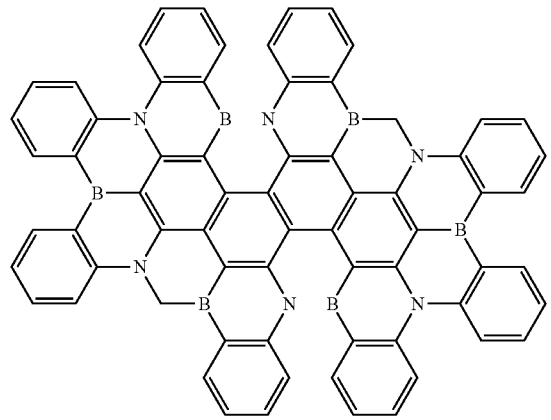
M-37
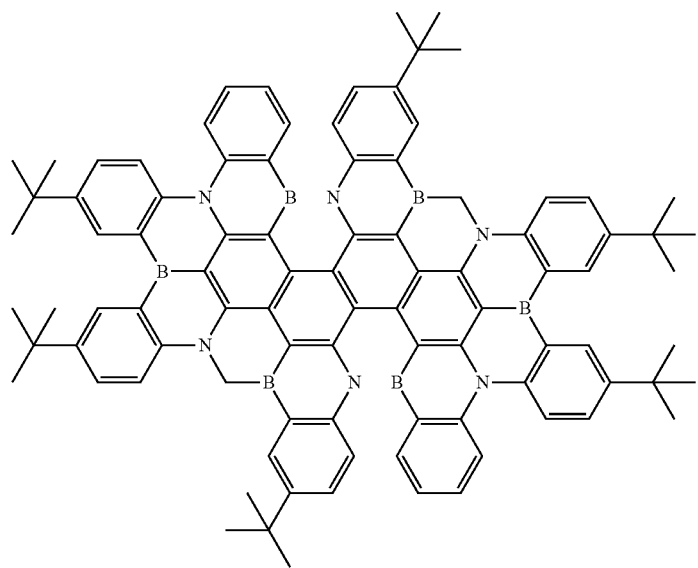
M-38
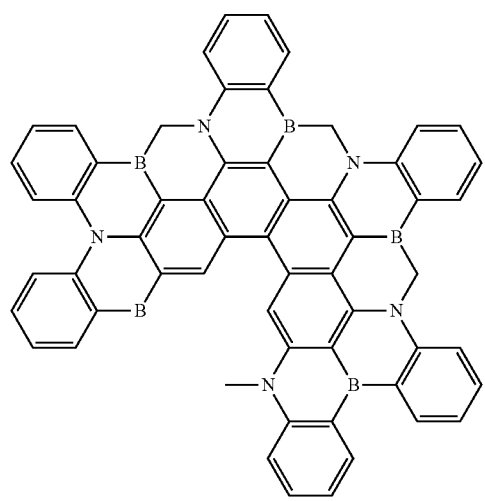
M-39

-continued
M-40
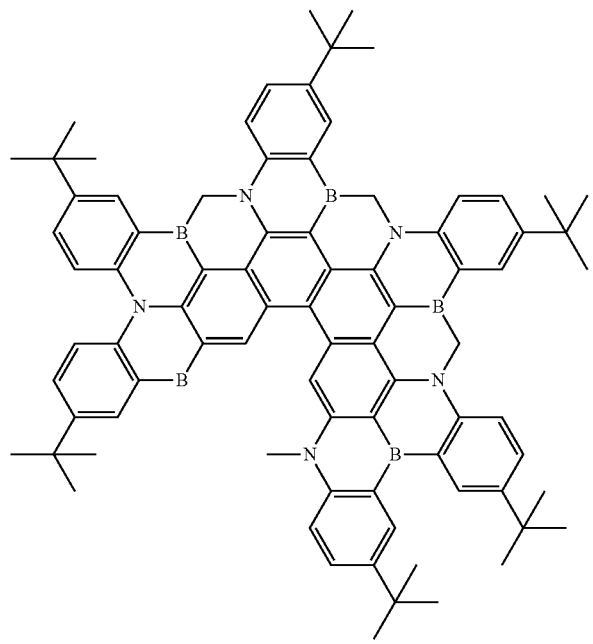
M-41
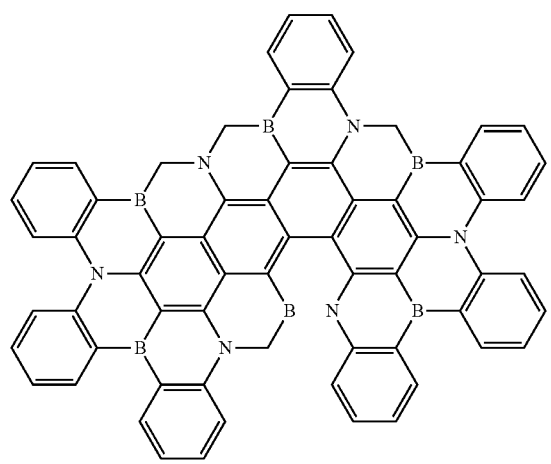
M-42
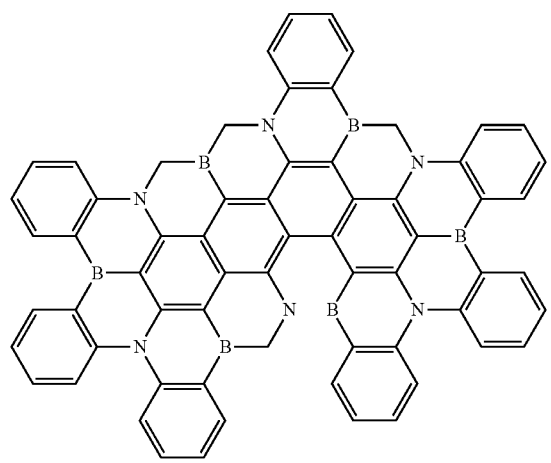

M-43
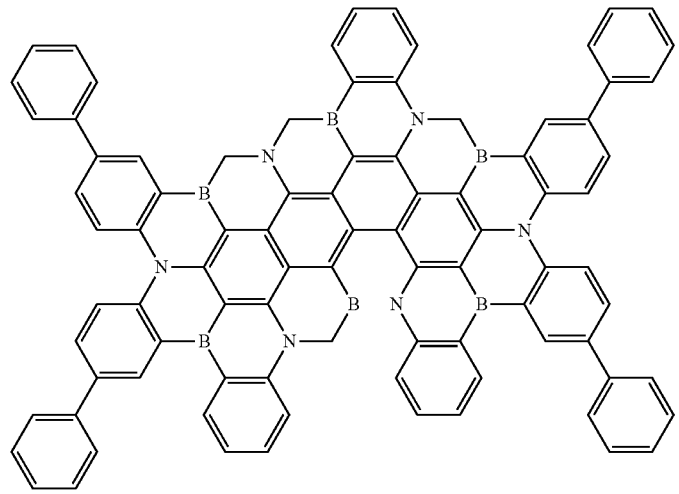
M-44
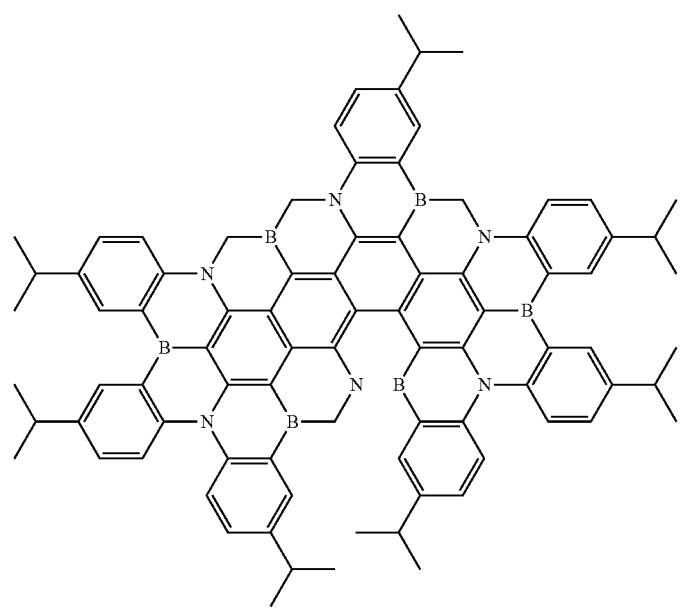
M-45
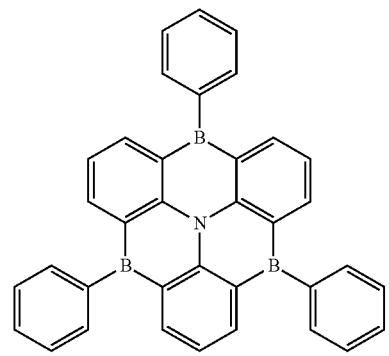

M-46
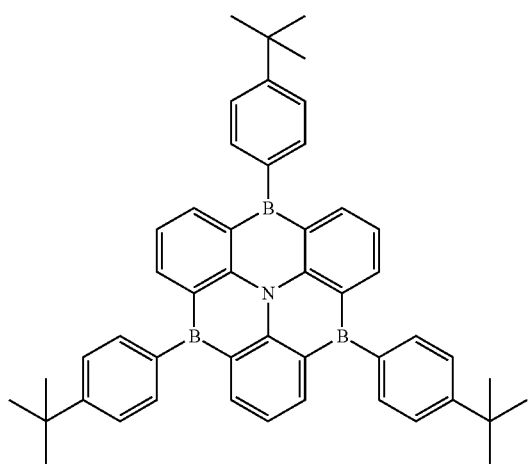
M-47
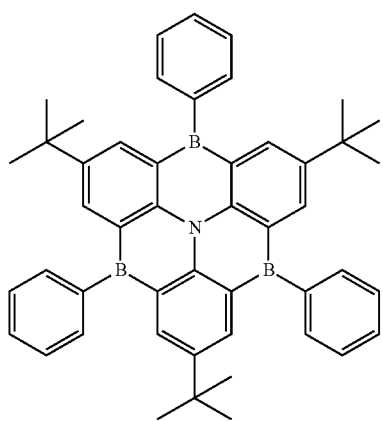
M-48
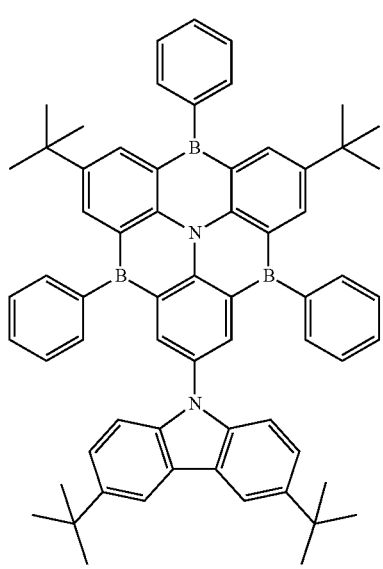

-continued
M-49
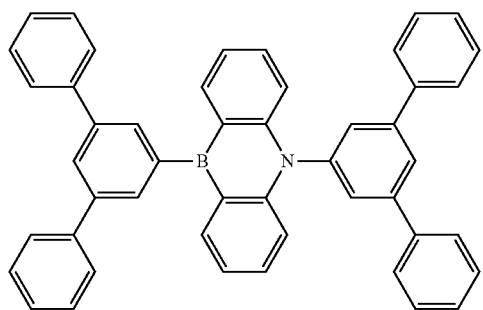
M-50
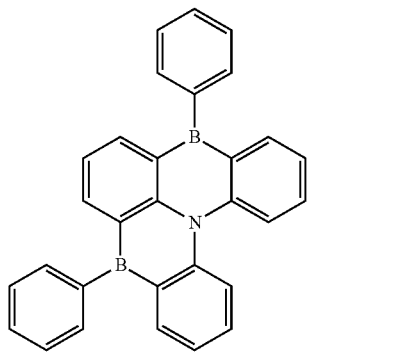
M-51
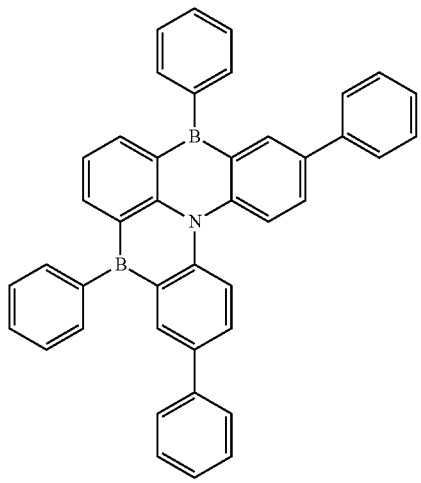
M-52
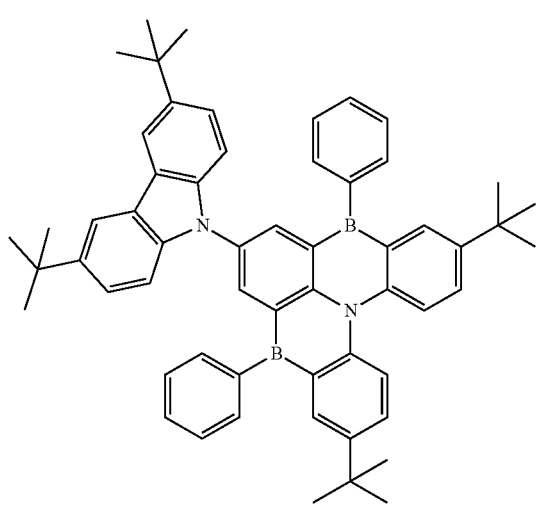

-continued
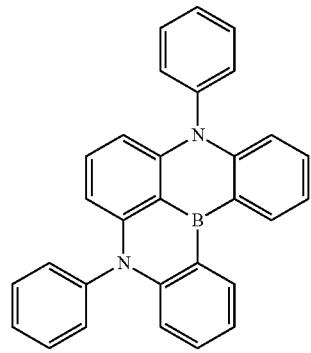
M-53
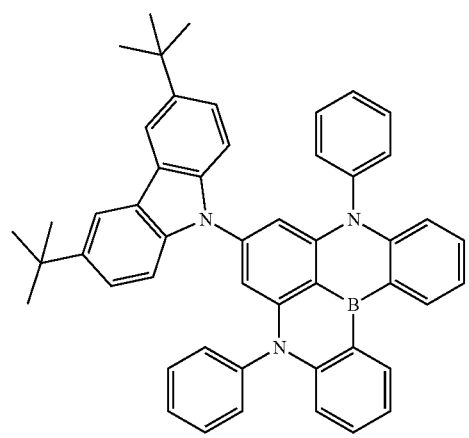
M-54
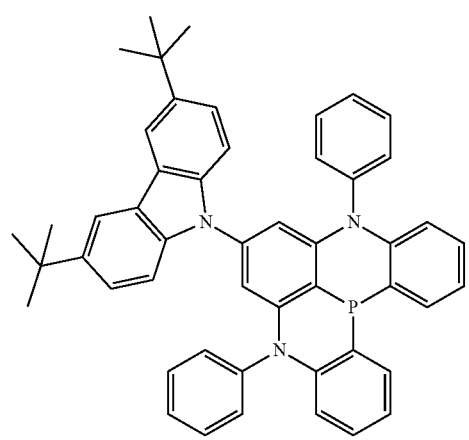
M-55

M-56
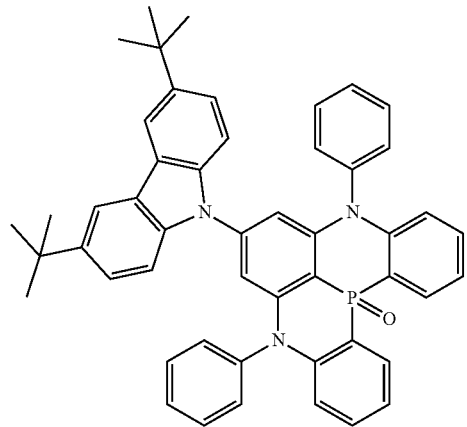
M-57
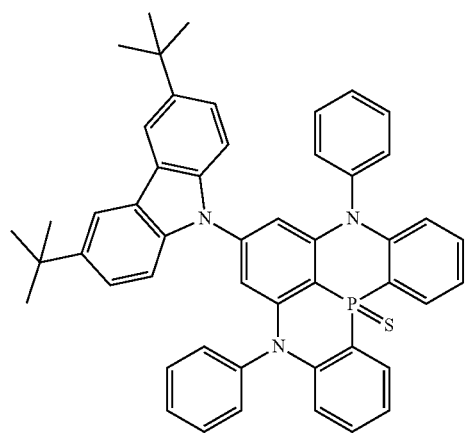
M-58
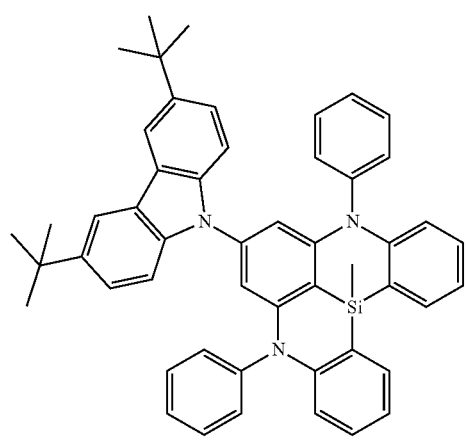

-continued
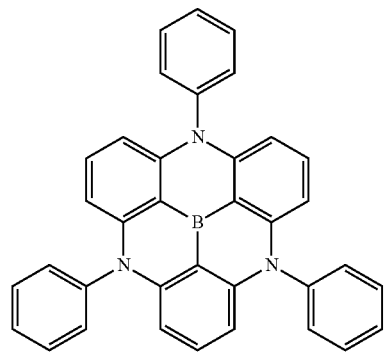
M-59
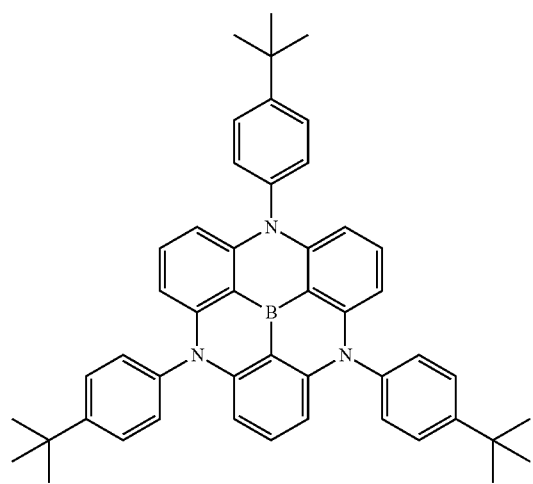
M-60
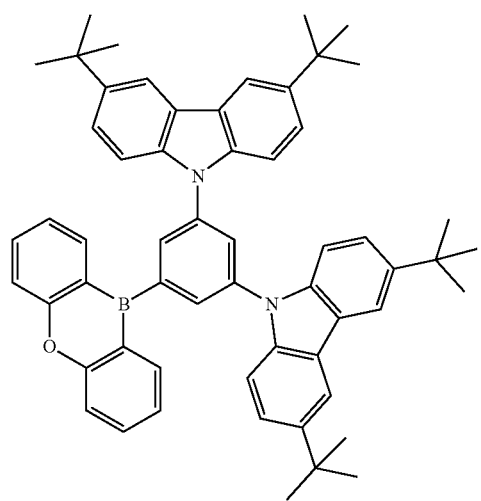
M-61

-continued
M-62
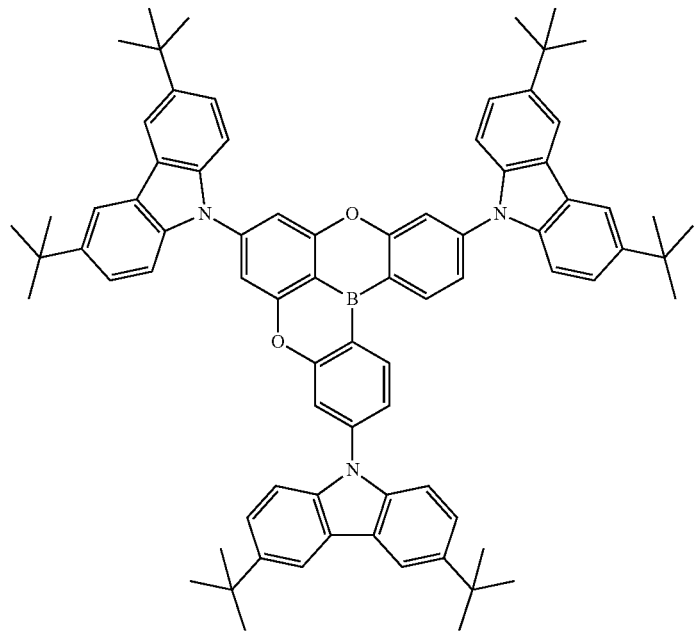
M-63
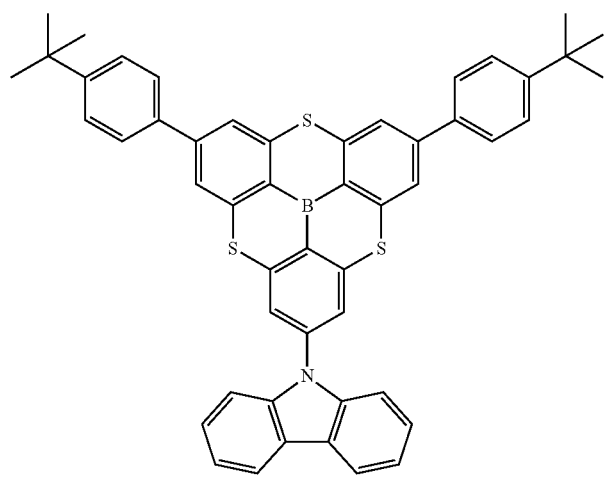
M-64
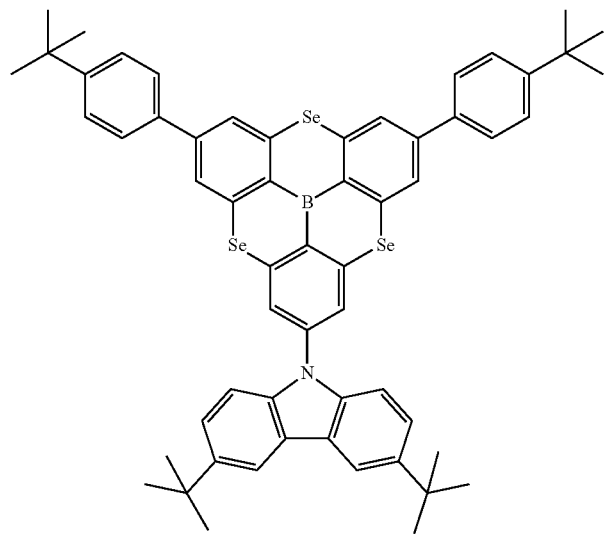

-continued
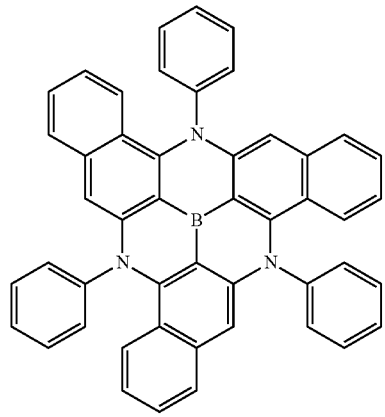
M-65
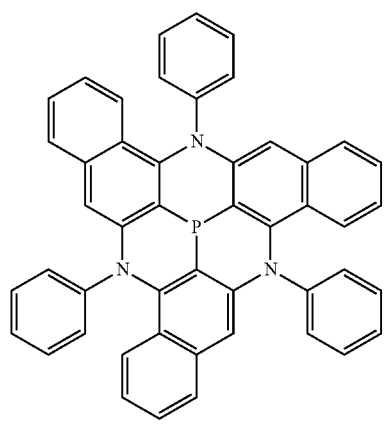
M-66
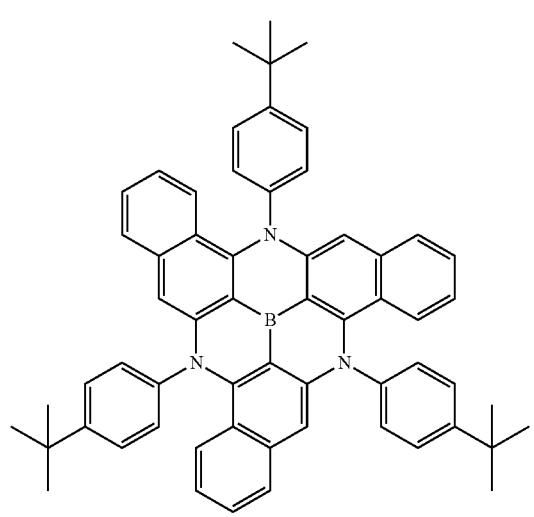
M-67

-continued
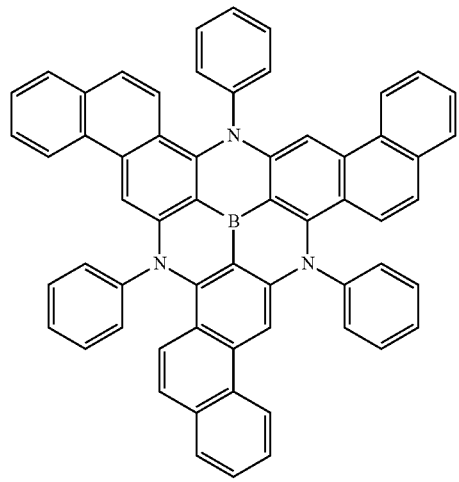
M-68
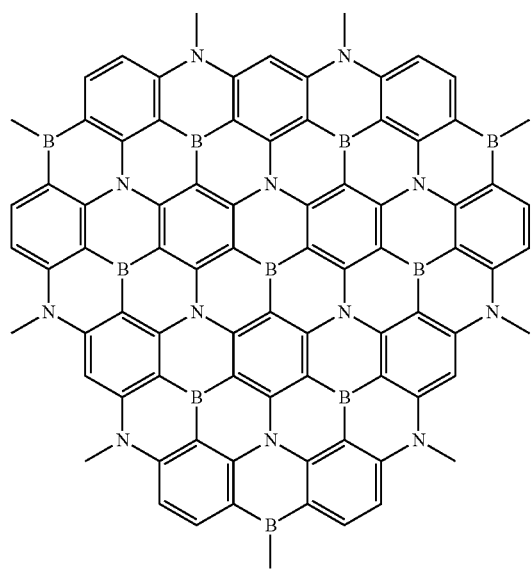
M-69
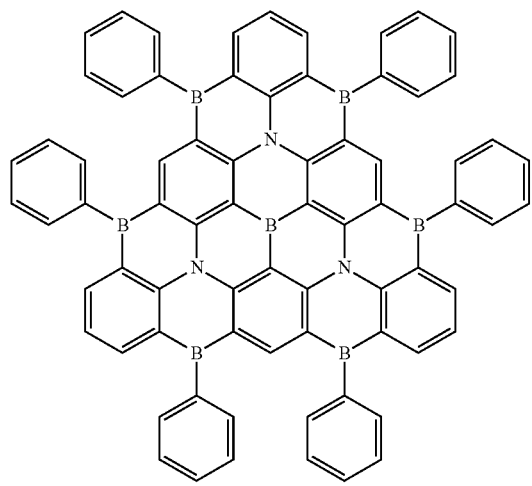
M-70

M-71

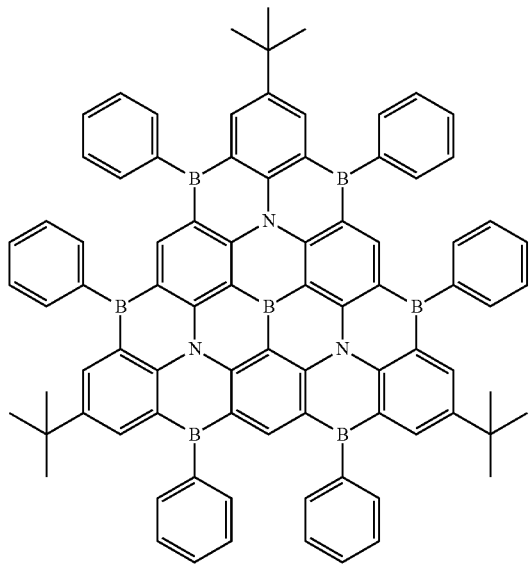

M-72

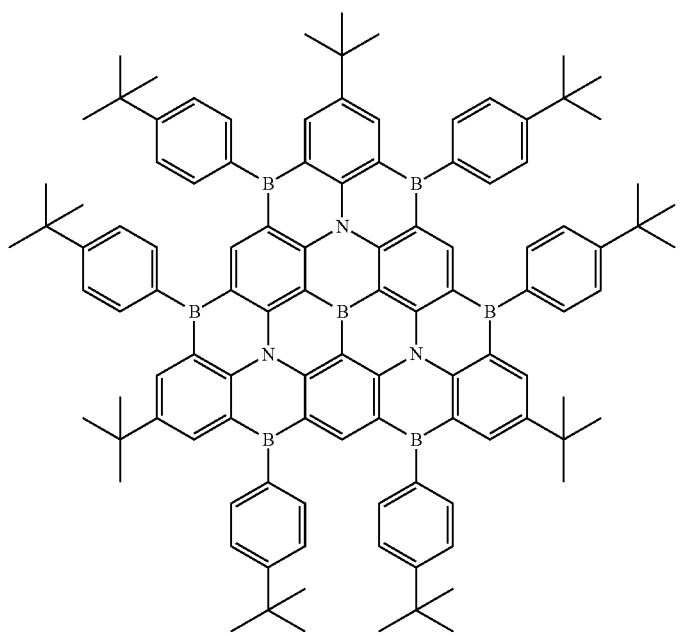

Furthermore, the sensitizer material used in the present application is an exciplex made from a mixture of a hole-type material (electron donor material) and an electron-type material (electron acceptor material), where the triplet state energy level for the electron acceptor material is greater than the triplet state energy level for the exciplex, the triplet state energy level for the electron donor material is greater than the triplet state energy level for the exciplex, the singlet state energy level for the electron acceptor material is greater than the singlet state energy level for the exciplex, and the singlet state energy level for the electron donor material is greater than the singlet state energy level for the exciplex. Therefore, the exciplex has not only the thermally activated delayed fluorescence effect, which can effectively utilize its own triplet excitons, but also electron donating and accepting in the organic light emitting layer, which can effectively balance the carrier transport and widen the recombination region for the electrons, thereby effectively reducing the efficiency roll-off and facilitating to maintain the stability for the organic electroluminescence device. In order to achieve reverse intersystem crossing for the exciplex easier, a exciplex whose energy level difference of the singlet state and triplet state is ≤0.15 eV may be preferably selected as a sensitizer material.

The electron donor material is a compound having characteristic of hole transporting and containing at least one of carbazolyl, arylamino, silyl, fluorenyl, dibenzothienyl, and dibenzofurylaryl.

Specifically, the electron donor material may be, and is not limited to, a compound selected from one of the following structures:

(D-1)
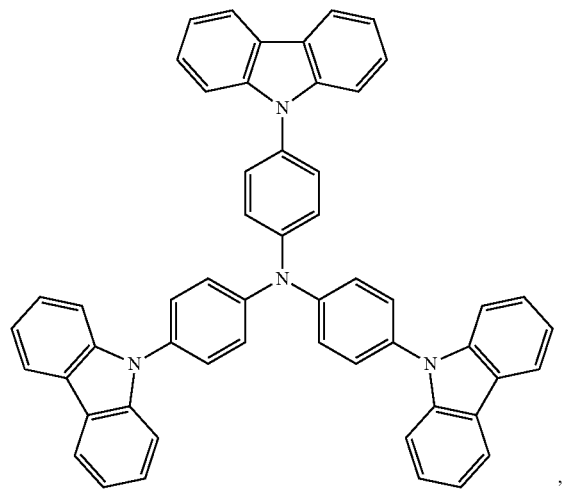
(D-2)
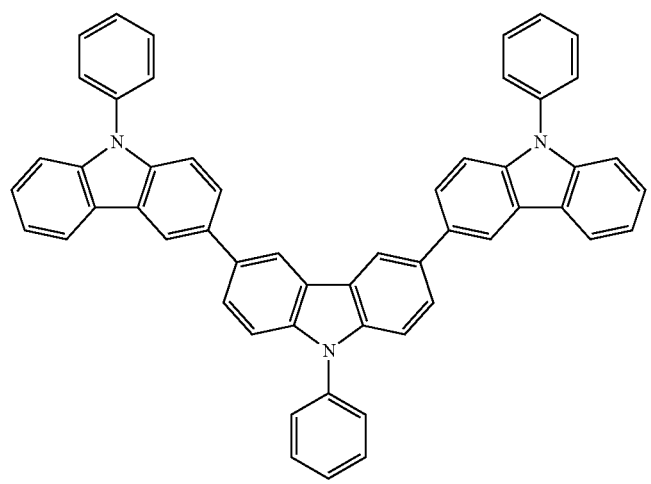
(D-3)
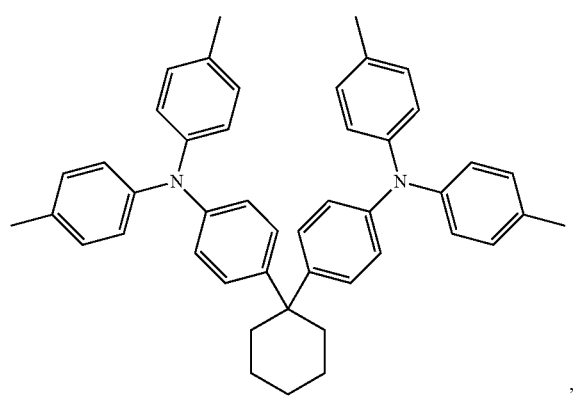

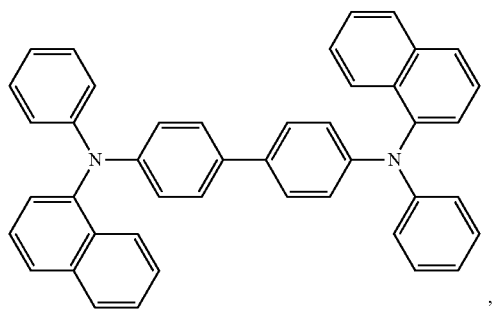
(D-4)
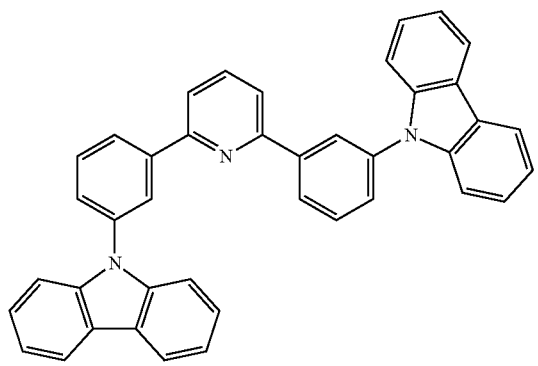
(D-5)
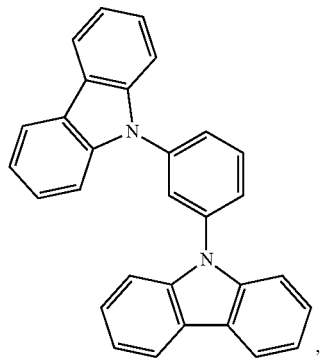
(D-6)
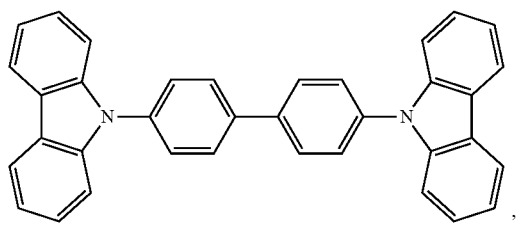
(D-7)
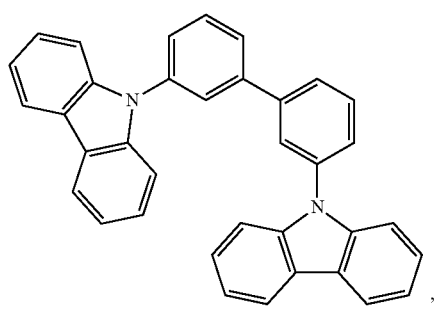
(D-8)

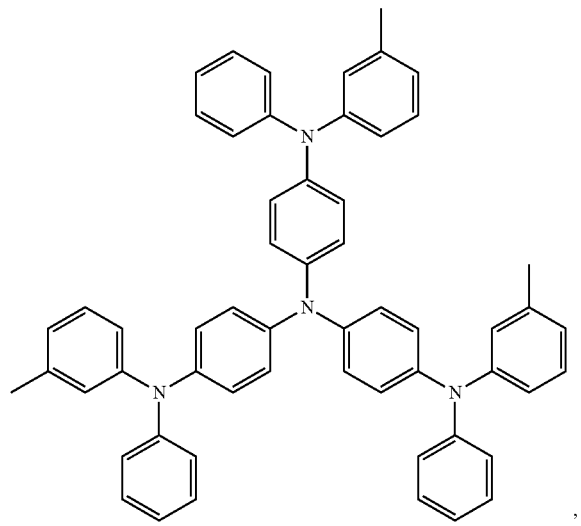
(D-9)
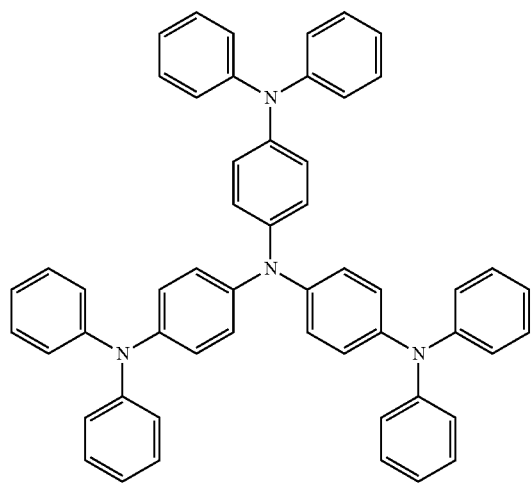
(D-10)
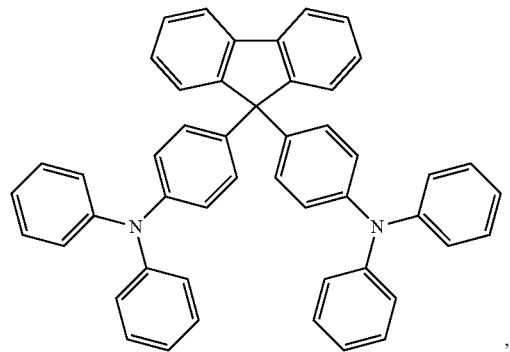
(D-11)
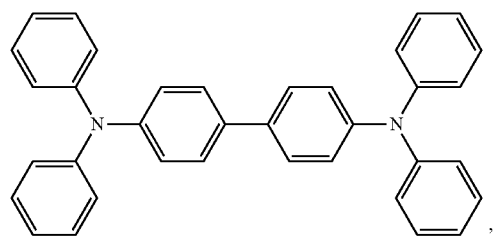
(D-12)

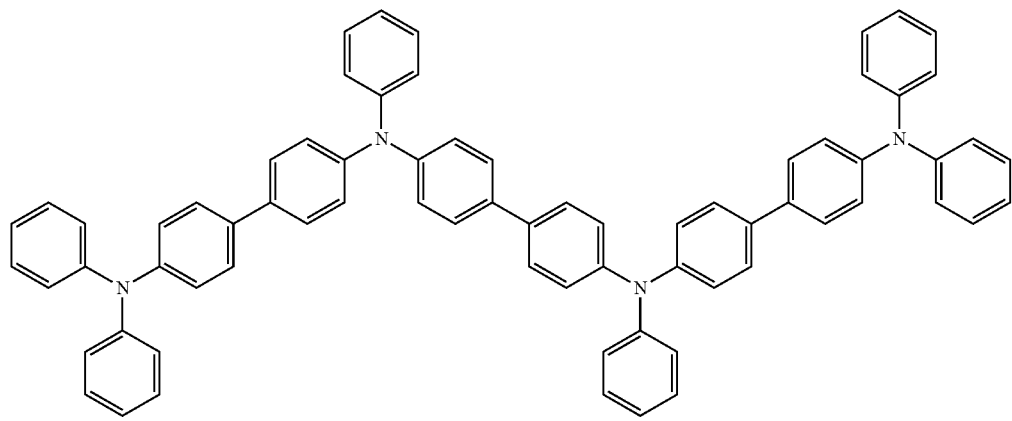
(D-13)
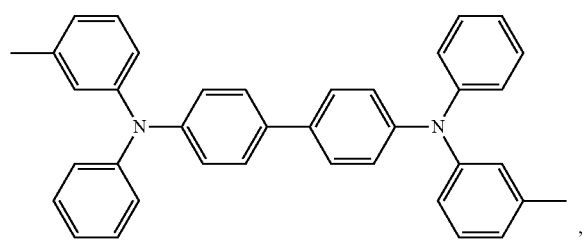
(D-14)
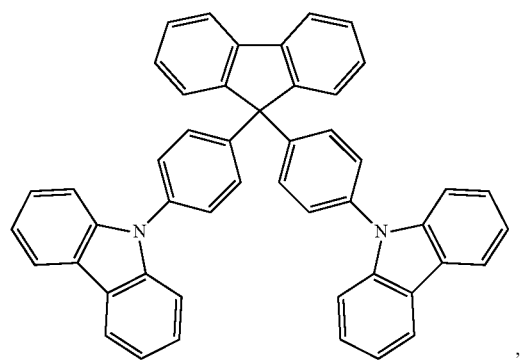
(D-15)
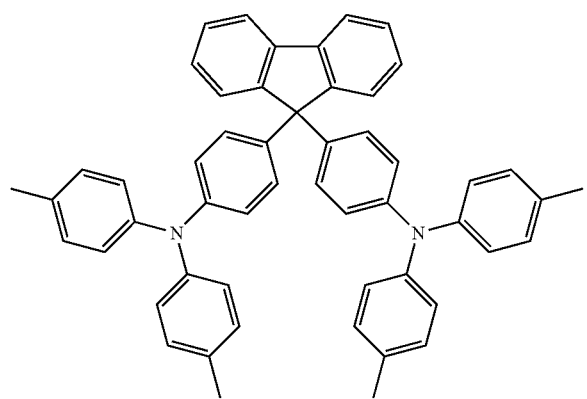
(D-16)

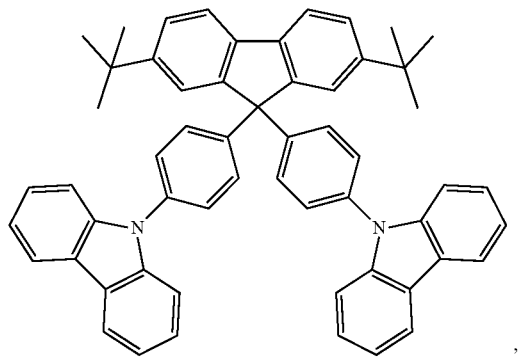
(D-17)
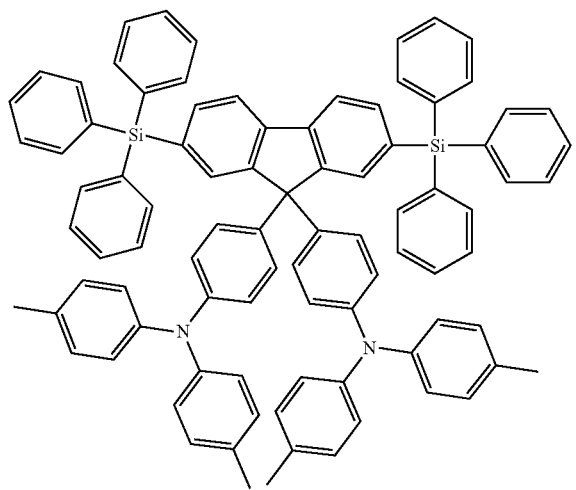
(D-18)
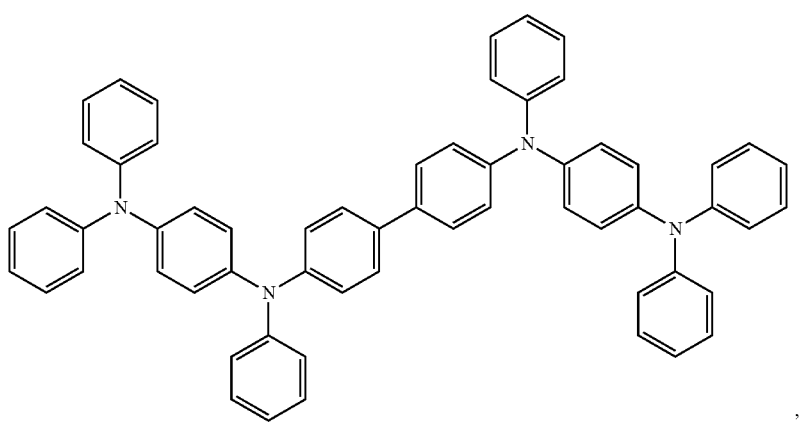
(D-19)

where the electron acceptor material is a compound having characteristic of electron transporting and containing at least one of pyridyl, pyrimidinyl, triazinyl, imidazolyl, phenanthroline, sulfone, heptazinyl, oxadiazolyl, cyano, and diphenyl.

Specifically, the electron acceptor material may be, and is not limited to, a compound selected from one of the following structures:

(A-1)
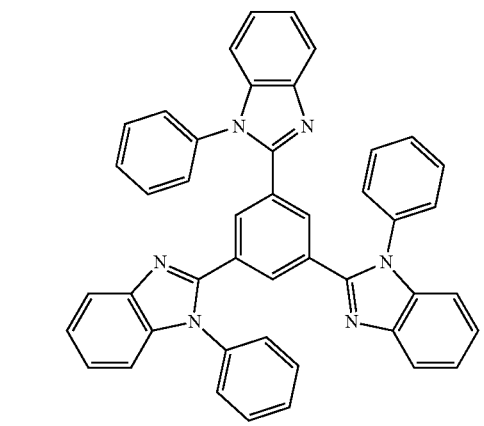

(A-2)
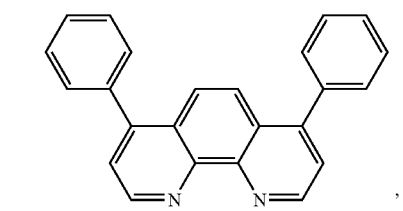

(A-3)
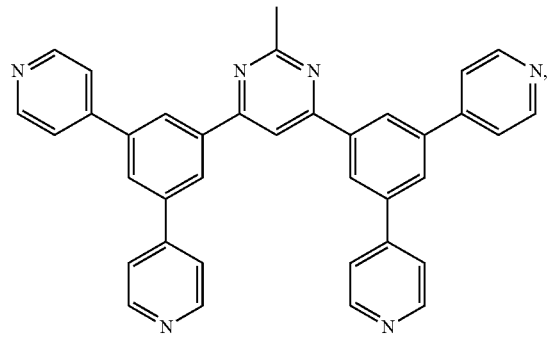

(A-4)
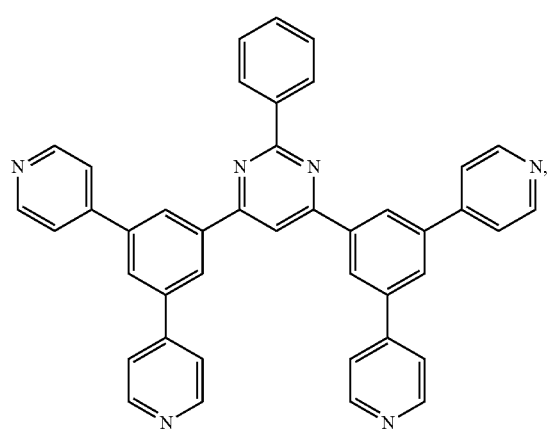

(A-5)
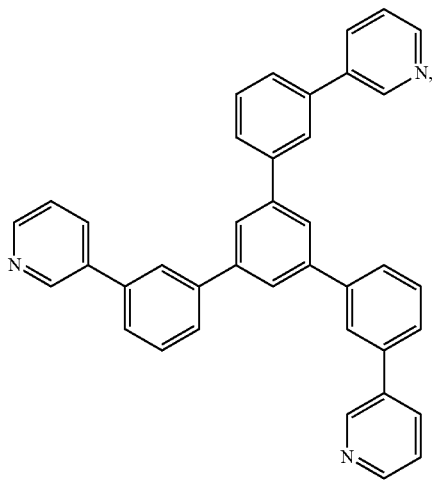

(A-6)
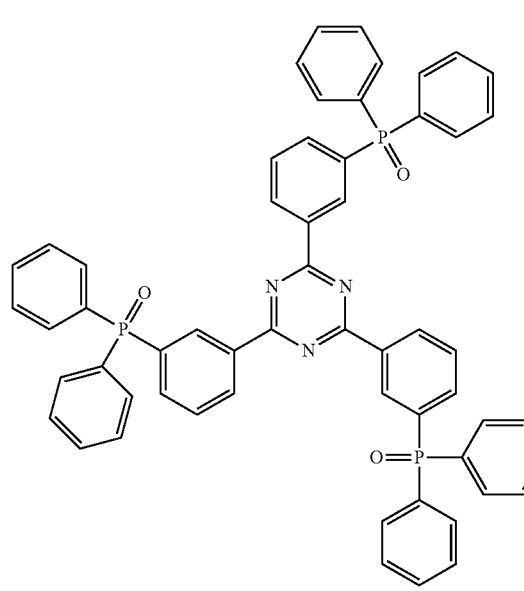

(A-7)
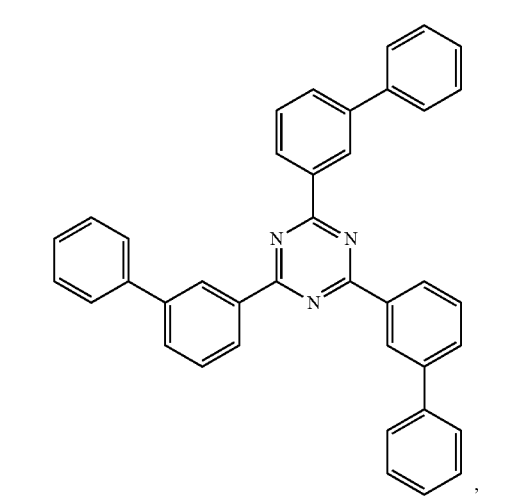

-continued
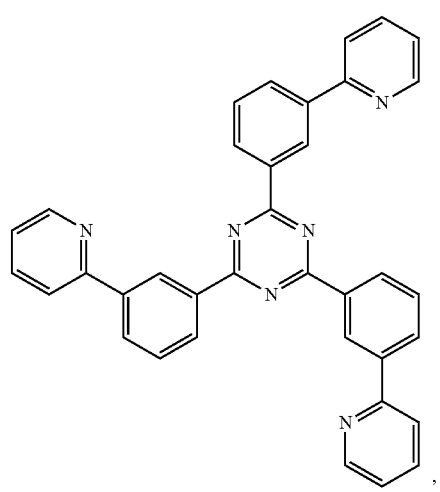
(A-8)
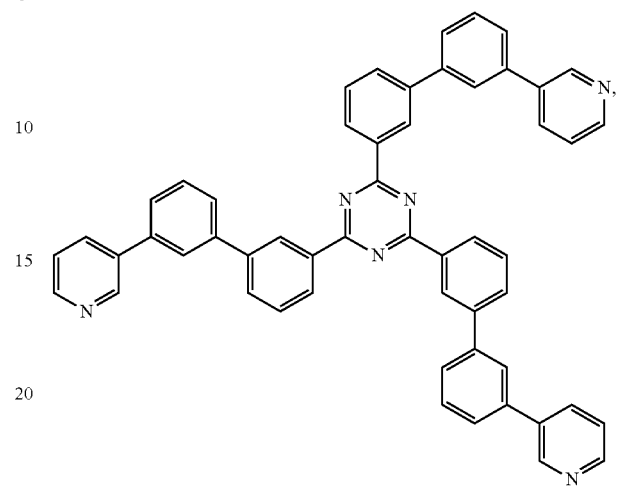
(A-11)
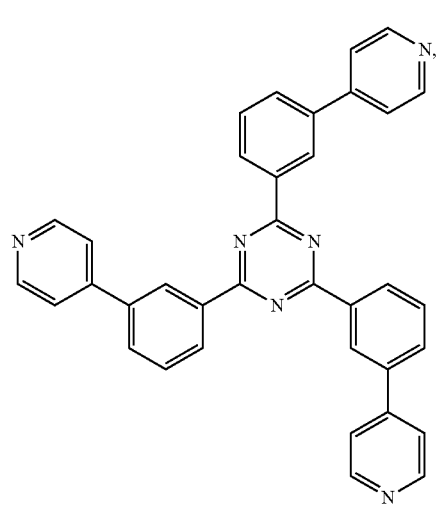
(A-9)
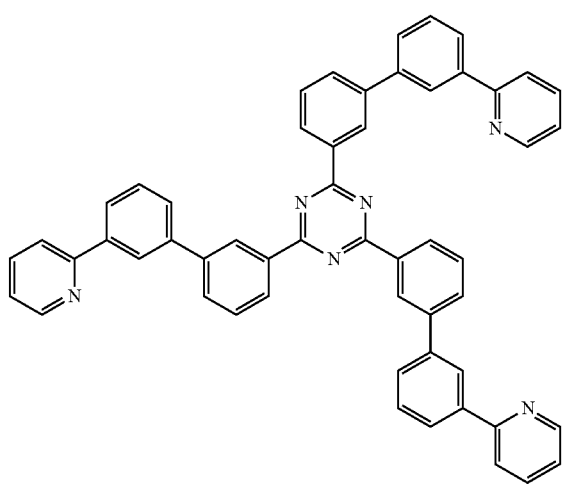
(A-12)
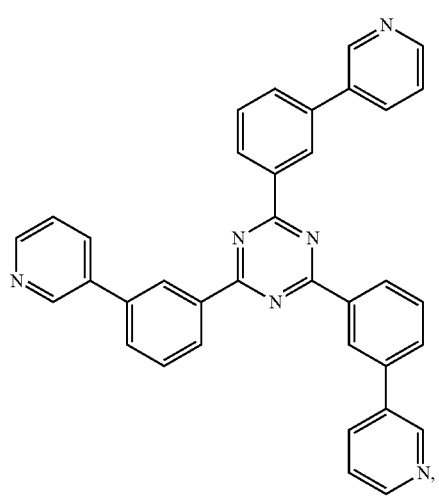
(A-10)
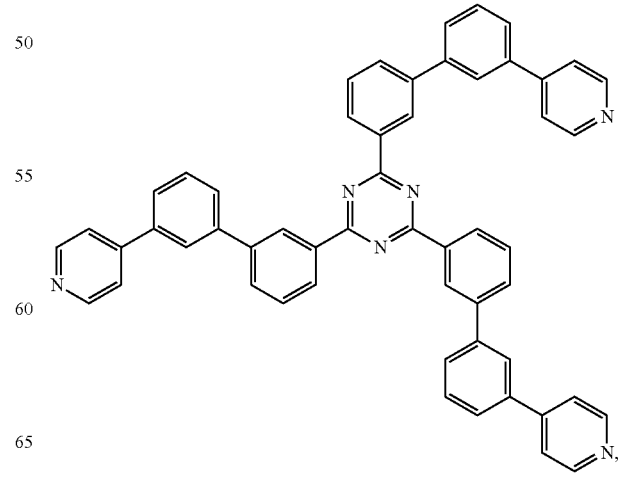
(A-13)

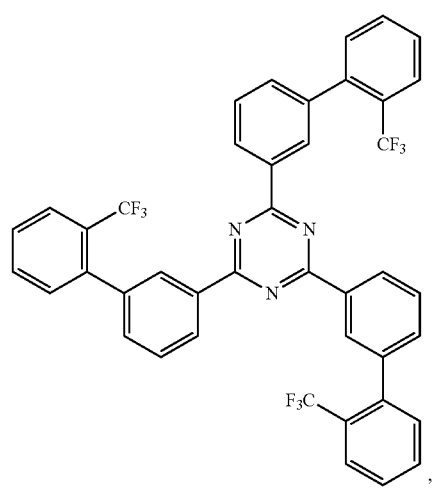
(A-14)
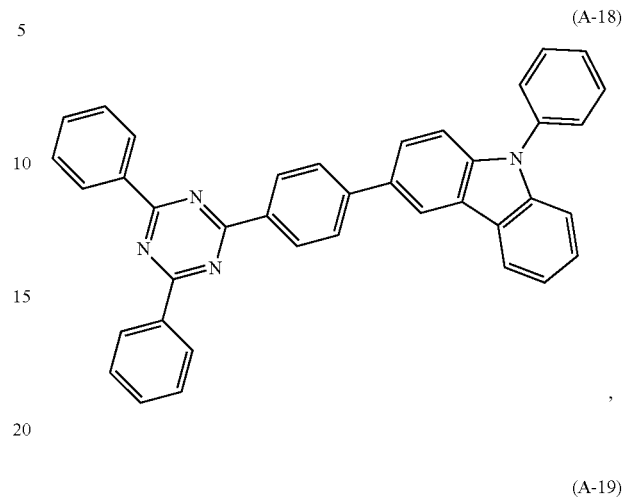
(A-18)
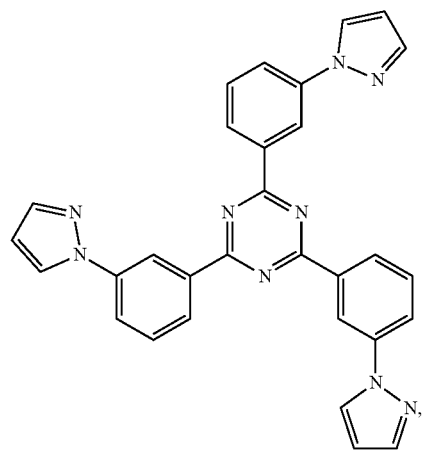
(A-15)
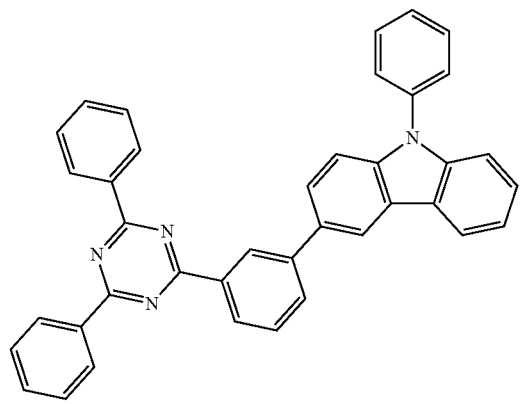
(A-19)
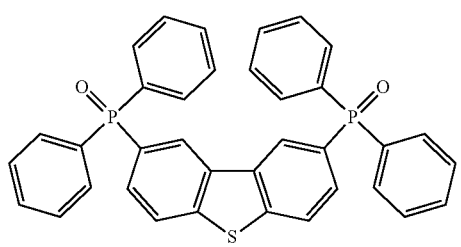
(A-16)
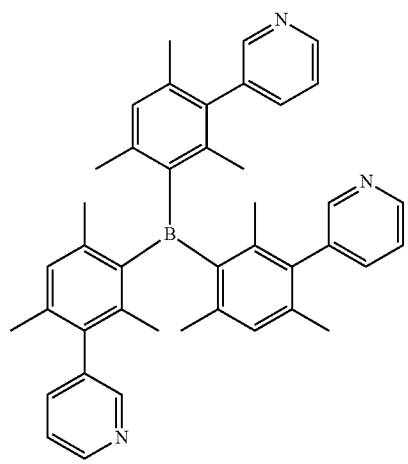
(A-20)
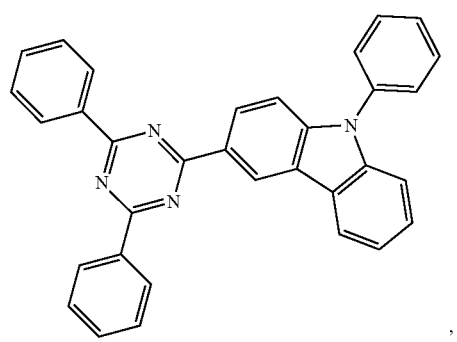
(A-17)
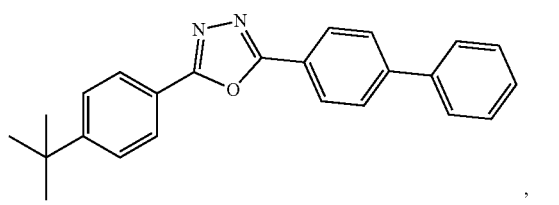
(A-21)

(A-22)
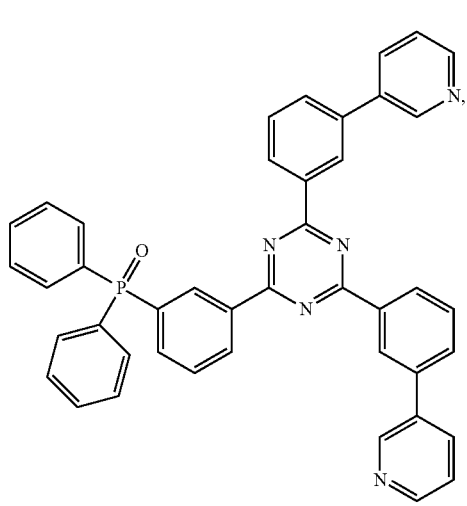
(A-23)
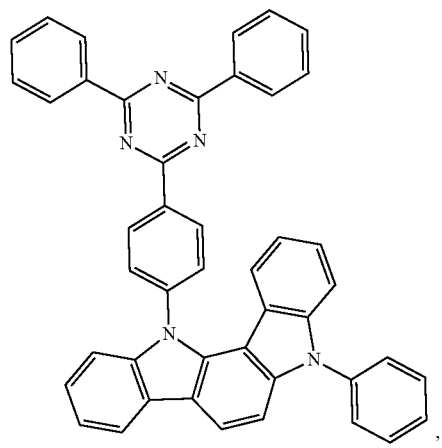
(A-24)
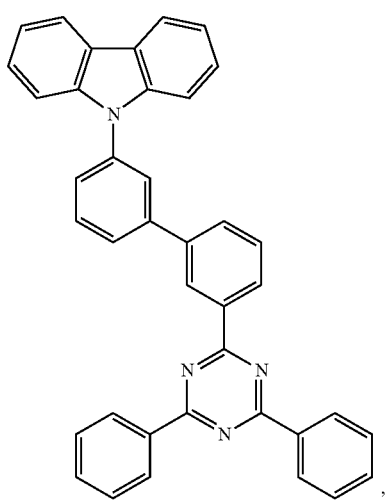
(A-25)
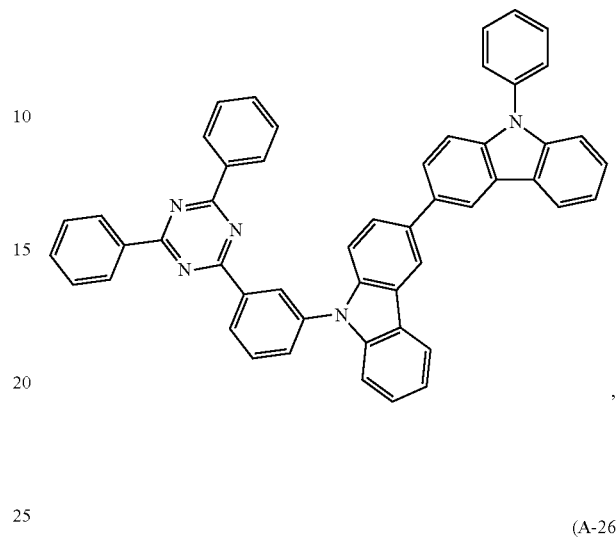
(A-26)
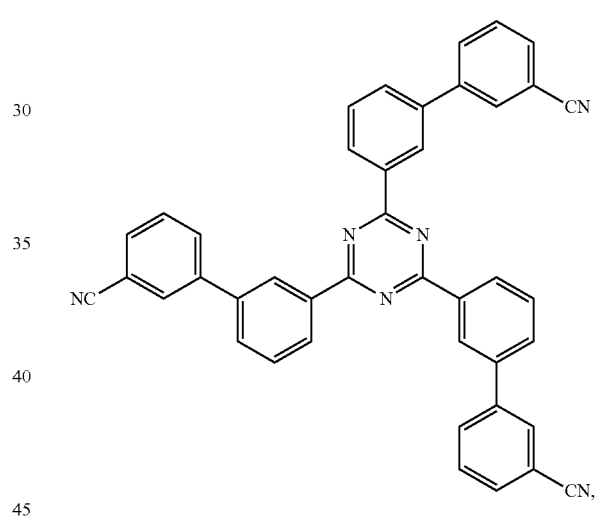
(A-27)
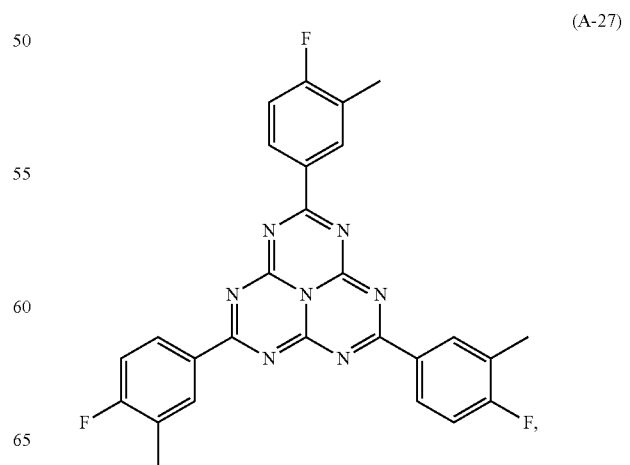

(A-28)
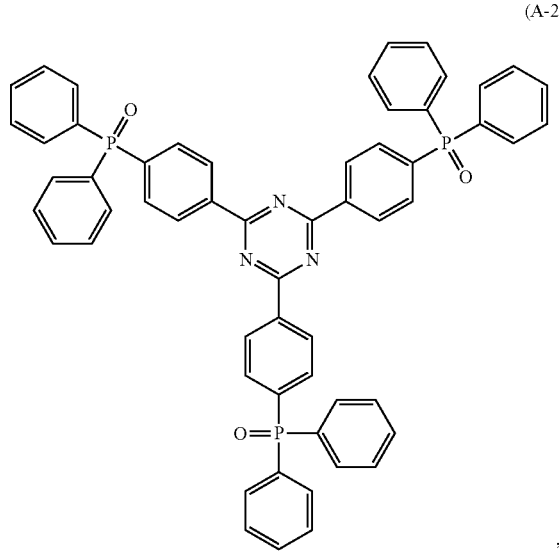

(A-29)

(A-30)
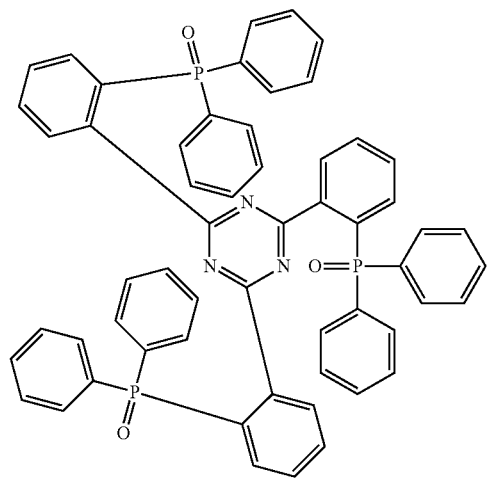

(A-31)
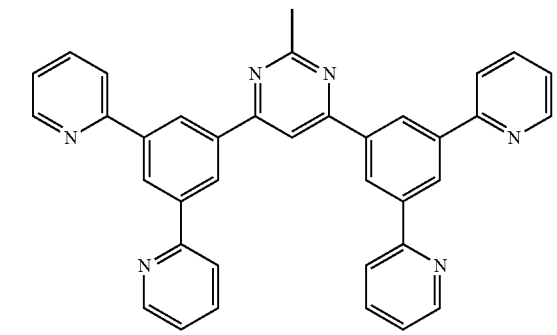

(A-32)
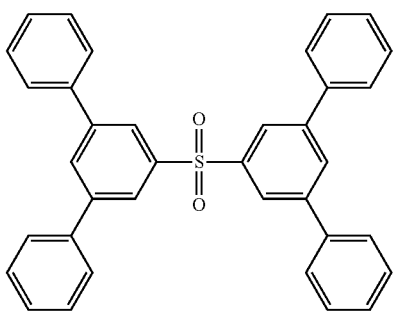

(A-33)
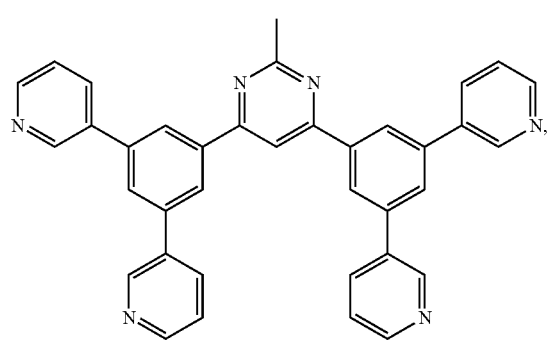

Preferably, the weight ratio of the electron donor material to the electron acceptor material in the exciplex is 1:9-9:1. Under this doping ratio, hole and carrier transporting can be effectively balanced to achieve the effect of bipolar transporting, thereby optimizing the device in terms of efficiency roll-off and service life.

In addition, the wide bandgap material of the present application is a compound including at least one of carbazolyl, carbolinyl, spirofluorenyl, fluorenyl, silyl, and phosphonooxy.

The present application does not limit the specific structure of the wide bandgap material, preferably, which is selected from compounds shown as one of the following structures:

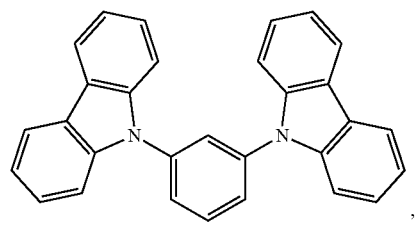 (W-1)
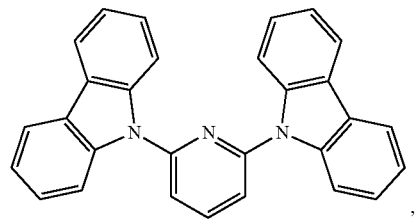 (W-2)
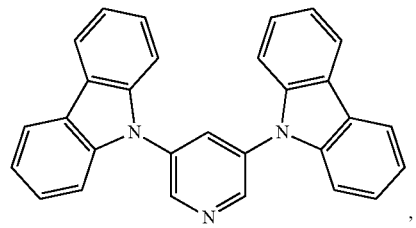 (W-3)
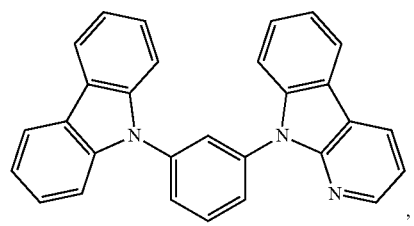 (W-4)
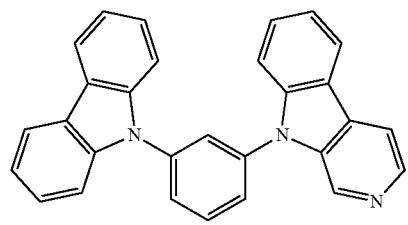 (W-5)
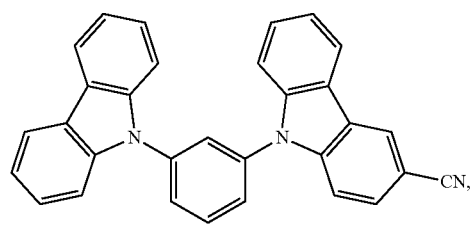 (W-6)
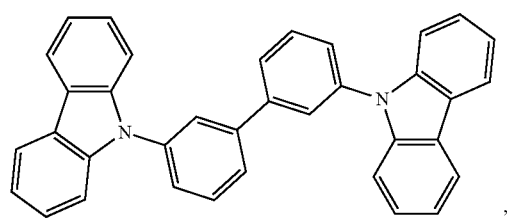 (W-7)

-continued
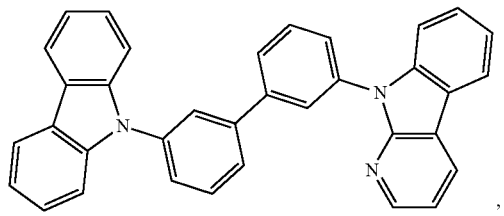 (W-8)
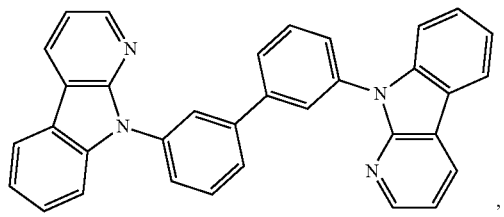 (W-9)
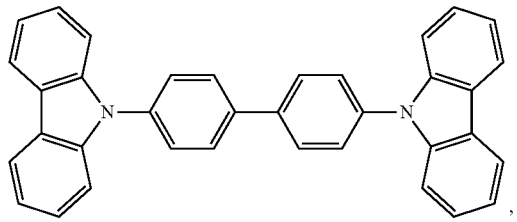 (W-10)
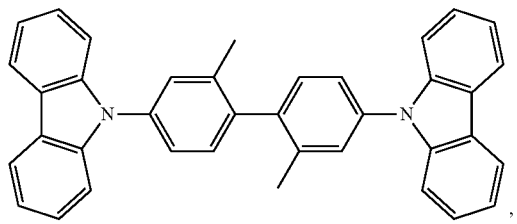 (W-11)
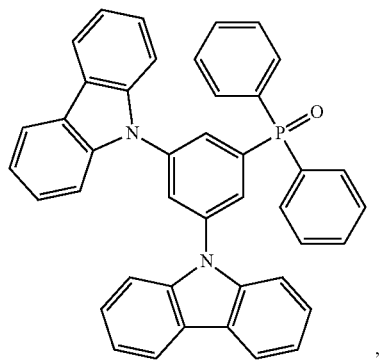 (W-12)
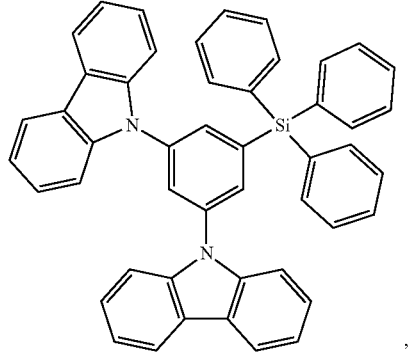 (W-13)

-continued
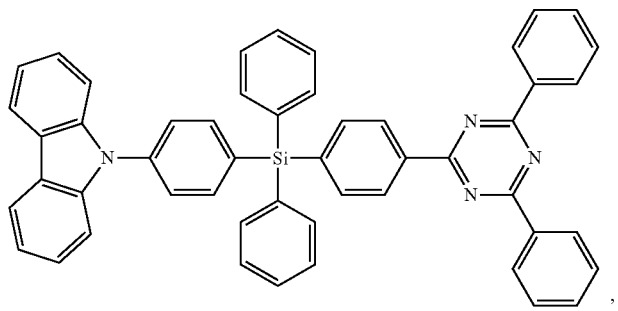
(W-14)
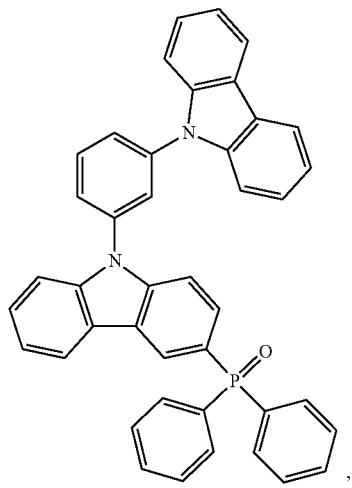
(W-15)
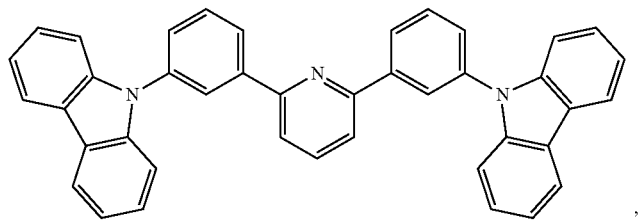
(W-16)
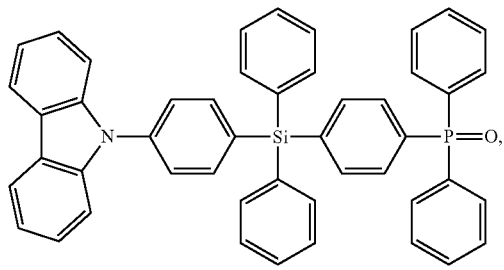
(W-17)
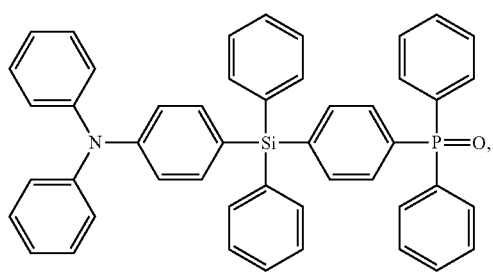
(W-18)

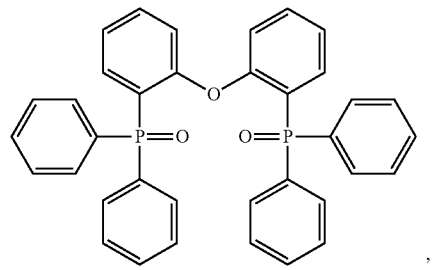
(W-19)
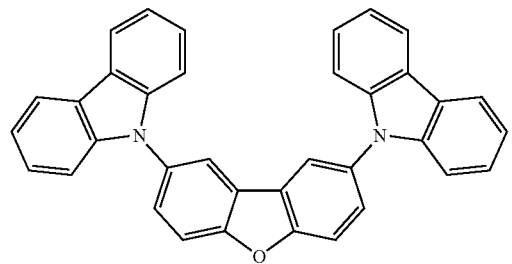
(W-20)
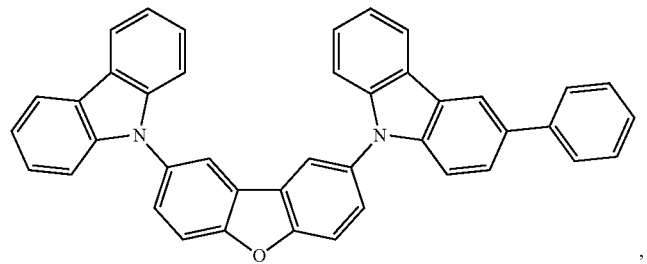
(W-21)
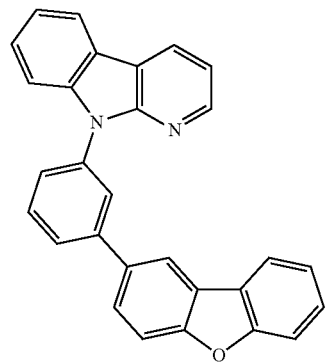
(W-22)
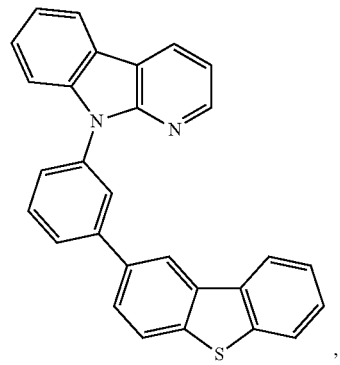
(W-23)

-continued
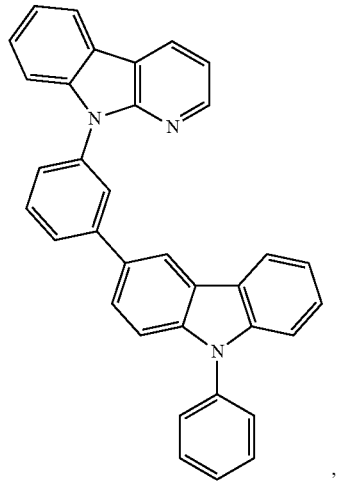
(W-24)
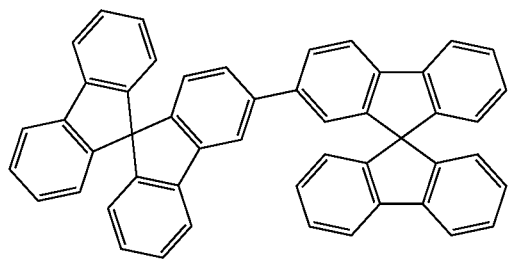
(W-25)
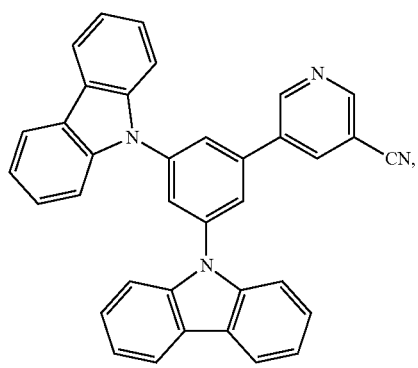
(W-26)
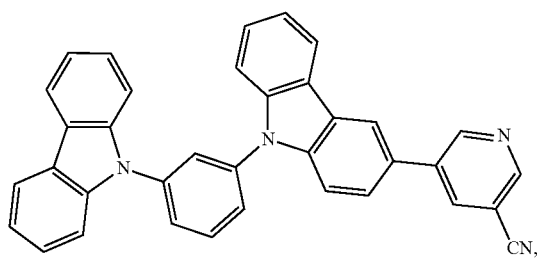
(W-27)

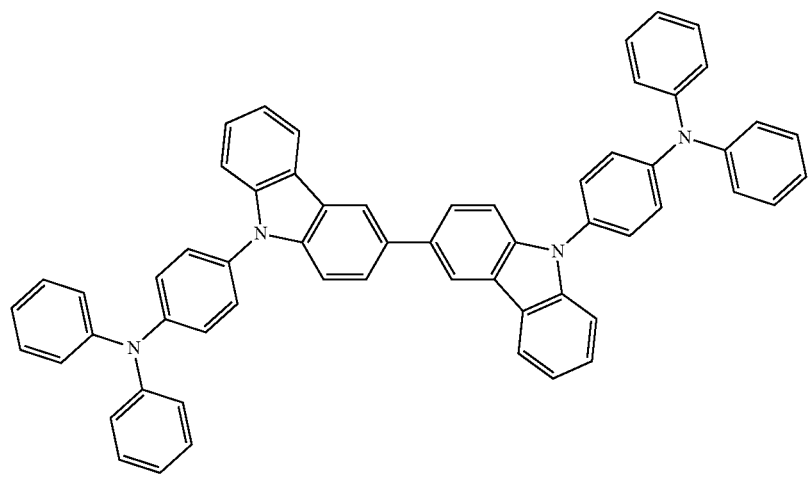
(W-28)
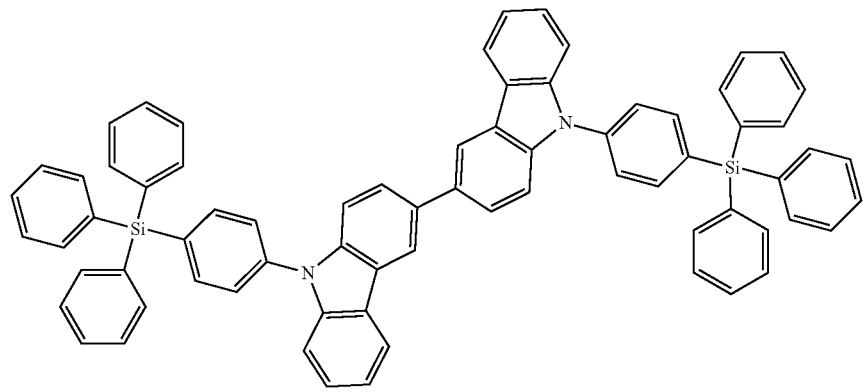
(W-29)
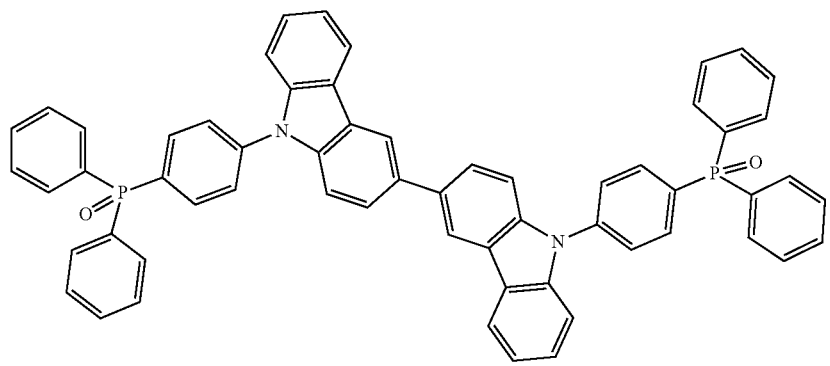
(W-30)
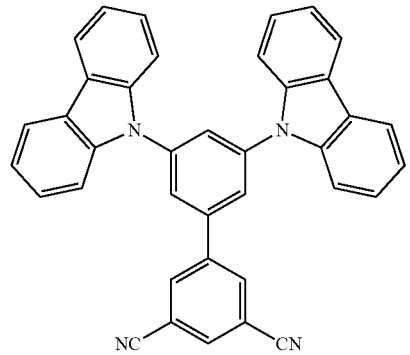
(W-31)

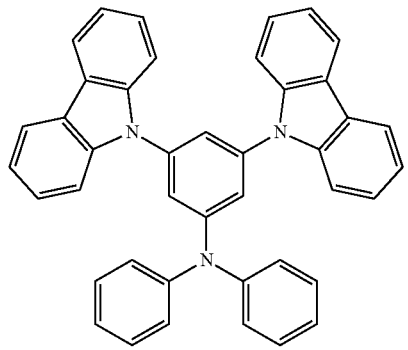
(W-32)
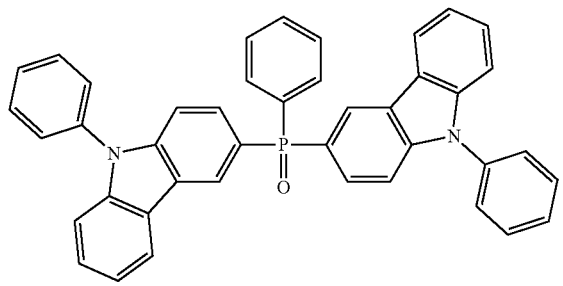
(W-33)
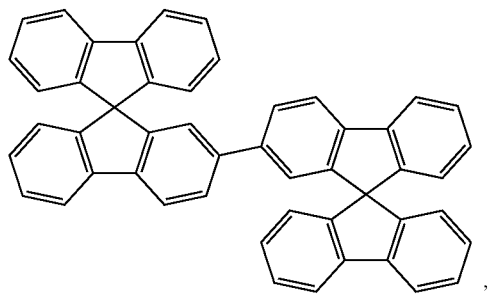
(W-34)
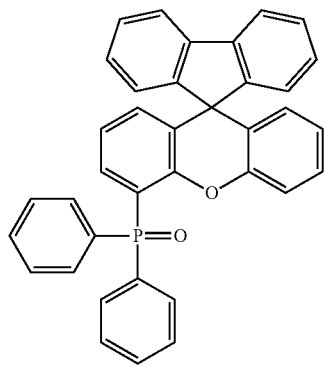
(W-35)

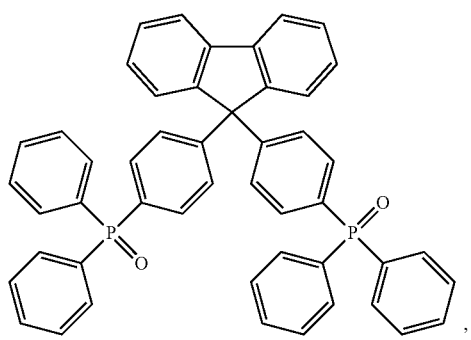 (W-36)
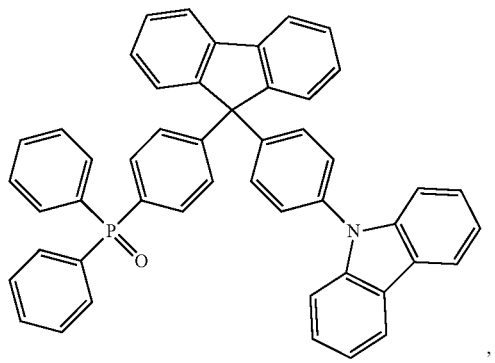 (W-37)
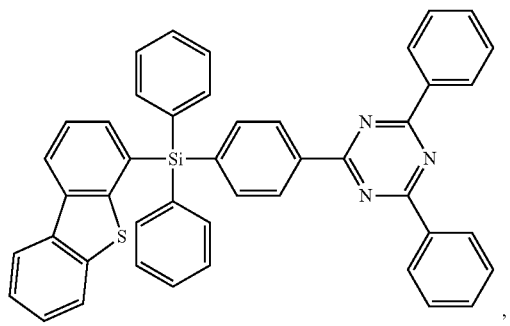 (W-38)
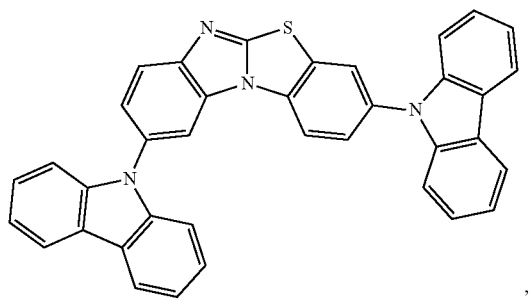 (W-39)
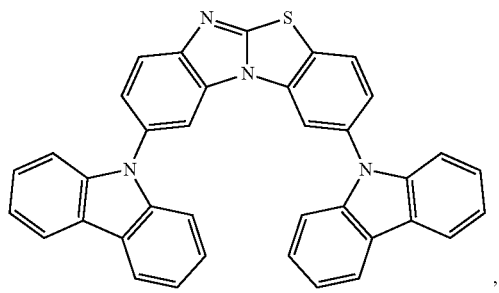 (W-40)

-continued
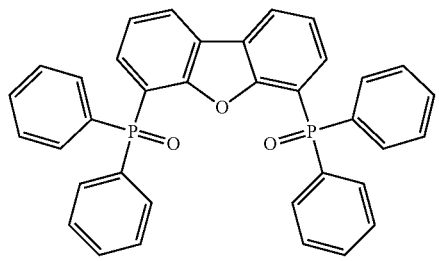
(W-41)
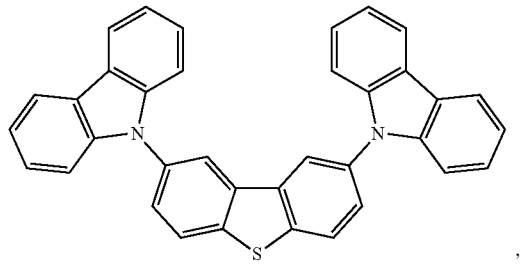
(W-42)
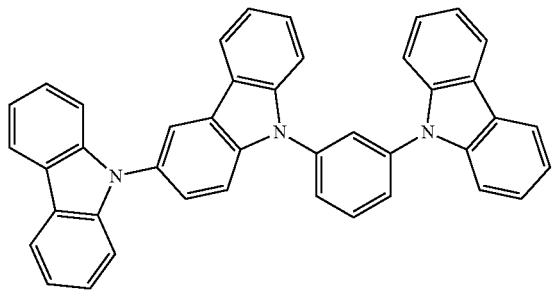
(W-43)
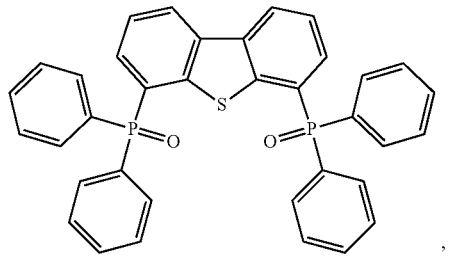
(W-44)
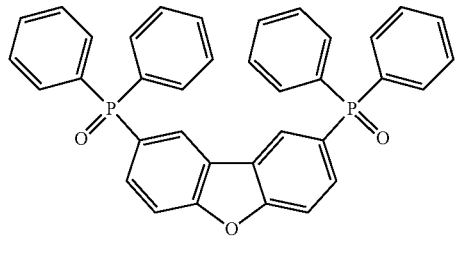
(W-45)
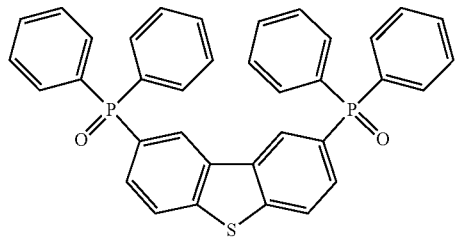
(W-46)

Still referring to FIG. 1, the hole transporting region 3, the electron transporting region 5, and the cathode 6 of the present application will be described. The hole transporting region 3 is located between the anode 2 and the organic light emitting layer 4. The hole transporting region 3 may be a hole transporting layer (HTL) with a single-layer structure, including a single-layer hole transporting layer containing only one compound and a single-layer hole transporting layer containing multiple compounds. The hole transporting region 3 may also have a multilayer structure including at least one layer of a hole injecting layer (HIL), a hole transporting layer (HTL), and an electron blocking layer (EBL).

The material for the hole transporting region 3 (including HIL, HTL, and EBL) may be selected from, but not limited to, phthalocyanine derivatives, such as CuPc, conductive polymers or polymers containing conductive dopants, such as polyphenylene vinylene, polyaniline/dodecylbenzene sulfonic acid (Pani/DBSA), poly(3,4-ethylenedioxythiophene)/poly(4-styrenesulfonate) (PEDOT/PSS), polyaniline/camphorsulfonic acid (Pani/CSA), polyaniline/poly(4-styrenesulfonate) (Pani/PSS), aromatic amine derivative.

The aromatic amine derivative may be a compound represented by the following HT-1 to HT-34. If the material of the hole transporting region 3 is an aromatic amine derivative, it may be one or more of the compounds represented by HT-1 to HT-34.

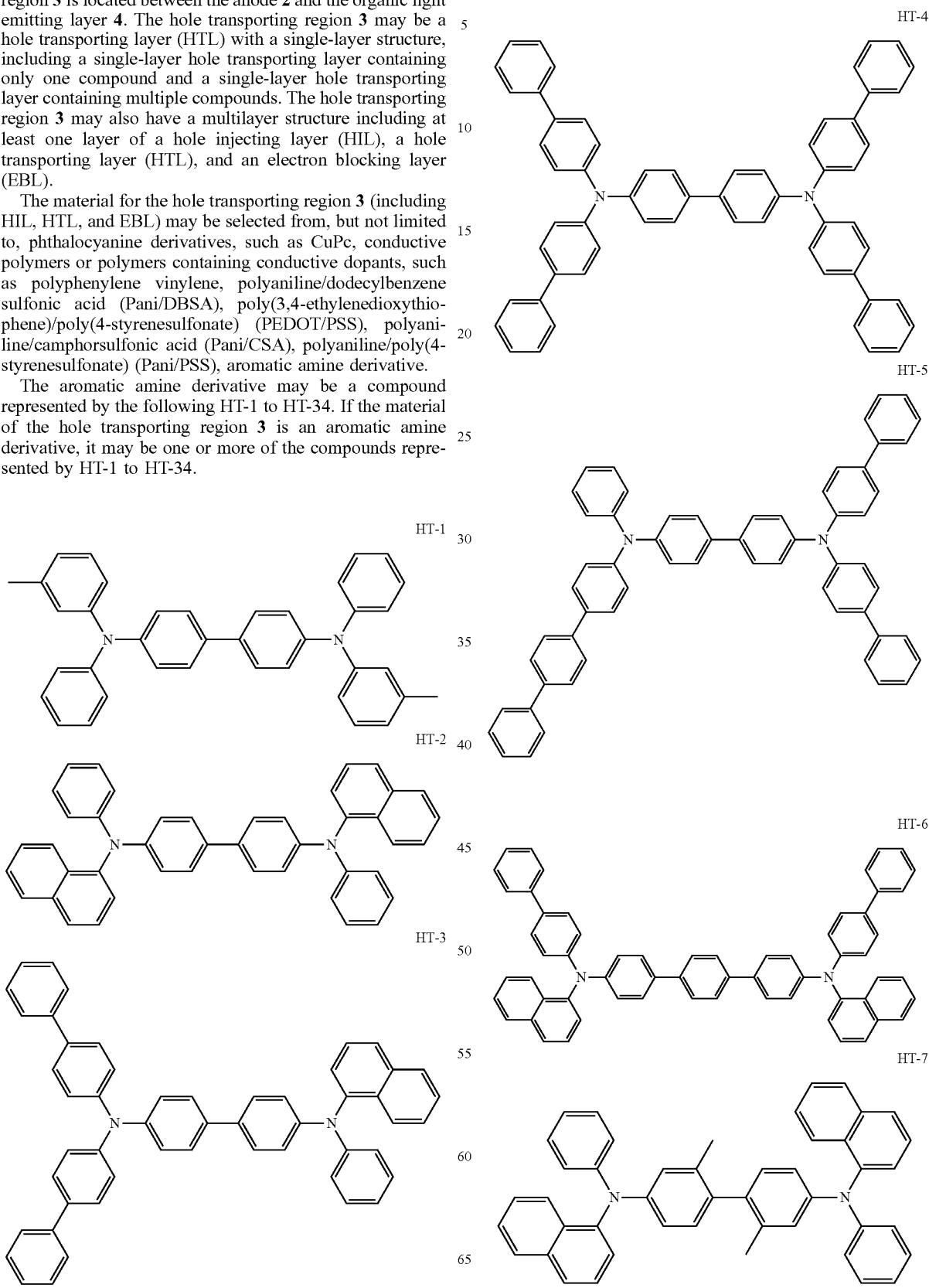

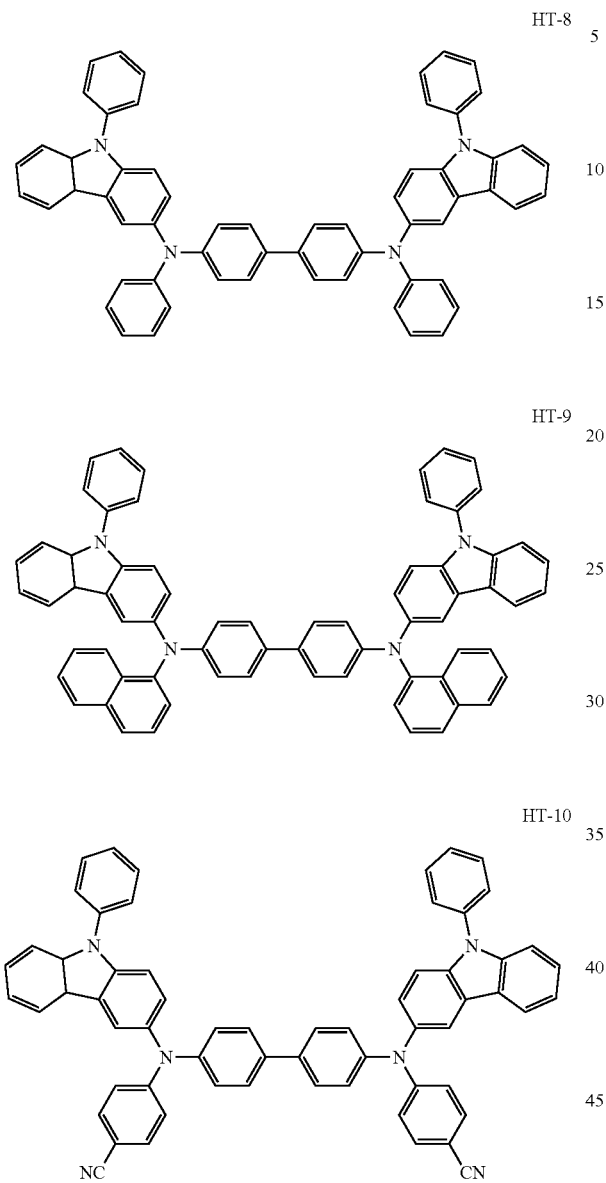
HT-8
HT-9
HT-10
HT-11
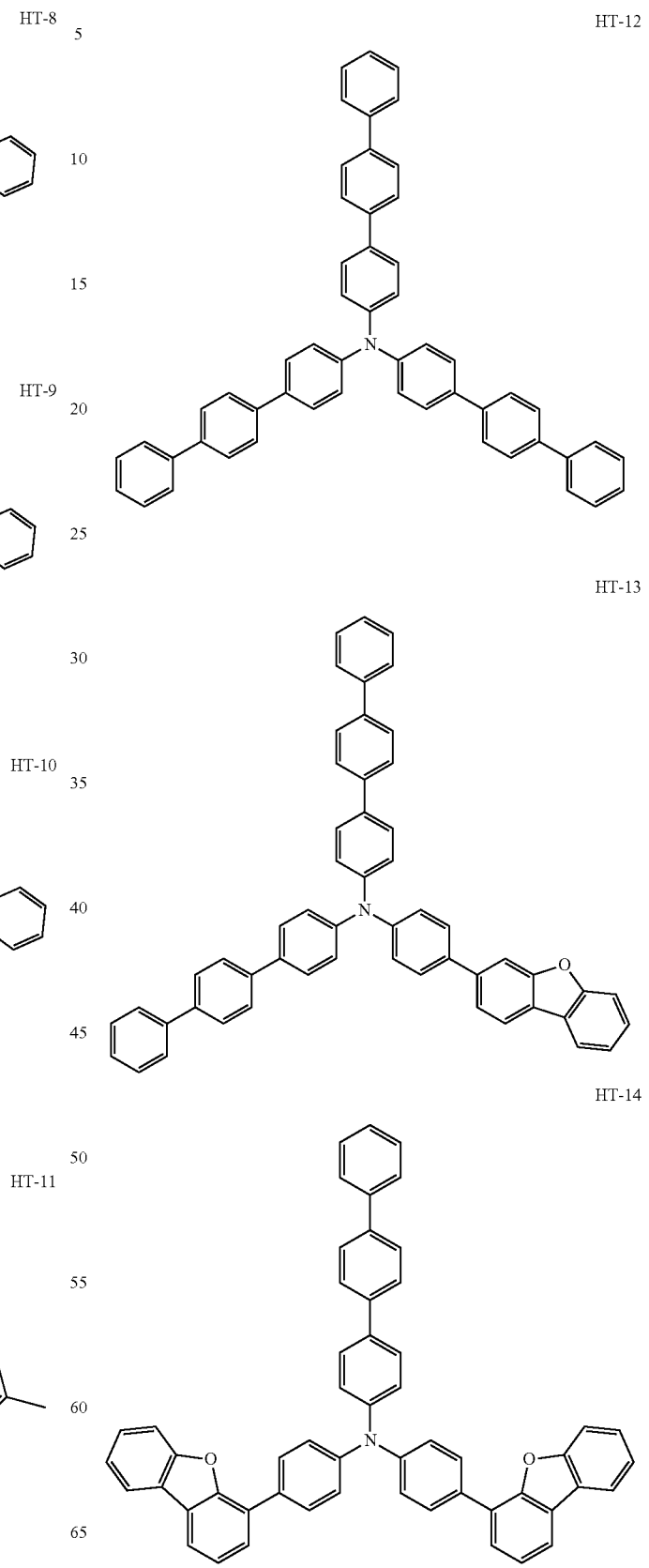
HT-12
HT-13
HT-14

HT-15
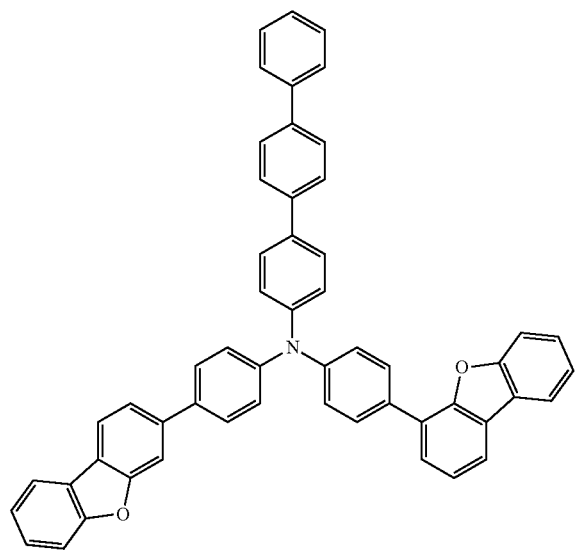
HT-16
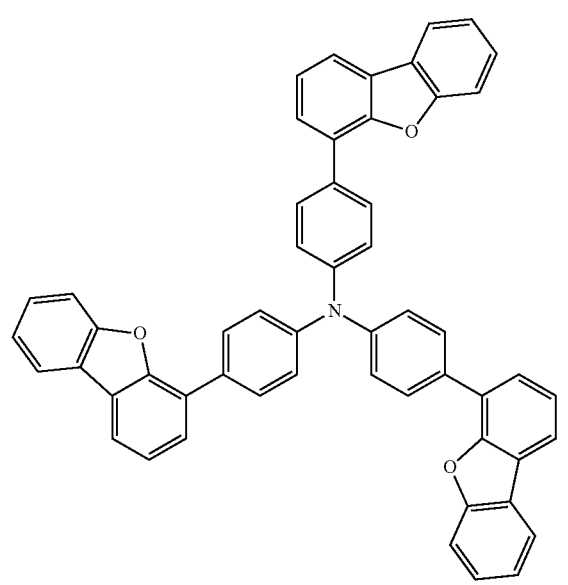
HT-17
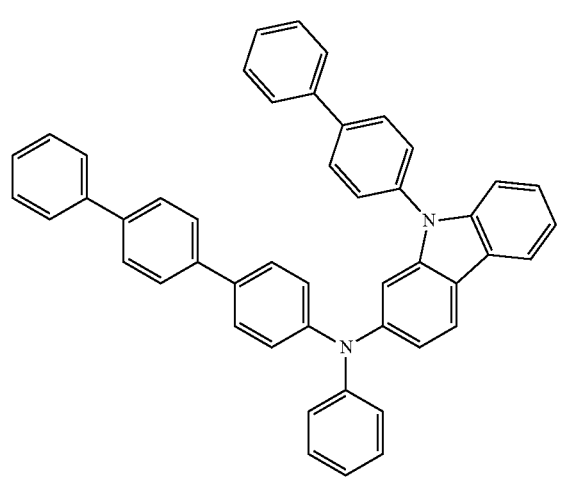
HT-18
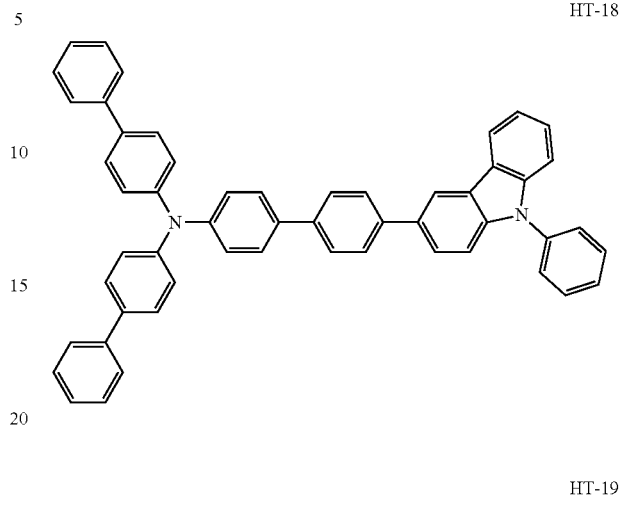
HT-19
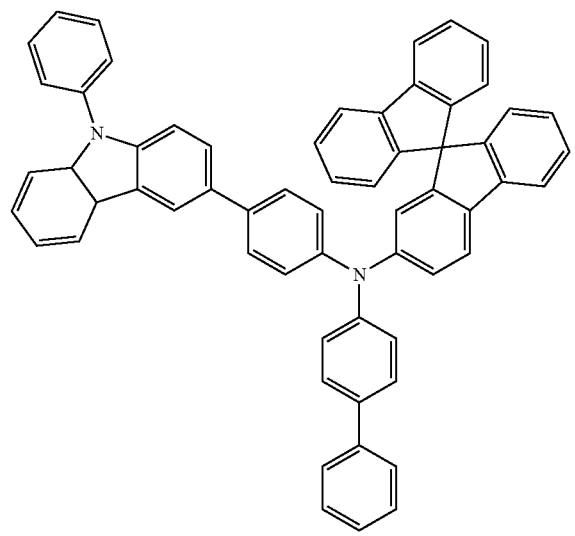
HT-20
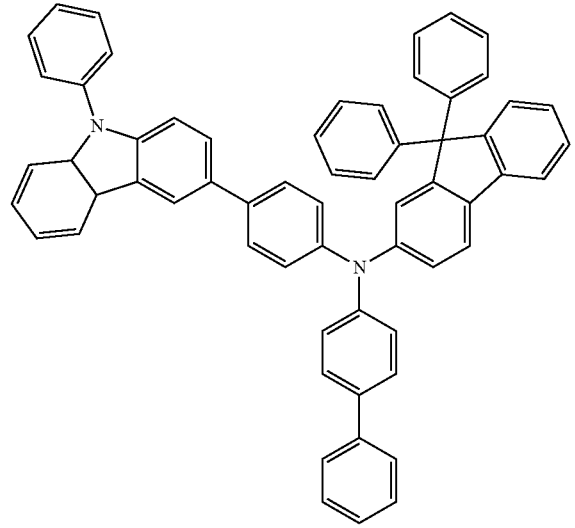

HT-21
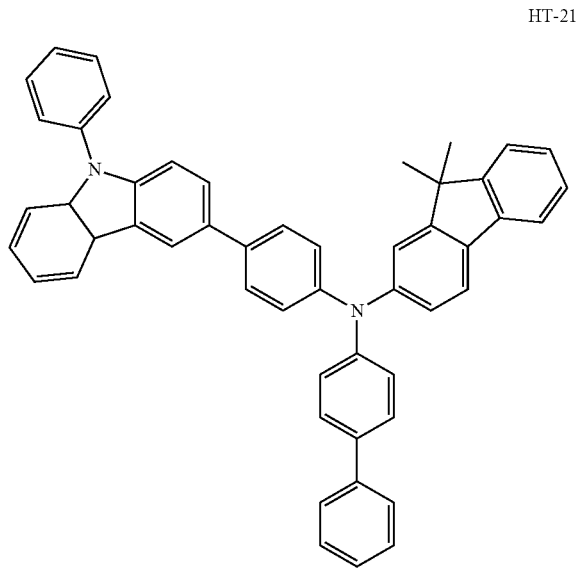
HT-24
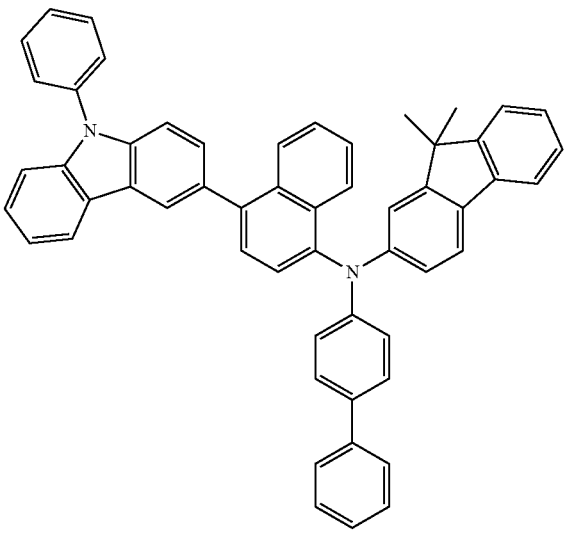
HT-22
HT-25
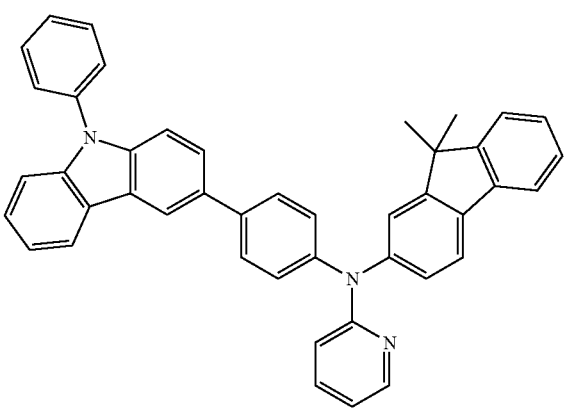
HT-23
HT-26
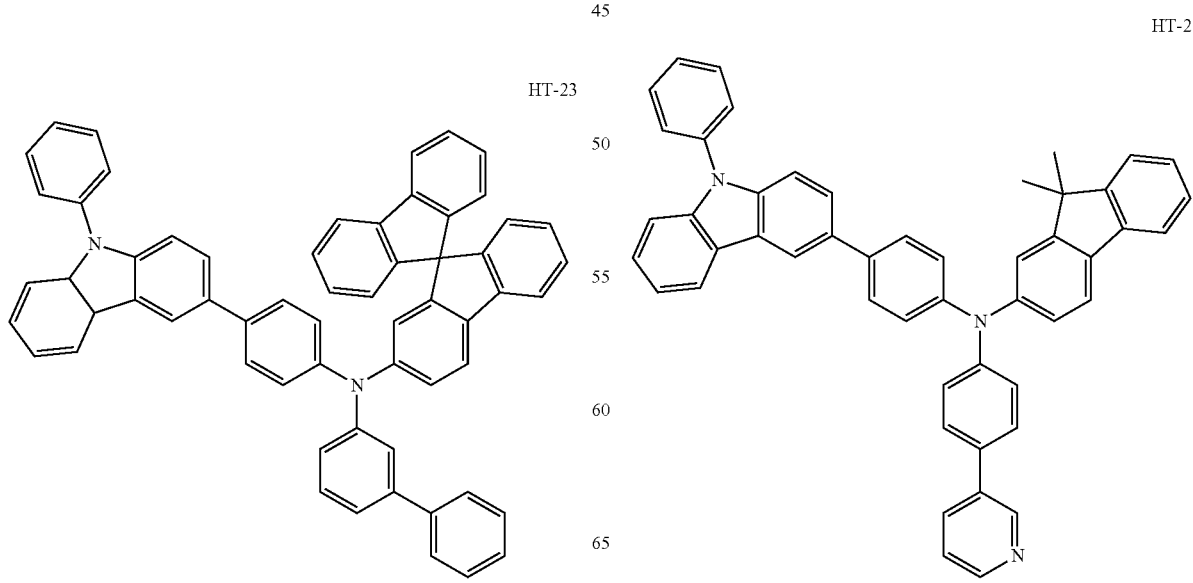

-continued
HT-27
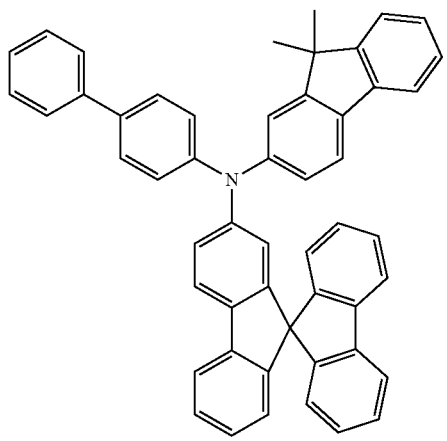
HT-28
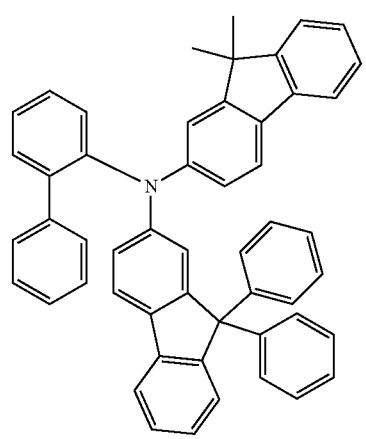
HT-29
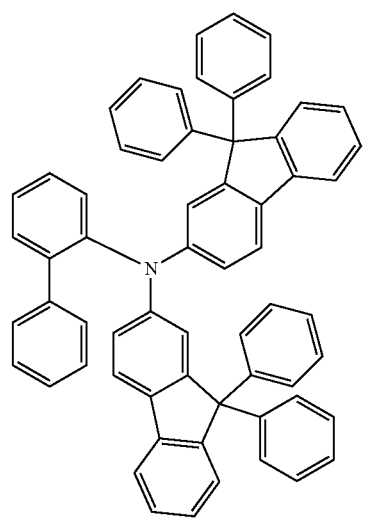
-continued
HT-30
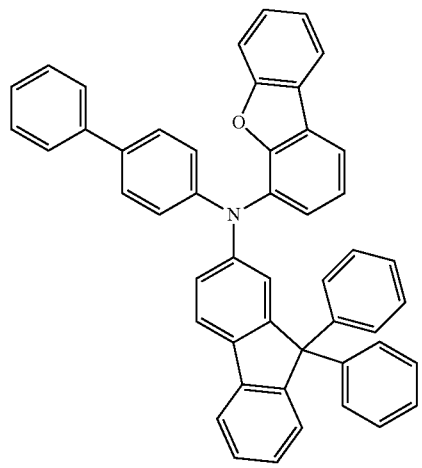
HT-31
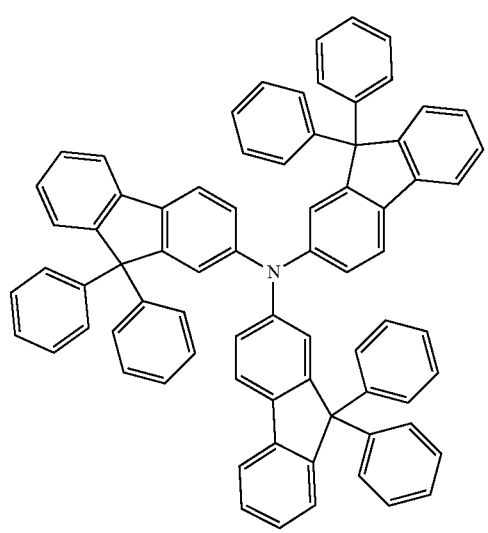
HT-32
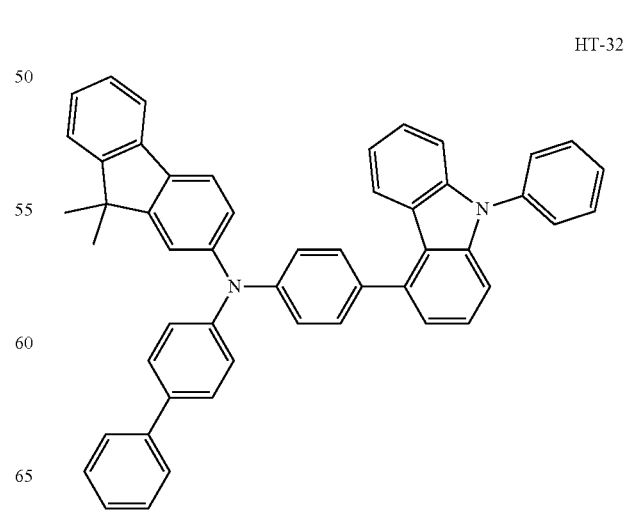

HT-33

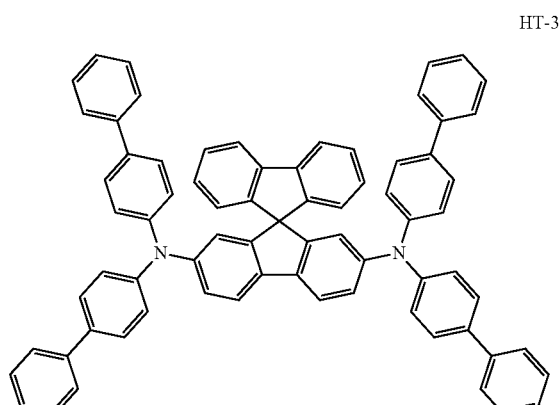

HT-34

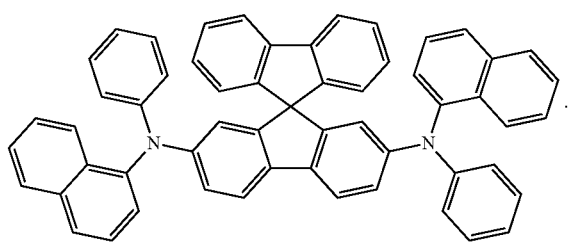

The hole injecting layer is located between the anode 2 and the hole transporting layer. The hole injecting layer may be a single compound material or a combination of a plurality of compounds. For example, the hole injecting layer may use one or more of the above-mentioned compounds HT-1 to HT-34, or one or more of the following compounds HI1-HI3, or one or more of the compounds HT-1 to HT-34 doped with one or more of the following compounds HI1-HI3.

HI-1

HI-2

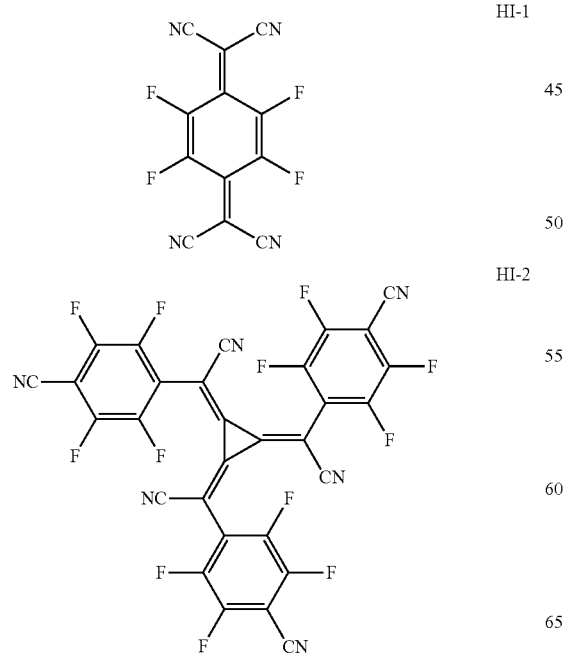

HI-3

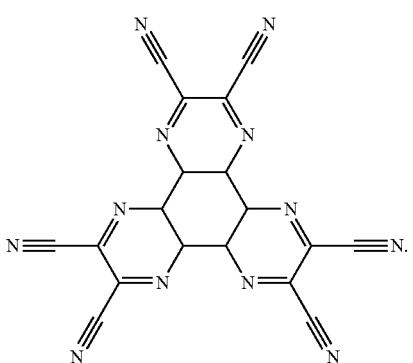

The electron transporting region 5 may be an electron transporting layer (ETL) with a single-layer structure, including a single-layer electron transporting layer containing only one compound and a single-layer electron transporting layer containing multiple compounds. The electron transporting region 5 may also be a multilayer structure including at least one layer of an electron injecting layer (EIL), an electron transporting layer (ETL), and a hole blocking layer (HBL).

In an aspect of the present application, the material of the electron transporting layer may be selected from, but not limited to, one or a combination of more of ET-1 to ET-57 as listed in the following.

ET-1

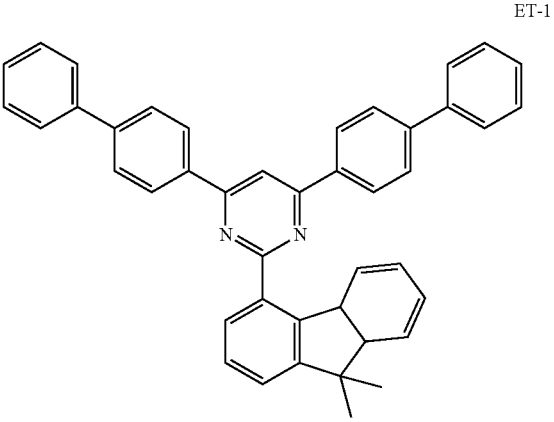

ET-2

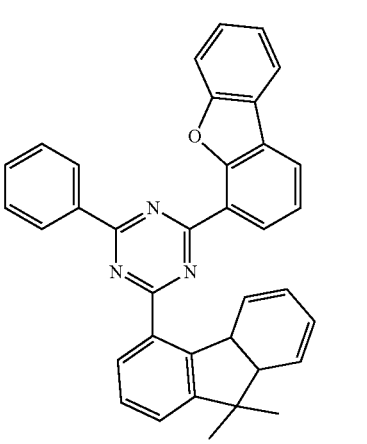

ET-3
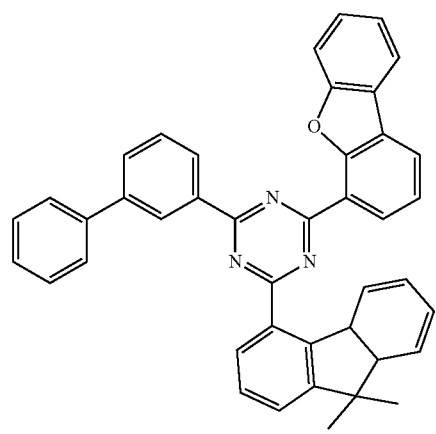
ET-4
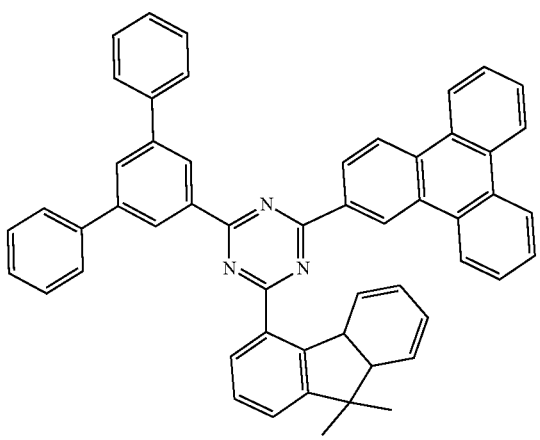
ET-5
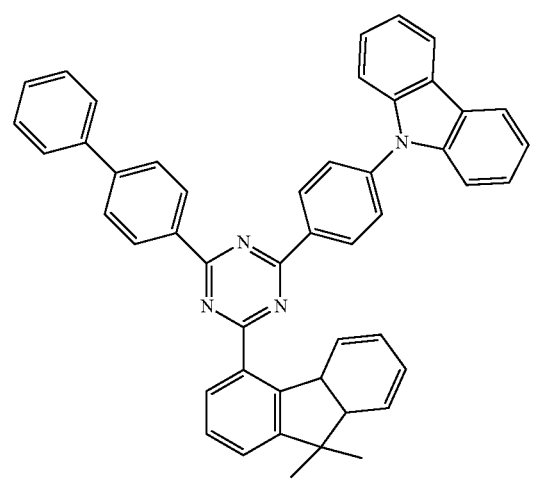
ET-6
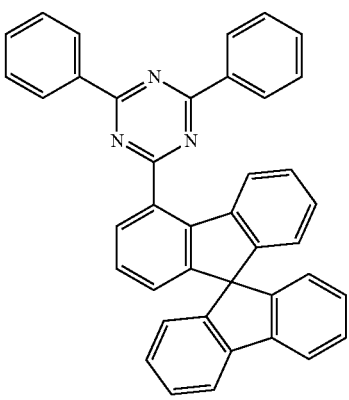
ET-7
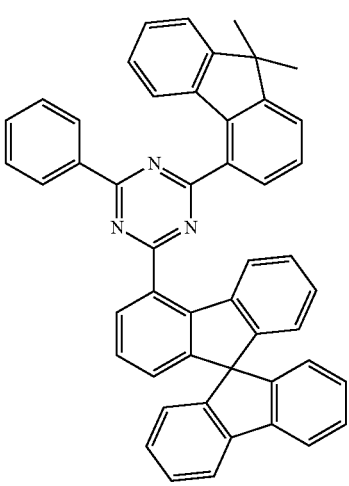
ET-8
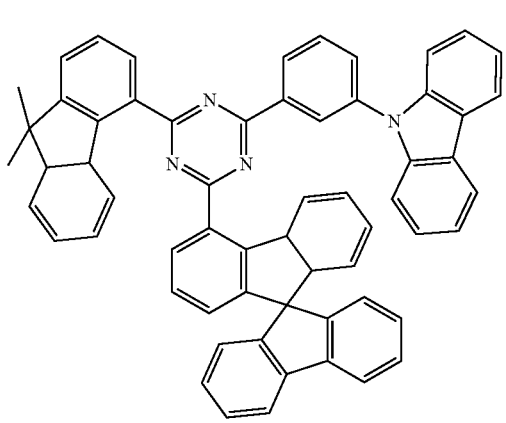

ET-9
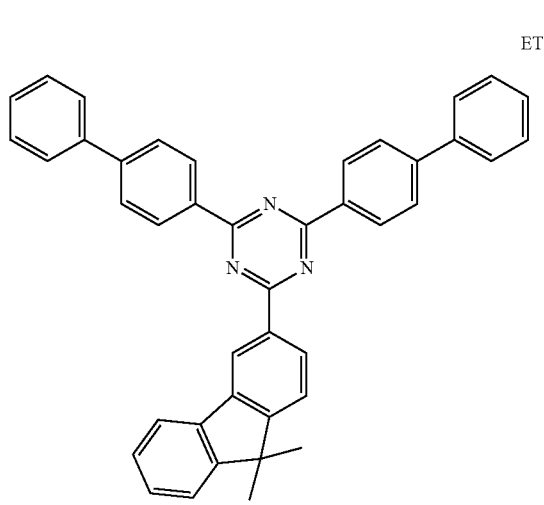
ET-10
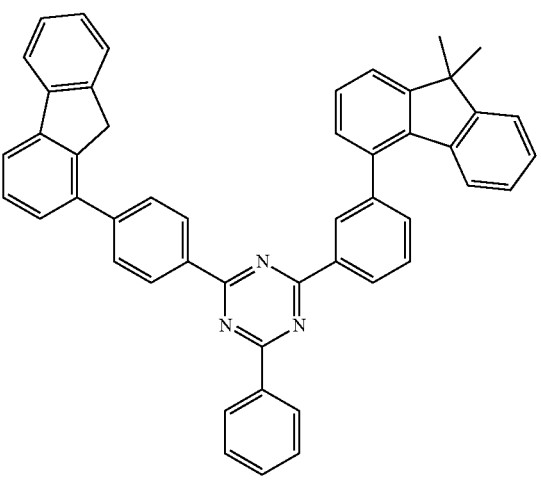
ET-11
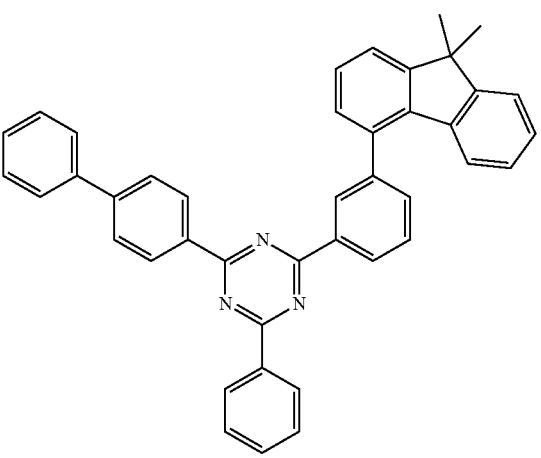
ET-12
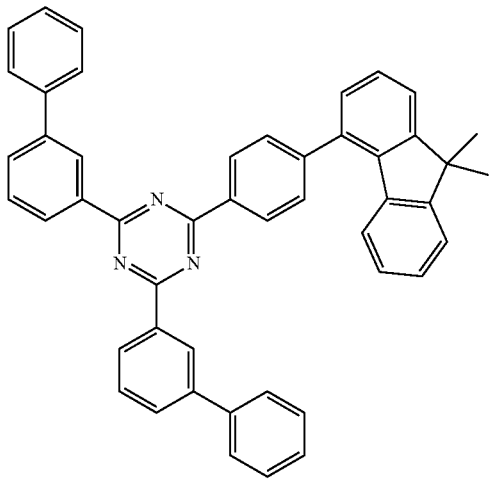
ET-13
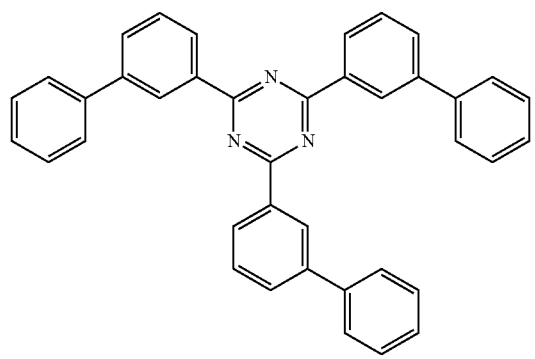
ET-14
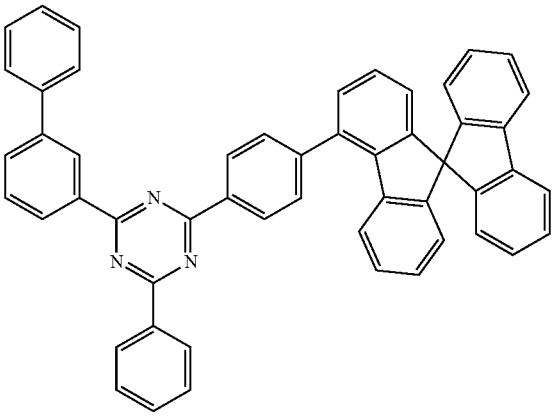

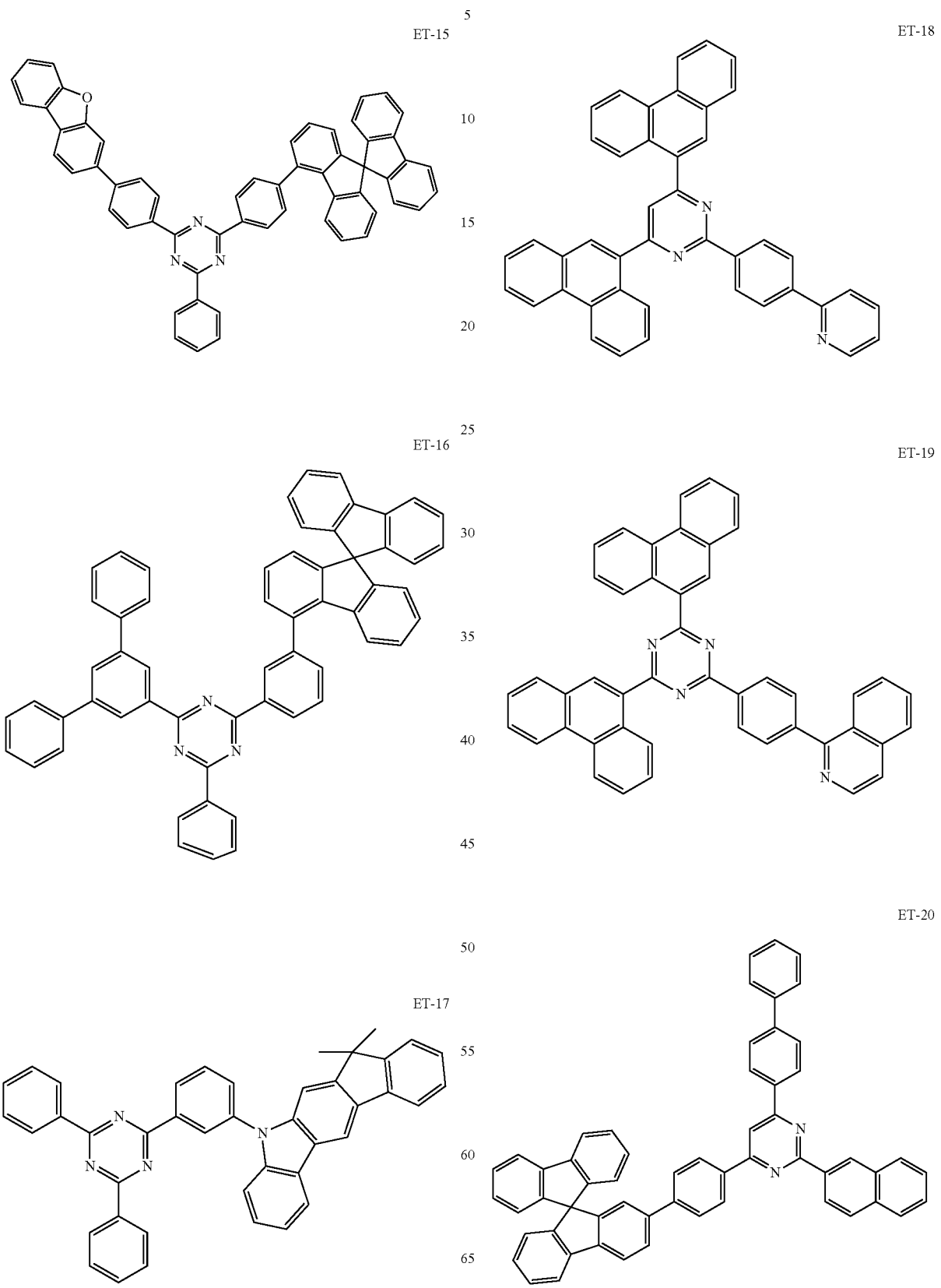

ET-21
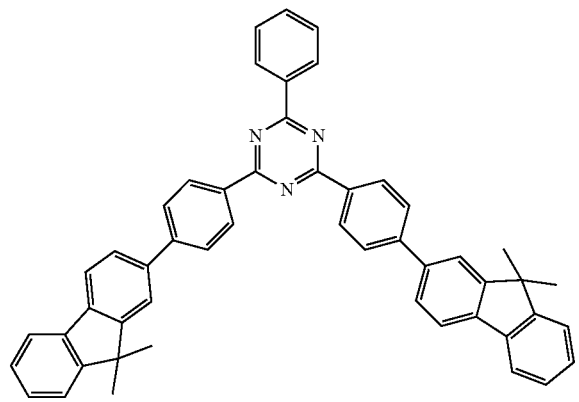
ET-22
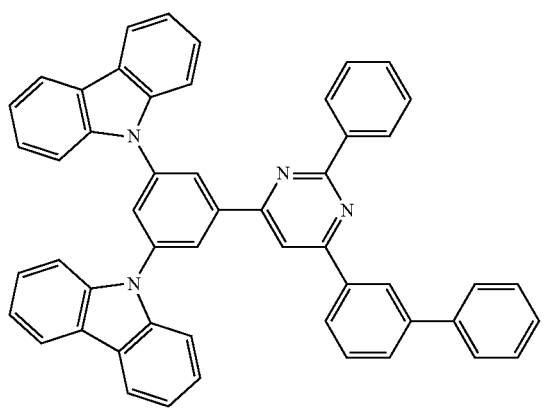
ET-23
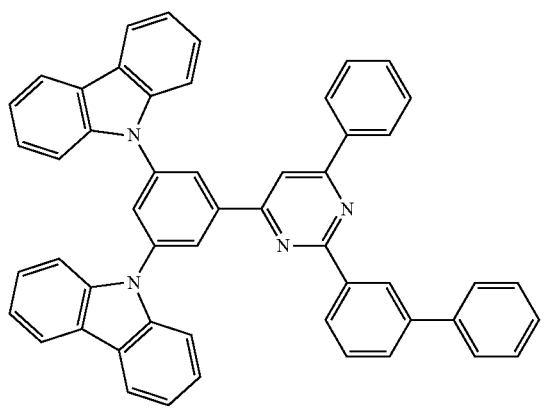
ET-24
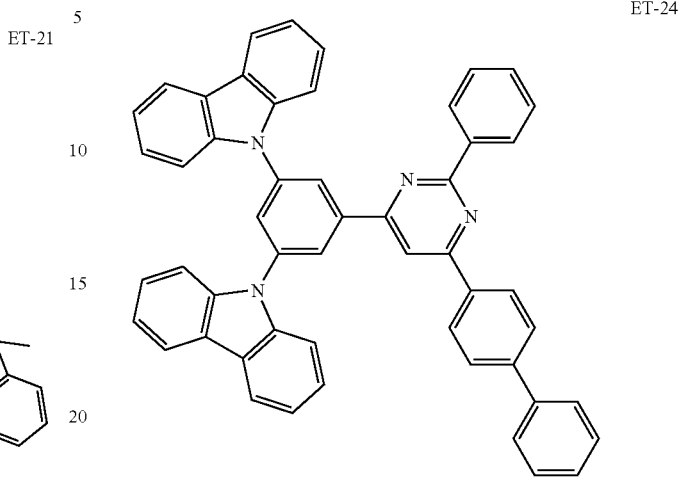
ET-25
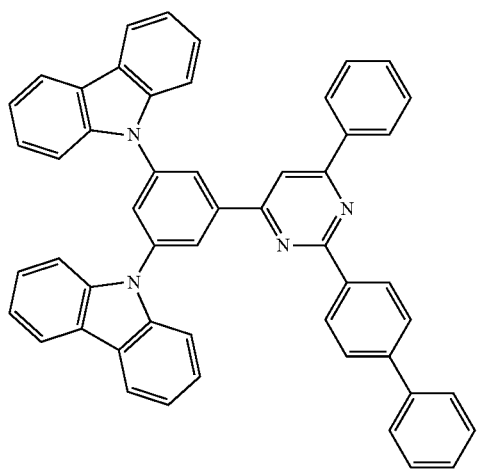
ET-26
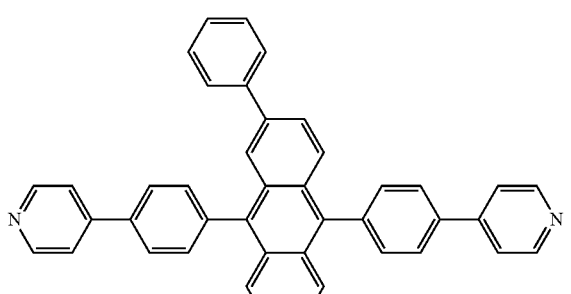
ET-27
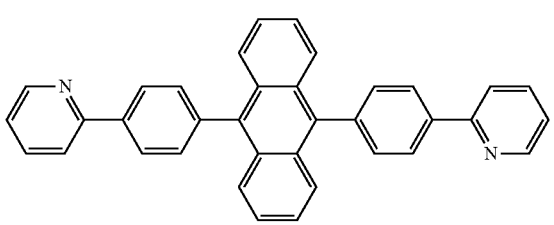

ET-28
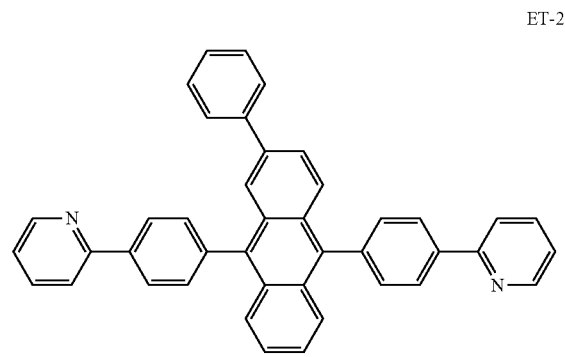
ET-29
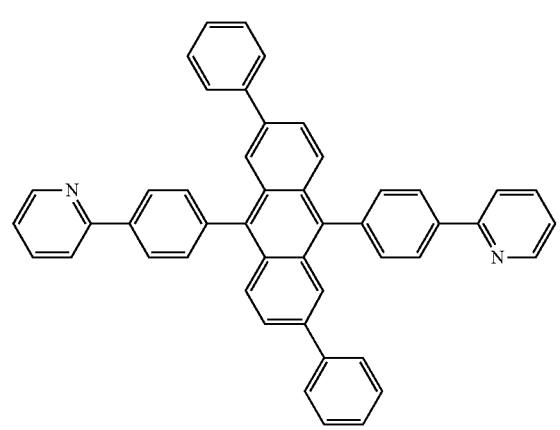
ET-30
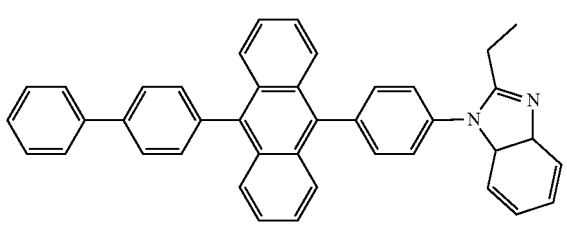
ET-31
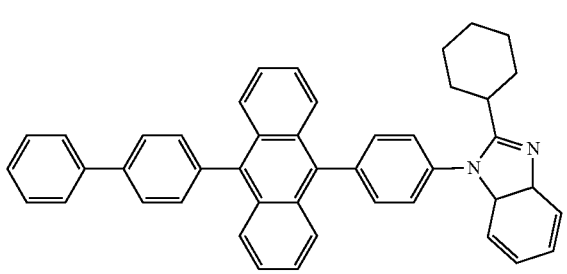
ET-32
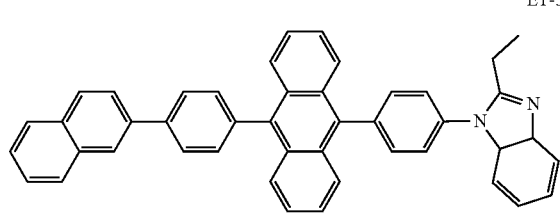
ET-33
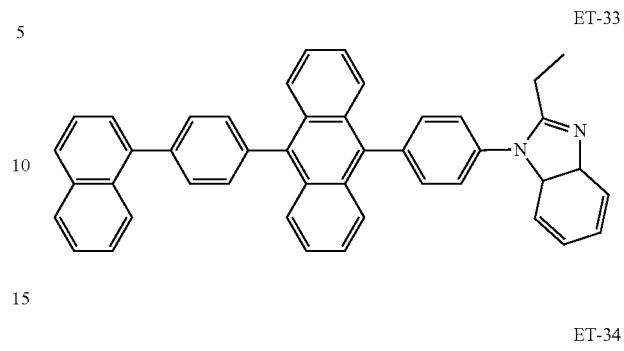
ET-34
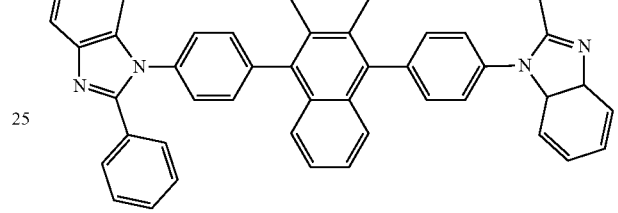
ET-35
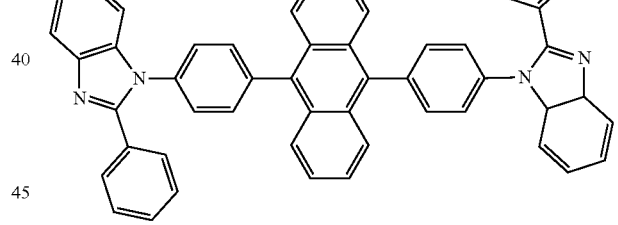
ET-36
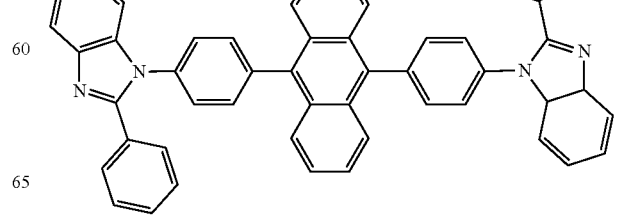

ET-37
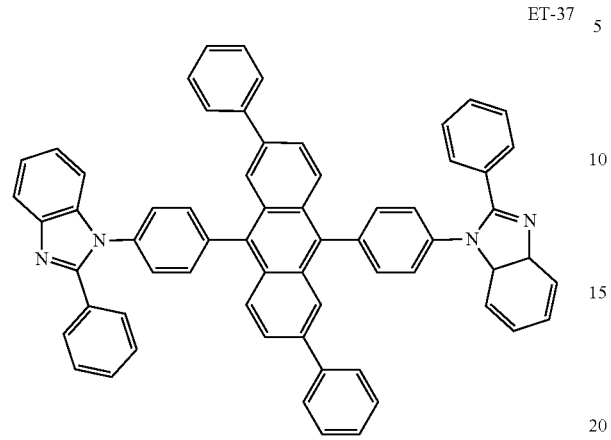
ET-38
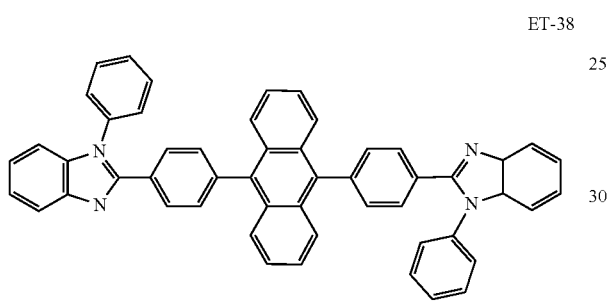
ET-39
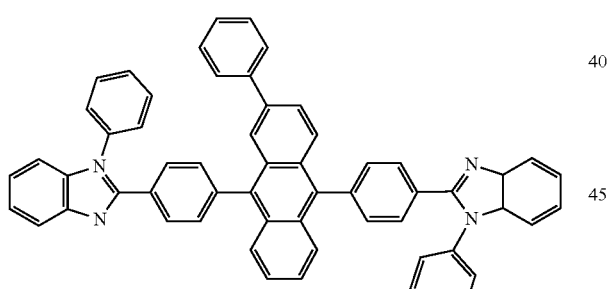
ET-40
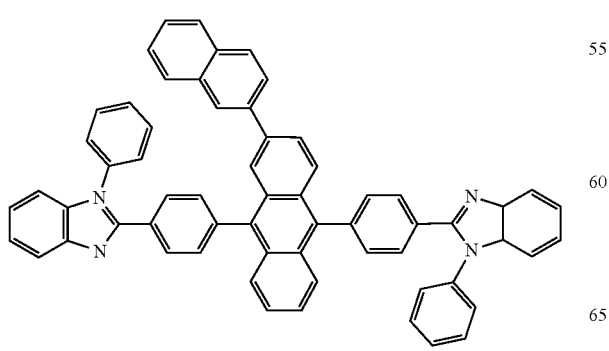
ET-41
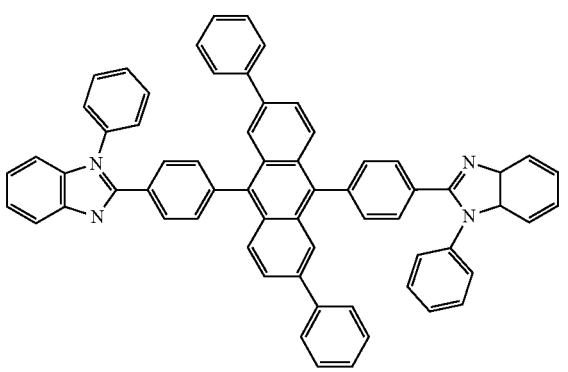
ET-42
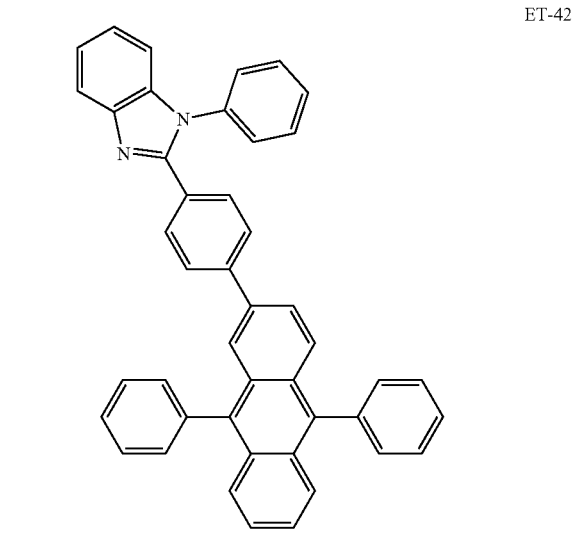
ET-43
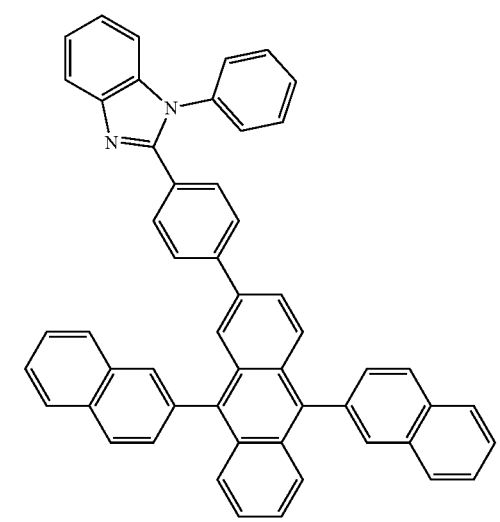

-continued
ET-44
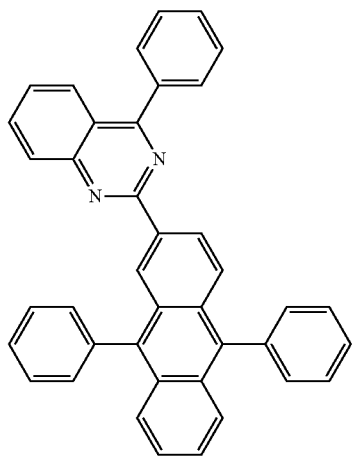
ET-45
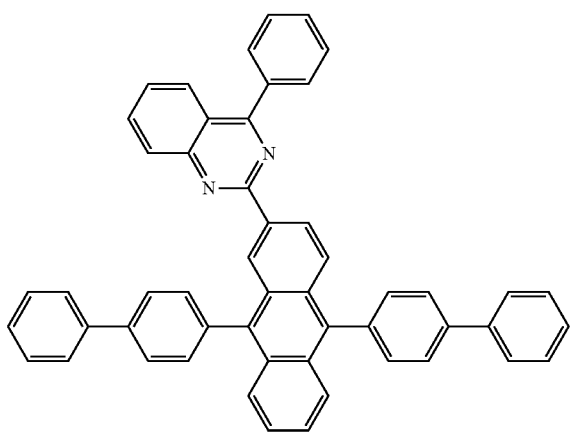
ET-46
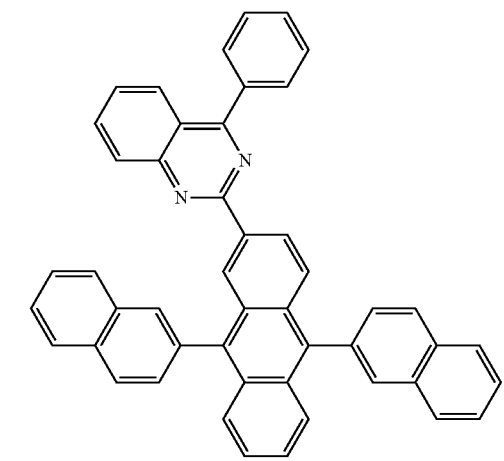
-continued
ET-47
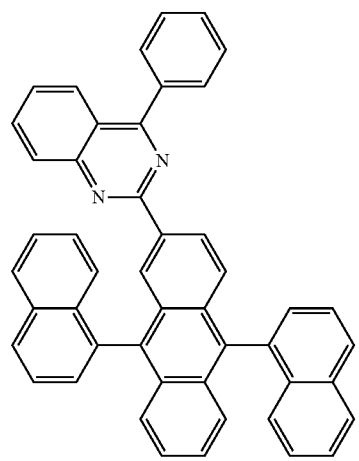
ET-48
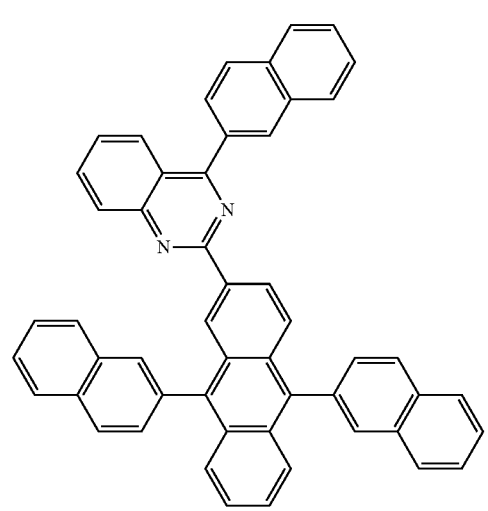
ET-49
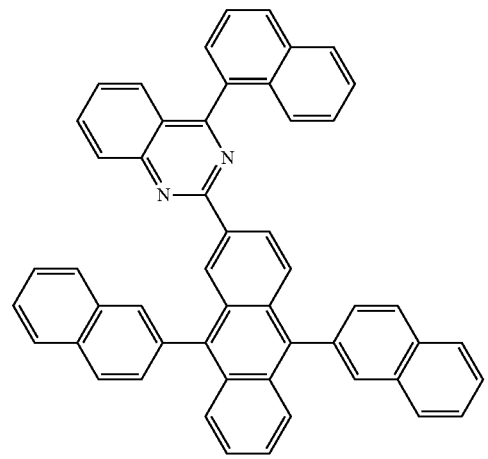

ET-50
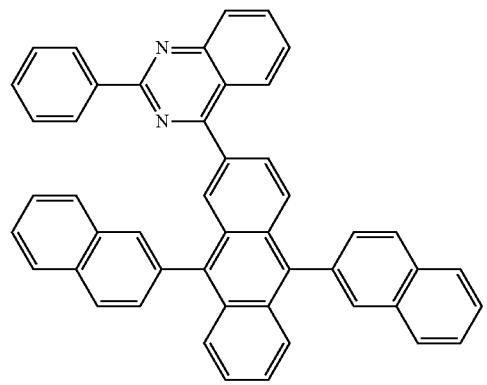
ET-51
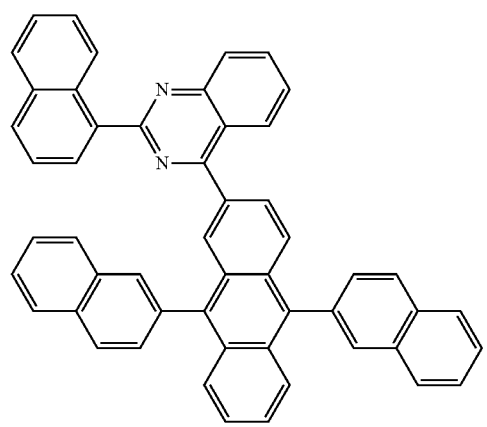
ET-52
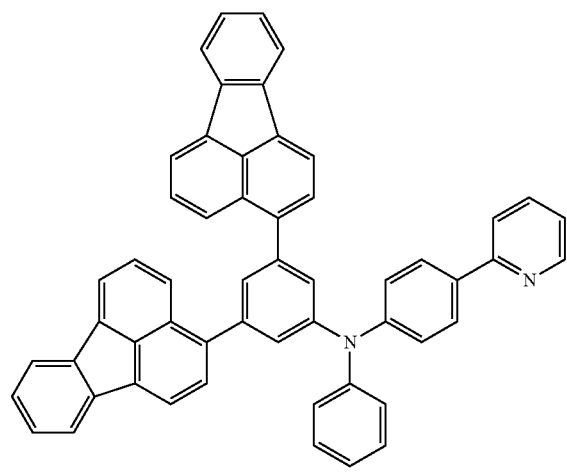
ET-53
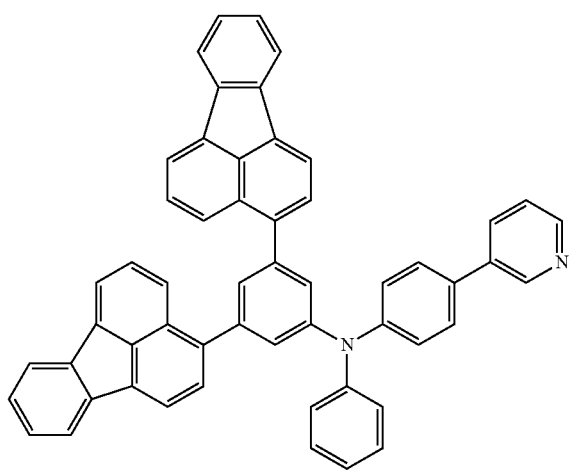
ET-54
ET-55
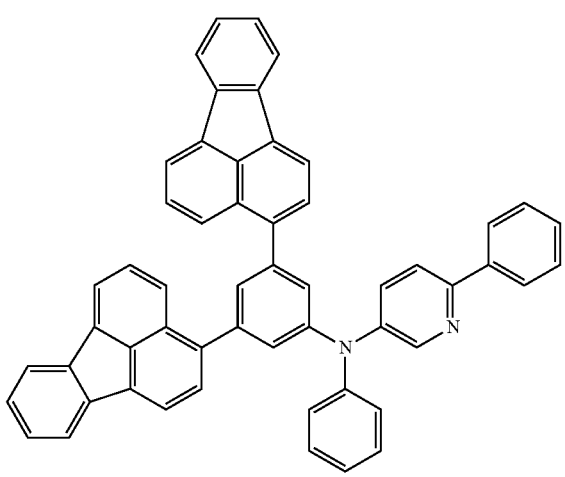

ET-56

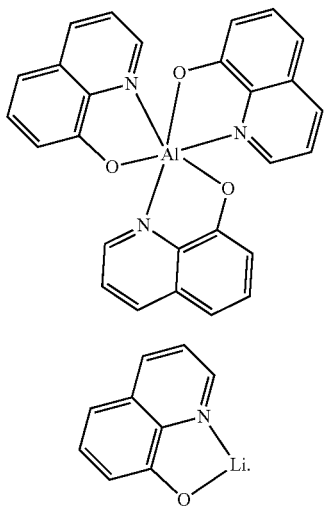

ET-57

The structure of the electroluminescence device may further include an electron injecting layer located between the electron transporting layer and the cathode 6, and the material of the electron injecting layer includes, but is not limited to, one or a combination of more of listed below.

LiQ, LiF, NaCl, CsF, $Li_2O$, $Cs_2CO_3$, BaO, Na, Li, Ca.

The thicknesses of each of the above-mentioned layers may use the conventional thicknesses of these layers in the art.

The present application also provides a method for preparing the organic electroluminescence device which, as illustrated in FIG. 1, includes a substrate 1, on which an anode 2, a hole transporting region 3, an organic light emitting layer 4, an electron transporting region 5 and a cathode 6 are deposited in sequence and then packaged. When preparing the organic light emitting layer 4, the organic light emitting layer 4 is formed by a method of a co-evaporation plating of a wide bandgap material source, an electron donor material source, an electron acceptor material source, and a resonance TADF material source.

Specifically, the method for preparing the organic electroluminescence device of the present application includes the following steps.

1. sonicating a glass plate coated with an anode material in a commercial cleaning agent; rinsing in deionized water; ultrasonically degreasing in a mixed solvent of acetone and ethanol; baking in a clean environment to completely remove moisture content; cleaning with UV light and ozone; and bombarding the surface with a low-energy cationic beam;

2. placing the above glass plate with the anode in a vacuum chamber and evacuating until $1 \times 10^{-5} \sim 9 \times 10^{-3}$ Pa, and performing the vacuum evaporation plating of a hole injecting layer onto the above anode layer film at an evaporation plating rate of 0.1.-0.5 nm/s;

3. performing the vacuum evaporation plating of a hole transporting layer onto the hole injecting layer at an evaporation plating rate of 0.1-0.5 nm/s;

4. performing the vacuum evaporation plating of a light emitting layer of the device onto the hole transporting layer, the light emitting layer including a host material, a sensitizer material, and a $TADF^{dye}$. The evaporation plating rates of the host material, the sensitizer material and the dye are adjusted using a multi-source co-evaporation method so that the dye reaches a preset doping ratio;

5. performing the vacuum evaporation plating of an electron transporting layer material of the device onto the organic light emitting layer at an evaporation plating rate of 0.1-0.5 nm/s;

6. performing the vacuum evaporation plating of LiF onto the electron transporting layer as an electron injecting layer at an evaporation plating rate of 0.1-0.5 nm/s; and performing the vacuum evaporation plating of an Al layer as a cathode of the device at an evaporation plating rate of 0.5-1 nm/s.

An embodiment of the present application also provides a display apparatus which includes the organic electroluminescence device provided hereinabove. The display apparatus specifically may be display device, such as an OLED display, etc., and any product or component having a display function and including the display device, such as a television, a digital camera, a mobile phone, and a tablet computer, etc. The display apparatus has the same advantages as the above-mentioned organic electroluminescence device over the prior art, which will not be repeated herein.

Now, the organic electroluminescence device of the present application will be introduced further using specific embodiments.

Embodiment 1

The device structure of the present embodiment is shown as below:

ITO/HI-2(10 nm)/HT-27(40 nm)/W-7:10 wt % (D-1:A-6=1:9):5 wt % M-20(30 nm)/ET-53(30 nm)/LiF(0.5 nm)/Al (150 nm)

where the anode is ITO; the material of the hole injecting layer is HI-2, wherein the overall thickness typically is 5-30 nm, or 10 nm in the present embodiment; the material of the hole transporting layer is HT-27, wherein the overall thickness typically is 5-50 nm, or 40 nm in the present embodiment; the host material of the organic light emitting layer is a wide bandgap material W-7; the weight ratio of the D-1 to A-6 in the exciplex as the sensitizer material is 1:9, and the total weight of the both accounts for 10 wt % of the organic light emitting layer; the dye is a resonance TADF material M-20 with a doping concentration (the percentage of the dye in the organic light emitting layer) of 5 wt %; the thickness of the organic light emitting layer typically is 1-60 nm, or 30 nm in the present embodiment; the material of the electron transporting layer is ET-53, with typically 5-30 nm in thickness, or 30 nm in the present embodiment; the electron injection layer and the cathode material select LiF (0.5 nm) and metallic aluminum (150 nm).

In addition, the difference $E_g$ between the HOMO energy level and the LUMO energy level of the host material, energy level difference $\Delta E_{ST}$ of the singlet state and triplet state of the sensitizer material, and energy level difference $\Delta E_{ST}$ of the singlet state and triplet state of the resonance TADF dye are shown in Table 1.

Embodiment 2

The device structure of the present embodiment is shown as below:

ITO/HI-2(10 nm)/HT-27(40 nm)/W-7:10 wt % (D-1:A-6=4:6):5 wt % M-20(30 nm)/ET-53(30 nm)/LiF(0.5 nm)/Al (150 nm)

Embodiment 3

The device structure of the present embodiment is shown as below:
ITO/HI-2(10 nm)/HT-27(40 nm)/W-7:10 wt % (D-1:A-6=5:5):5 wt % M-20(30 nm)/ET-53(30 nm)/LiF(0.5 nm)/Al(150 nm)

Embodiment 4

The device structure of the present embodiment is shown as below:
ITO/HI-2(10 nm)/HT-27(40 nm)/W-7:10 wt % (D-1:A-6=6:4):5 wt % M-20(30 nm)/ET-53(30 nm)/LiF(0.5 nm)/Al(150 nm)

Embodiment 5

The device structure of the present embodiment is shown as below:
ITO/HI-2(10 nm)/HT-27(40 nm)/W-7:15 wt % (D-1:A-6=1:9):5 wt % M-20(30 nm)/ET-53(30 nm)/LiF(0.5 nm)/Al(150 nm)

Embodiment 6

The device structure of the present embodiment is shown as below:
ITO/HI-2(10 nm)/HT-27(40 nm)/W-7:20 wt % (D-1:A-10=2:8):10 wt % M-24(30 nm)/ET-53(30 nm)/LiF(0.5 nm)/Al(150 nm)

Embodiment 7

The device structure of the present embodiment is shown as below:
ITO/HI-2(10 nm)/HT-27(40 nm)/W-7:25 wt % (D-16:A-11=3:7):3 wt % M-20(30 nm)/ET-53(30 nm)/LiF(0.5 nm)/Al(150 nm)

Embodiment 8

The device structure of the present embodiment is shown as below:
ITO/HI-2(10 nm)/HT-27(40 nm)/W-10:30 wt % (D-2:A-11=5:5):20 wt % M-32(30 nm)/ET-53(30 nm)/LiF(0.5 nm)/Al(150 nm)

Embodiment 9

The device structure of the present embodiment is shown as below:
ITO/HI-2(10 nm)/HT-27(40 nm)/W-10:50 wt % (D-1:A-13=4.5:5.5):1 wt % M-32(30 nm)/ET-53(30 nm)/LiF(0.5 nm)/Al(150 nm)

Embodiment 10

The device structure of the present embodiment is shown as below:
ITO/HI-2(10 nm)/HT-27(40 nm)/W-10:10 wt % (D-1:A-17=9:1):5 wt % M-40(30 nm)/ET-53(30 nm)/LiF(0.5 nm)/Al(150 nm)

Embodiment 11

The device structure of the present embodiment is shown as below:
ITO/HI-2(10 nm)/HT-27(40 nm)/W-45:60 wt % (D-3:A-26=6:4):0.5 wt % M-44(30 nm)/ET-53(30 nm)/LiF(0.5 nm)/Al(150 nm)

Embodiment 12

The device structure of the present embodiment is shown as below:
ITO/HI-2(10 nm)/HT-27(40 nm)/W-45:2 wt % (D-9:A-28=5.5:4.5):15 wt % M-62(30 nm)/ET-53(30 nm)/LiF(0.5 nm)/Al(150 nm)

Embodiment 13

The device structure of the present embodiment is shown as below:
ITO/HI-2(10 nm)/HT-27(40 nm)/W-45:45 wt % (D-18:A-31=5.5:4.5):20 wt % M-72(30 nm)/ET-53(30 nm)/LiF(0.5 nm)/Al(150 nm)

Embodiment 14

The device structure of the present embodiment is shown as below:
ITO/HI-2(10 nm)/HT-27(40 nm)/W-12:15 wt % (D-9:A-14=5.5:4.5):6 wt % M-16(30 nm)/ET-53(30 nm)/LiF(0.5 nm)/Al(150 nm)

Embodiment 15

The device structure of the present embodiment is shown as below:
ITO/HI-2(10 nm)/HT-27(40 nm)/W-13:20 wt % (D-13:A-18=5.5:4.5):12 wt % M-20(30 nm)/ET-53(30 nm)/LiF(0.5 nm)/Al(150 nm)

Embodiment 16

The device structure of the present embodiment is shown as below:
ITO/HI-2(10 nm)/HT-27(40 nm)/W-15:20 wt % (D-17:A-33=5.5:4.5):15 wt % M-28(30 nm)/ET-53(30 nm)/LiF(0.5 nm)/Al(150 nm)

Embodiment 17

The device structure of the present embodiment is shown as below:
ITO/HI-2(10 nm)/HT-27(40 nm)/W-17:45 wt % (D-18:A-17=5.5:4.5):8 wt % M-54(30 nm)/ET-53(30 nm)/LiF(0.5 nm)/Al(150 nm)

Embodiment 18

The device structure of the present embodiment is shown as below:
ITO/HI-2(10 nm)/HT-27(40 nm)/W-34:30 wt % (D-9:A-31=5.5:4.5):9 wt % M-56(30 nm)/ET-53(30 nm)/LiF(0.5 nm)/Al(150 nm)

Embodiment 19

The device structure of the present embodiment is shown as below:
ITO/HI-2(10 nm)/HT-27(40 nm)/W-39:25 wt % (D-13:A-30=5.5:4.5):10 wt % M-66(30 nm)/ET-53(30 nm)/LiF(0.5 nm)/Al(150 nm)

Embodiment 20

The device structure of the present embodiment is shown as below:

ITO/HI-2(10 nm)/HT-27(40 nm)/W-43:35 wt % (D-17:A-31=5.5:4.5):5 wt % M-71(30 nm)/ET-53(30 nm)/LiF(0.5 nm)/Al(150 nm)

Comparative Example 1

The device structure of the present Comparative Example is shown as below:

ITO/HI-2(10 nm)/HT-27(40 nm)/(D-1:A-6=5:5):10 wt % M-20(30 nm)/ET-53(30 nm)/LiF(0.5 nm)/Al(150 nm)

Comparative Example 2

The device structure of the present Comparative Example is shown as below:

ITO/HI-2(10 nm)/HT-27(40 nm)/W-7:10 wt % (D-1:A-6=5:5)(30 nm)/ET-53(30 nm)/LiF(0.5 nm)/Al(150 nm)

Comparative Example 3

The preparation process of the device of the present Comparative Example is the same as that of Embodiment 1. The device structure of the present Comparative Example is shown as below:

ITO/HI-2(10 nm)/HT-27(40 nm)/(D-2:A-11=5:5):10 wt % M-32(30 nm)/ET-53 (30 nm)/LiF(0.5 nm)/Al(150 nm)

Comparative Example 4

The device structure of the present Comparative Example is shown as below:

ITO/HI-2(10 nm)/HT-27(40 nm)/W-7:10 wt % (D-2:A-11=5:5)(30 nm)/ET-53(30 nm)/LiF(0.5 nm)/Al(150 nm)

Comparative Example 5

The device structure of the present Comparative Example is shown as below:

ITO/HI-2(10 nm)/HT-27(40 nm)/W-7:10 wt % M-20(30 nm)/ET-53(30 nm)/LiF(0.5 nm)/Al(150 nm)

Comparative Example 6

The device structure of the present Comparative Example is shown as below:

ITO/HI-2(10 nm)/HT-27(40 nm)/W-45:10 wt % M-32(30 nm)/ET-53(30 nm)/LiF(0.5 nm)/Al(150 nm)

Comparative Example 7

The device structure of the present Comparative Example is shown as below:

ITO/HI-2(10 nm)/HT-27(40 nm)/W-10:70 wt % (D-2:A-11=5:5):5 wt % M-32(30 nm)/ET-53(30 nm)/LiF(0.5 nm)/Al(150 nm)

Comparative Example 8

The device structure of the present Comparative Example is shown as below:

ITO/HI-2(10 nm)/HT-27(40 nm)/W-10:30 wt % (D-2:A-11=5:5):30 wt % M-32(30 nm)/ET-53(30 nm)/LiF(0.5 nm)/Al(150 nm)

Comparative Example 9

The device structure of the present Comparative Example is shown as below:

ITO/HI-2(10 nm)/HT-27(40 nm)/W-33:20 wt % (D-15:A=23=5:5):10 wt % M-32(30 nm)/ET-53(30 nm)/LiF(0.5 nm)/Al(150 nm)

Comparative Example 10

The device structure of the present Comparative Example is shown as below:

ITO/HI-2(10 nm)/HT-27(40 nm)/W-33:20 wt % (D-15:A-24=5:5):10 wt % M-32(30 nm)/ET-53(30 nm)/LiF(0.5 nm)/Al(150 nm)

TABLE 1

| | $E_g$ of the host material | $\Delta E_{ST}$ of the sensitizer | $\Delta E_{ST}$ of the resonance TADF |
|---|---|---|---|
| Embodiment 1 | 4.1 eV | 0.02 eV | 0.11 eV |
| Embodiment 2 | 4.1 eV | 0.02 eV | 0.11 eV |
| Embodiment 3 | 4.1 eV | 0.02 eV | 0.11 eV |
| Embodiment 4 | 4.1 eV | 0.02 eV | 0.11 eV |
| Embodiment 5 | 4.1 eV | 0.02 eV | 0.11 eV |
| Embodiment 6 | 4.1 eV | 0.05 eV | 0.12 eV |
| Embodiment 7 | 4.1 eV | 0.10 eV | 0.11 eV |
| Embodiment 8 | 3.6 eV | 0.08 eV | 0.20 eV |
| Embodiment 9 | 3.6 eV | 0.08 eV | 0.20 eV |
| Embodiment 10 | 3.6 eV | 0.04 eV | 0.21 eV |
| Embodiment 11 | 4.0 eV | 0.01 eV | 0.08 eV |
| Embodiment 12 | 4.0 eV | 0.13 eV | 0.13 eV |
| Embodiment 13 | 4.0 eV | 0.14 eV | 0.14 eV |
| Embodiment 14 | 3.8 eV | 0.08 eV | 0.22 eV |
| Embodiment 15 | 4.0 eV | 0.10 eV | 0.11 eV |
| Embodiment 16 | 3.7 eV | 0.05 eV | 0.19 eV |
| Embodiment 17 | 3.9 eV | 0.12 eV | 0.21 eV |
| Embodiment 18 | 4.2 eV | 0.12 eV | 0.20 eV |
| Embodiment 19 | 4.1 eV | 0.13 eV | 0.14 eV |
| Embodiment 20 | 3.5 eV | 0.14 eV | 0.12 eV |
| Comparative Example 7 | 3.6 eV | 0.08 eV | 0.20 eV |
| Comparative Example 8 | 3.6 eV | 0.08 eV | 0.20 eV |
| Comparative Example 9 | 3.9 eV | 0.21 eV | 0.20 eV |
| Comparative Example 10 | 3.9 eV | 0.25 eV | 0.20 eV |

Test Examples

1. The following performance tests are performed on the organic electroluminescence device prepared by the above process (Embodiments 1-20, and Comparative Examples 1-10): the prepared and obtained the characteristic, such as current, voltage, brightness, light emitting spectrum, current efficiency and external quantum efficiency, etc., of the device are tested synchronously using a PR 655 spectral scanning luminance meter and a Keithley K 2400 digital source meter system, and the service life is tested using an MC-6000.

2. The service life of LT90 is tested as follows: setting different test brightness levels to derive a brightness-service life decay curve for the organic electroluminescence device, so as to obtain the value of the service life of the device at the required decay brightness. That is, setting the test brightness level to 5000 cd/m², maintaining a constant current, and measuring the time for the brightness of the organic electroluminescence device to drop to 4500 cd/m² in hours.

The above specific test results are shown in Table 2.

TABLE 2

| | Host material | Sensitizer and doping concentration | Dye and doping concentration | Max external quantum efficiency/100% |
|---|---|---|---|---|
| Embodiment 1 | W-7 | 10 wt % (D-1:A-6 = 1:9) | 5 wt % M-20 | 18.7 |
| Embodiment 2 | W-7 | 10 wt % (D-1:A-6 = 4:6) | 5 wt % M-20 | 19.5 |
| Embodiment 3 | W-7 | 10 wt % (D-1:A-6 = 5:5) | 5 wt % M-20 | 20.1 |
| Embodiment 4 | W-7 | 10 wt % (D-1:A-6 = 6:4) | 5 wt % M-20 | 19.2 |
| Embodiment 5 | W-7 | 15 wt % (D-1:A-6 = 1:9) | 5 wt % M-20 | 18.4 |
| Embodiment 6 | W-7 | 20 wt % (D-1:A-10 = 2:8) | 10 wt % M-24 | 18.3 |
| Embodiment 7 | W-7 | 25 wt % (D-16:A-11 = 3:7): | 3 wt % M-20 | 21.3 |
| Embodiment 8 | W-10 | 30 wt % (D-2:A-11 = 5:5) | 20 wt % M-32 | 22.4 |
| Embodiment 9 | W-10 | 50 wt % (D-1:A-13 = 4.5:5.5) | 1 wt % M-32 | 19.3 |
| Embodiment 10 | W-10 | 10 wt % (D-1:A-17 = 9:1) | 5 wt % M-40 | 19.2 |
| Embodiment 11 | W-45 | 60 wt % (D-3:A-26 = 6:4) | 0.5 wt % M-44 | 20.1 |
| Embodiment 12 | W-45 | 2 wt % (D-9:A-28 = 5.5:4.5) | 15 wt % M-62 | 22.3 |
| Embodiment 13 | W-45 | 45 wt % (D-18:A-31 = 5.5:4.5) | 20 wt % TM-72 | 17.6 |
| Embodiment 14 | W-12 | 15 wt % (D-9:A-14 = 5.5:4.5) | 6 wt % M-16 | 19.1 |
| Embodiment 15 | W-13 | 20 wt % (D-13:A-18 = 5.5:4.5) | 12 wt % M-20 | 19.4 |
| Embodiment 16 | W-15 | 30 wt % (D-17:A-33 = 5.5:4.5) | 15% wt % M-28 | 18.8 |
| Embodiment 17 | W-17 | 45 wt % (D-18:A-27 = 5.5:4.5) | 8 wt % M-54 | 20.1 |
| Embodiment 18 | W-34 | 30 wt % (D-9:A-31 = 5.5:4.5) | 9 wt % M-56 | 21.2 |
| Embodiment 19 | W-39 | 25 wt % (D-13:A-30 = 5.5:4.5) | 10 wt % M-66 | 19.6 |
| Embodiment 20 | W-43 | 35 wt % (D-17:A-31 = 5.5:4.5) | 5 wt % M-71 | 18.5 |
| Comparative Example 1 | (D-1:A-6 = 5:5) | / | 10 wt % M-20 | 19.8 |
| Comparative Example 2 | W-7 | / | 10 wt %(D-1:A-6 = 5:5) | 14.1 |
| Comparative Example 3 | (D-2:A-11 = 5:5) | / | 10 wt % M-32 | 18.7 |
| Comparative Example 4 | W-7 | / | 10 wt %(D-2:A-11 = 5:5) | 11.2 |
| Comparative Example 5 | W-7 | / | 10 wt % M-20 | 18.9 |
| Comparative Example 6 | W-45 | / | 10 wt % M-32 | 20.3 |
| Comparative Example 7 | W-10 | 70 wt % (D-2:A-11 = 5:5) | 5 wt % M-32 | 18.3 |
| Comparative Example 8 | W-10 | 30 wt % (D-2:A-11 = 5:5) | 30 wt % M-32 | 18.7 |
| Comparative Example 9 | W-33:: | 20 wt % (D-15:A-23 = 5:5) | 10 wt % M-32 | 18.5 |
| Comparative Example 10 | W-33: | 20 wt % (D-15:A-24 = 5:5) | 10 wt % M-32 | 17.4 |

| | External quantum efficiency/100% at 5000 cd/m² | Efficiency roll-off | Half-peak width | LT90/h |
|---|---|---|---|---|
| Embodiment 1 | 17.0 | 9.0% | 38 | 85 |
| Embodiment 2 | 17.8 | 8.7% | 38 | 92 |
| Embodiment 3 | 18.8 | 6.5% | 38 | 120 |
| Embodiment 4 | 17.5 | 8.9% | 38 | 89 |
| Embodiment 5 | 16.5 | 10.1% | 38 | 89 |
| Embodiment 6 | 16.7 | 8.7% | 36 | 70 |
| Embodiment 7 | 18.9 | 11.3% | 38 | 74 |
| Embodiment 8 | 20.1 | 10.3% | 35 | 81 |
| Embodiment 9 | 16.5 | 14.5% | 35 | 100 |
| Embodiment 10 | 16.8 | 12.5% | 32 | 121 |
| Embodiment 11 | 17.3 | 13.9% | 36 | 90 |
| Embodiment 12 | 19.1 | 14.3% | 34 | 85 |
| Embodiment 13 | 15.8 | 10.2% | 37 | 91 |
| Embodiment 14 | 17.4 | 8.7% | 36 | 88 |
| Embodiment 15 | 17.7 | 8.9% | 38 | 89 |
| Embodiment 16 | 16.7 | 11.2% | 39 | 78 |
| Embodiment 17 | 17.7 | 12.1% | 39 | 82 |
| Embodiment 18 | 18.8 | 11.5% | 38 | 95 |
| Embodiment 19 | 17.6 | 10.0% | 38 | 97 |
| Embodiment 20 | 16.8 | 9.1% | 36 | 96 |
| Comparative Example 1 | 14.6 | 26.3% | 40 | 50 |
| Comparative Example 2 | 10.5 | 25.5% | 78 | 12 |
| Comparative Example 3 | 14.3 | 23.5% | 39 | 54 |

TABLE 2-continued

| | | | | |
|---|---|---|---|---|
| Comparative Example 4 | 8.2 | 26.8% | 82 | 26 |
| Comparative Example 5 | 14.2 | 24.9% | 39 | 55 |
| Comparative Example 6 | 15.1 | 25.6% | 40 | 0.1 |
| Comparative Example 7 | 15.5 | 15.1% | 35 | 54 |
| Comparative Example 8 | 15.8 | 15.6% | 35 | 52 |
| Comparative Example 9 | 15.6 | 15.8% | 36 | 43 |
| Comparative Example 10 | 14.6 | 16.0% | 35 | 39 |

As can be known from Table 2:

1. compared with Comparative Examples 1-6, the technical solution provided in the present application, i.e., when the organic light emitting layer is a wide bandgap material as a host material, an exciplex as a sensitizer, and resonance TADF as a dye, the organic electroluminescence device has a low efficiency roll-off at high brightness, a narrow half-peak width and good color purity. Meanwhile, the device has a longer service life, providing overall characteristics that significantly outperform those of the Comparative Examples 1-6;

2. it can be known from Embodiments 1-4 that, when the weight ratio of the electron donor material to the electron acceptor material in the exciplex is 1:9-9:1, the device has good performance in terms of roll-off, service life and peak width. When the weight ratio of the electron donor material and the electron acceptor material is 1:1, the performance is even better;

3. according to the comparison between the Comparative Examples 7-8 and all the embodiments, it can be known that, in the present application, a percentage of the sensitizer material in the organic light emitting layer is 1 wt %-60 wt %, a percentage of the wide bandgap material in the organic light emitting layer is 20 wt %-98.9 wt %, and a percentage of the resonance thermally activated delayed fluorescent material in the organic light emitting layer is 0.1 wt %-20 wt %. The device has superior performance in roll-off, service life, and peak width;

4. according to the comparison between Comparative Examples 9-10 and all the embodiments, it can be known that when the single triplet state energy level difference of the exciplex of the present application is less than or equal to 0.15 eV, the organic electroluminescence device at high brightness can have a small efficiency roll-off and narrow half-peak width, thus exhibiting better color purity and longer device service life.

Finally, it should be noted that the foregoing embodiments are merely intended for describing, rather than limiting, the technical solutions of the present application. Although the present application is described in detail with reference to the foregoing embodiments, persons of ordinary skill in the art should understand that they may still make modifications to the technical solutions described in the foregoing embodiments, or make equivalent replacements to some or all technical features therein; however, these modifications or replacements do not make the essence of corresponding technical solutions depart from the scope of the technical solutions in the embodiments of the present application.

The invention claimed is:

1. An organic electroluminescence device, comprising: an organic light emitting layer, wherein the organic light emitting layer comprises a host material, a sensitizer material, and a resonance thermally activated delayed fluorescent material;
   the host material is a wide bandgap material;
   the sensitizer material is an exciplex;
   a singlet state energy level for the wide bandgap material is greater than a singlet state energy level for the exciplex, and a triplet state energy level for the wide bandgap material is greater than a triplet state energy level for the exciplex; and
   a singlet state energy level for the exciplex is greater than a singlet state energy level for the resonance delayed fluorescent material, and a triplet state energy level for the exciplex is greater than a triplet state energy level for the resonance delayed fluorescent material.

2. The organic electroluminescence device according to claim 1, wherein the resonance thermally activated delayed fluorescent material has a structure represented by Formula [1]:

Formula [1]

wherein X is independently selected from one of B, P, P=O, P=S, $SiR_1$; $R_1$ is selected from hydrogen, substituted or unsubstituted $C_1$-$C_{36}$ alkyl, substituted or unsubstituted $C_6$-$C_{30}$ aryl, substituted or unsubstituted $C_3$-$C_{30}$ heteroaryl;
A is selected from substituted or unsubstituted $C_6$-$C_{30}$ aryl, substituted or unsubstituted $C_3$-$C_{30}$ heteroaryl, substituted or unsubstituted $C_6$-$C_{30}$ arylamino;
$M^1$ and $M^2$ are each independently selected from H, substituted or unsubstituted $C_1$-$C_{36}$ alkyl, substituted or unsubstituted $C_6$-$C_{30}$ aryl, substituted or unsubstituted $C_3$-$C_{30}$ heteroaryl;
at least three of adjacent X, A, $M^1$ and $M^2$ are joined into a ring that comprises X;
a is an integer from 1 to 12;
when a substituent is presented in the above group, the substituents is individually and independently selected from one or more of halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl.

3. The organic electroluminescence device according to claim 2, wherein three of adjacent X, A, $M^1$ and $M^2$ are joined into a hexatomic ring comprising two heteroatoms; and the heteroatoms are selected from two of B, P, Si, O, S, N, and Se.

4. The organic electroluminescence device according to claim 2, wherein the 'a' in the formula [1] is an integer from 1 to 6.

5. The organic electroluminescence device according to claim 2, wherein the resonance thermally activated delayed fluorescent material is a compound having one of the following general formulas:

F-1
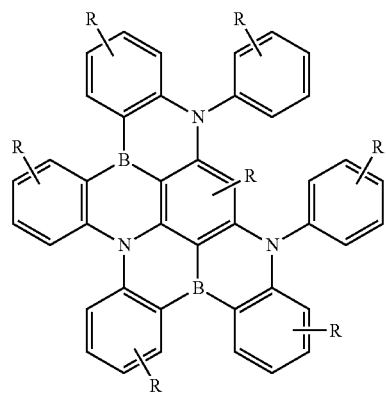

F-2
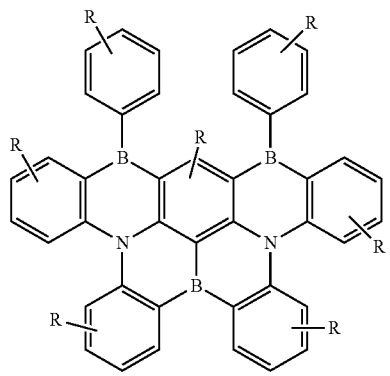

F-3
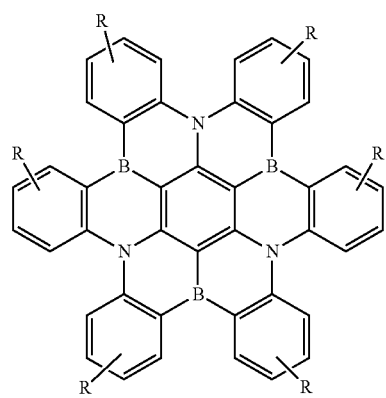

F-4
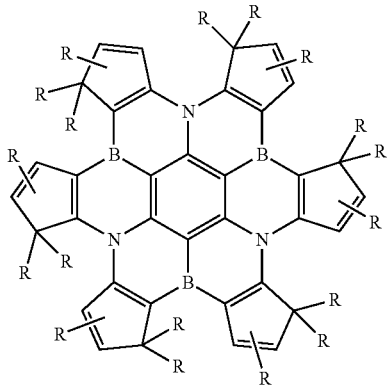

F-5
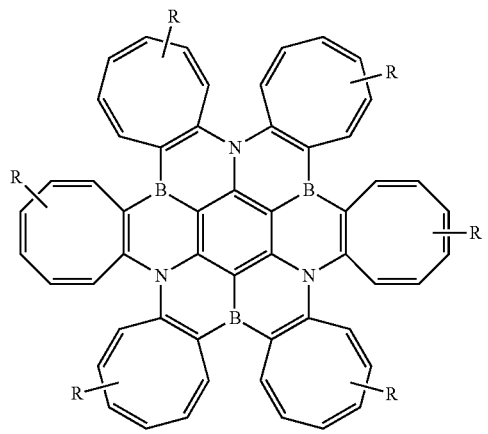

F-6
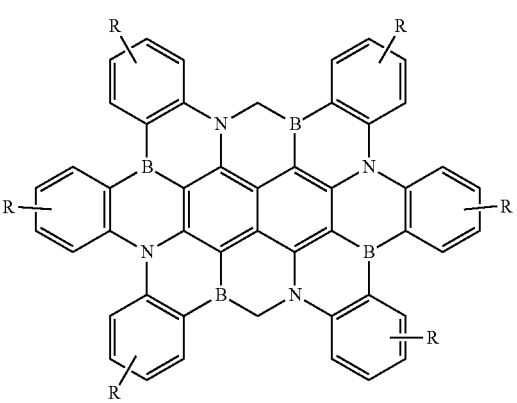

F-7
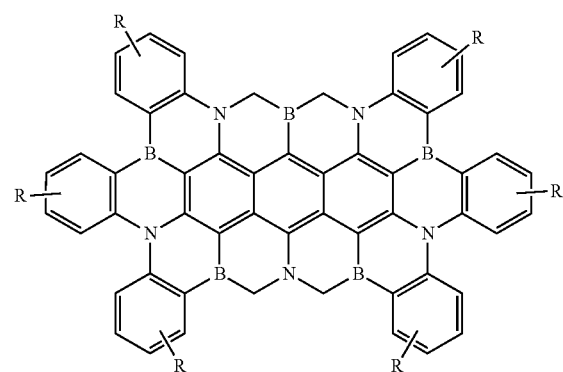

-continued
F-8
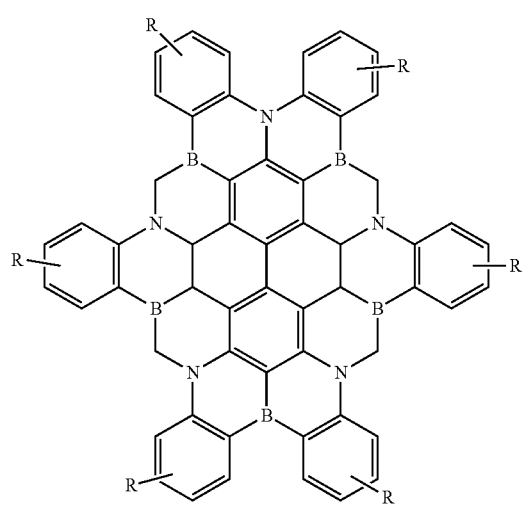
F-9
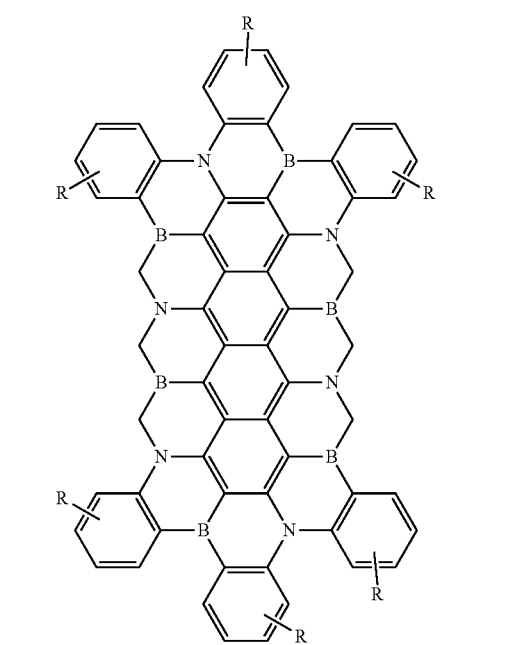
F-10
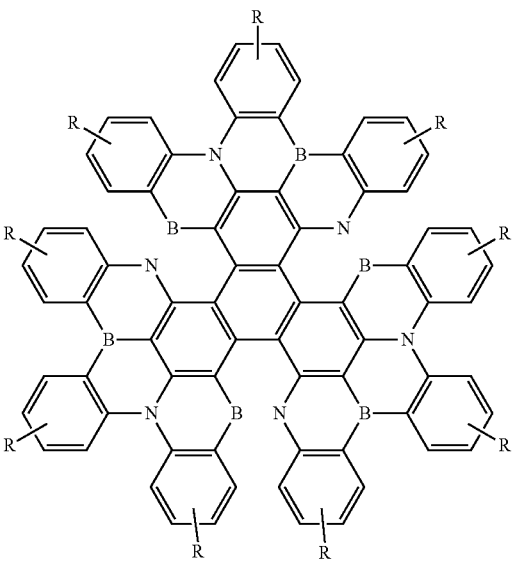
-continued
F-11
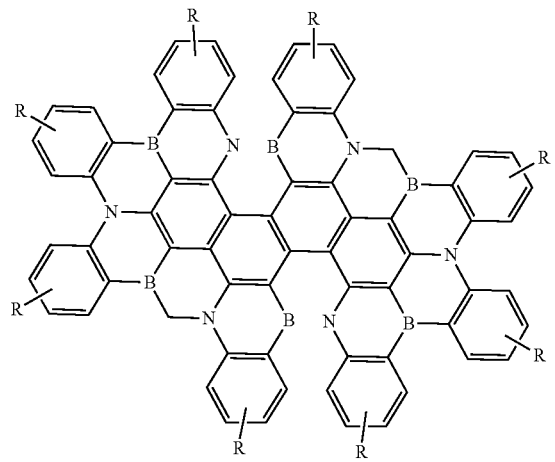
F-12
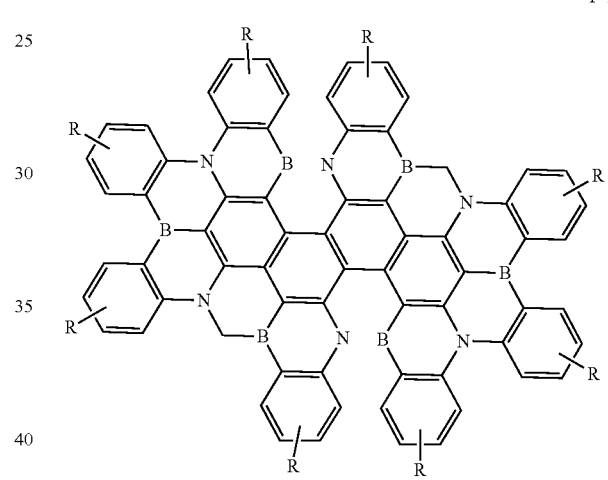
F-13
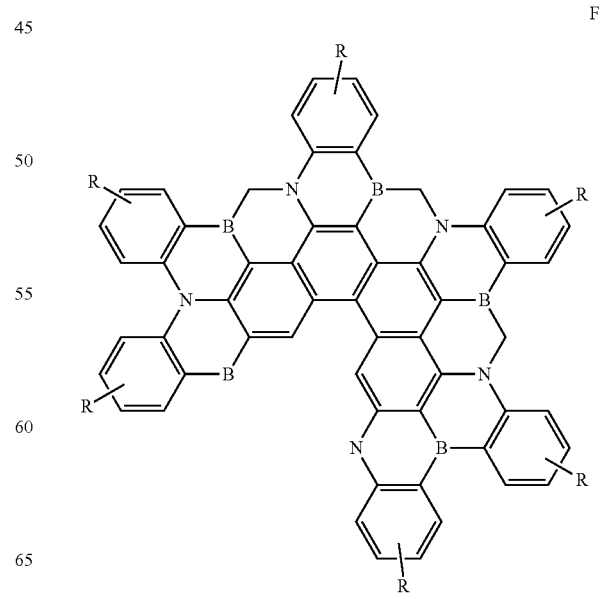

F-14
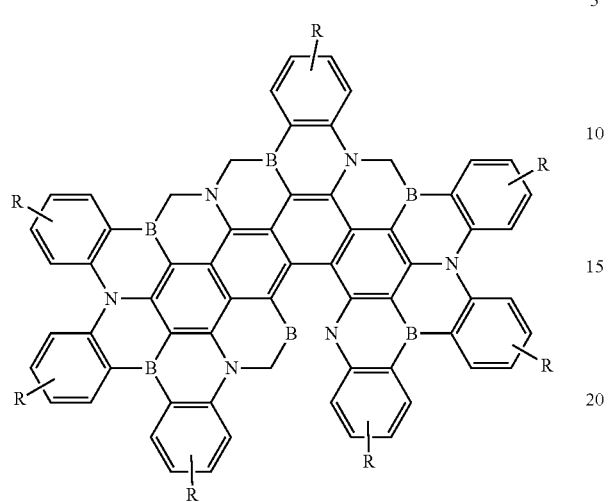
F-15
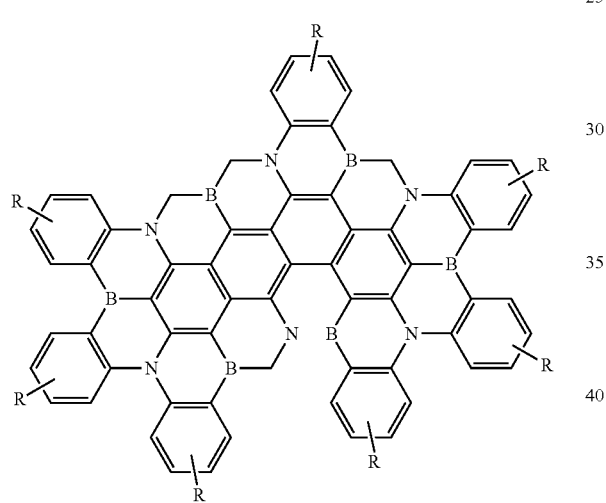
F-16
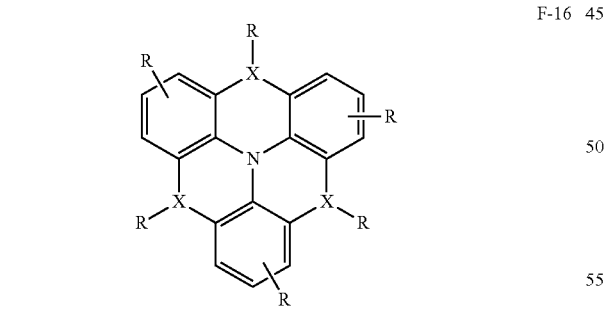
F-17
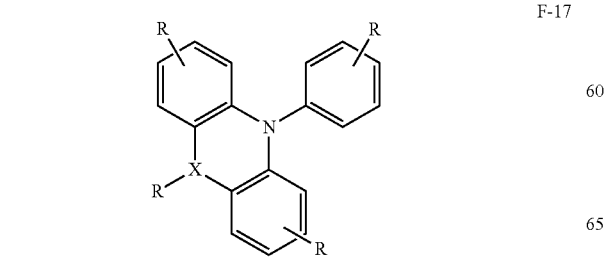
F-18
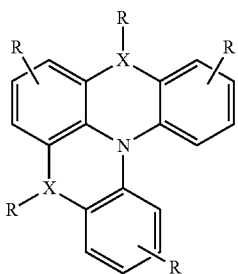
F-19
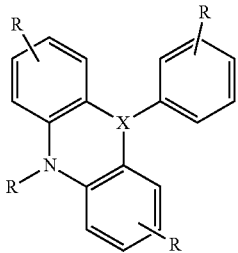
F-20
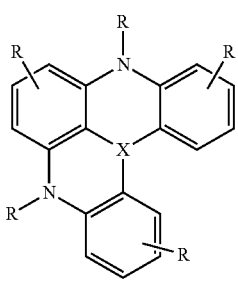
F-21
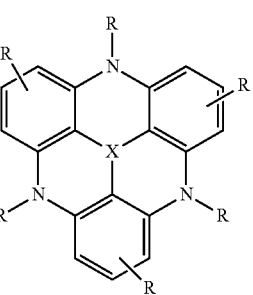
F-22
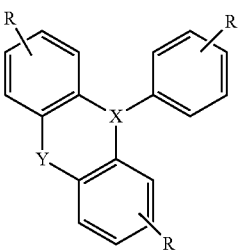
F-23
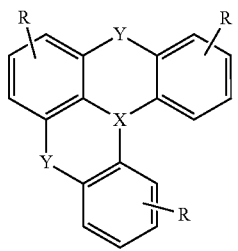

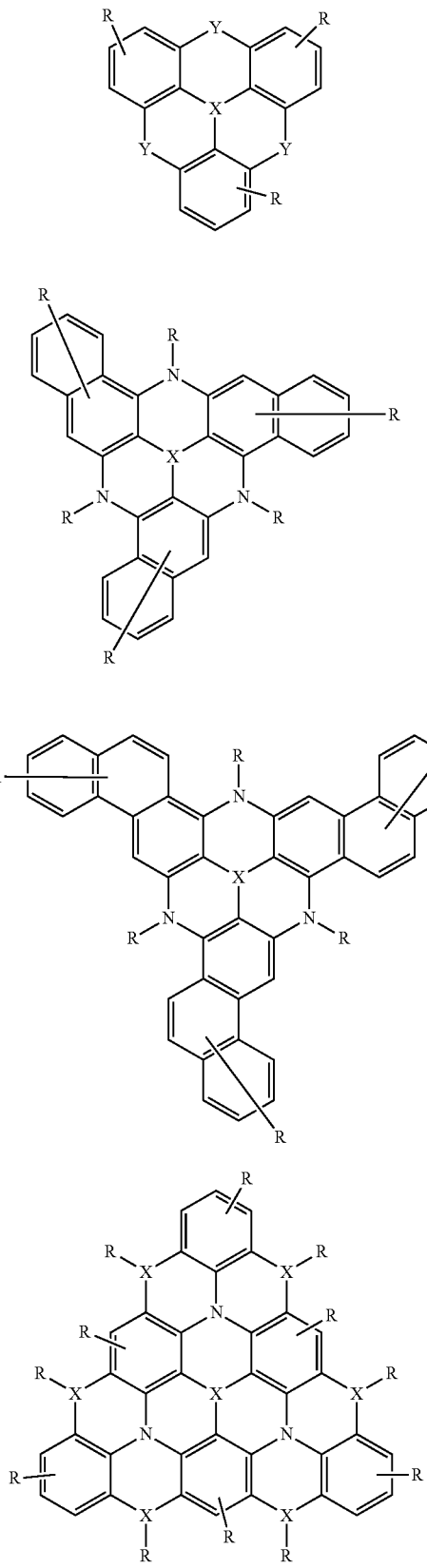

wherein R is individually and independently selected from one or more of hydrogen, halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl; and Y is independently selected from O, S, and Se.

6. The organic electroluminescence device according to claim 5, wherein the resonance thermally activated delayed fluorescent material is a compound having one of the structures shown in the following:

M-1
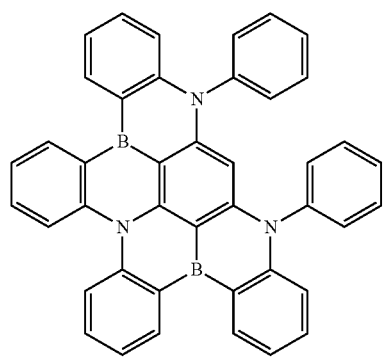
M-2
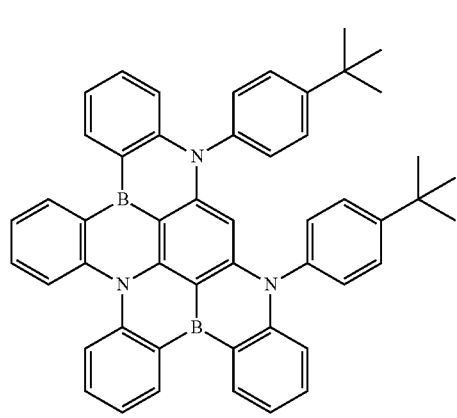
M-3
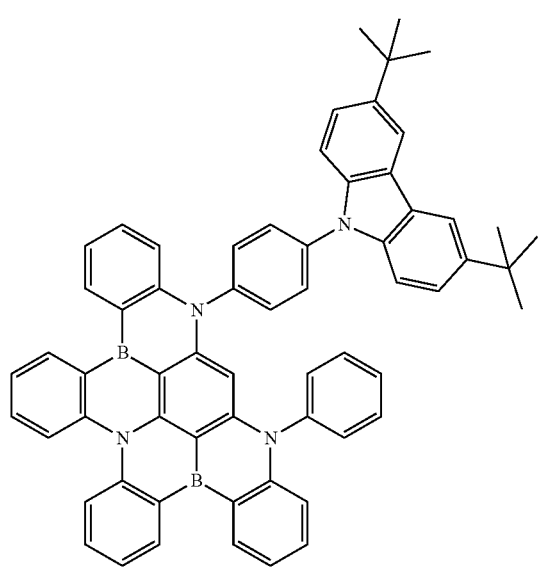

-continued
M-4
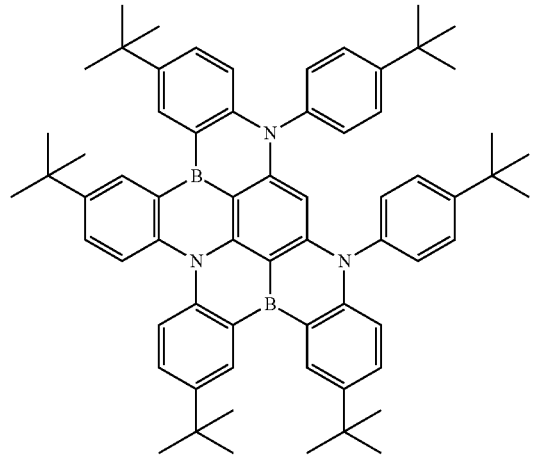
M-5
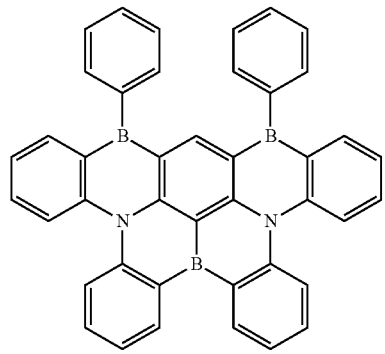
M-6
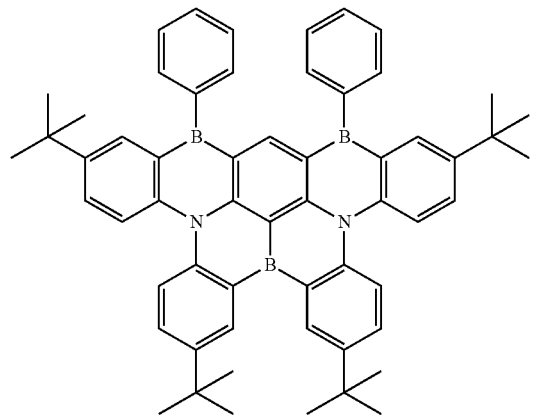
M-7
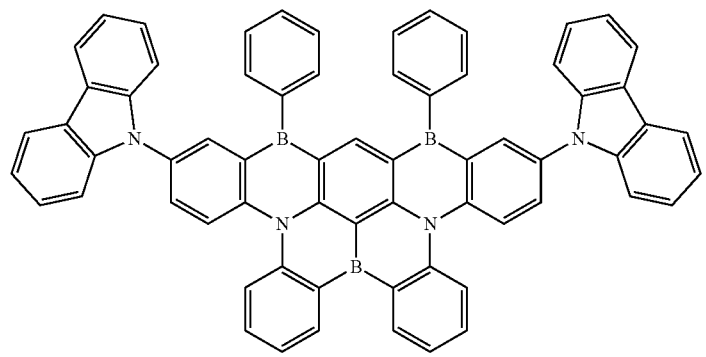

M-8
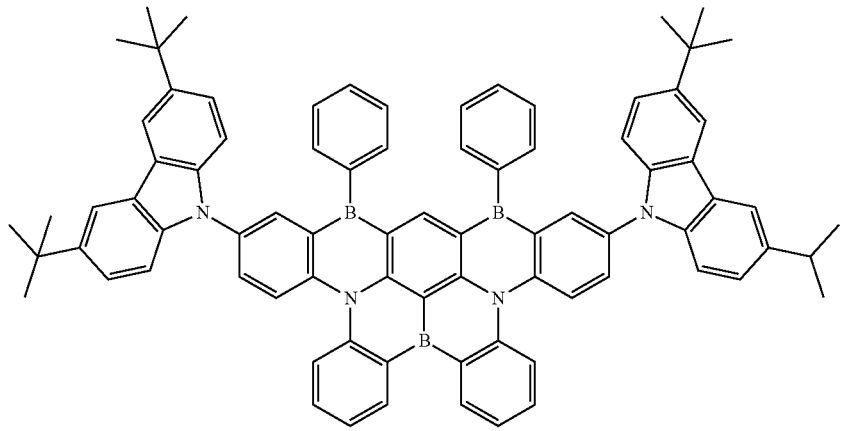
M-9
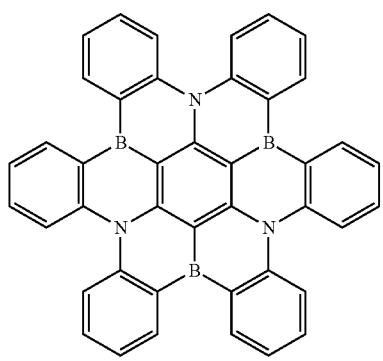
M-10
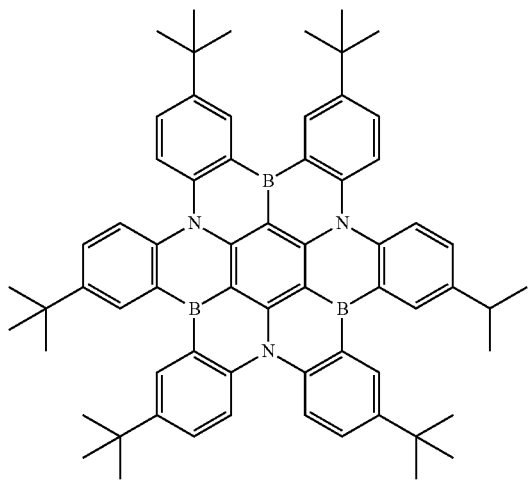
M-11
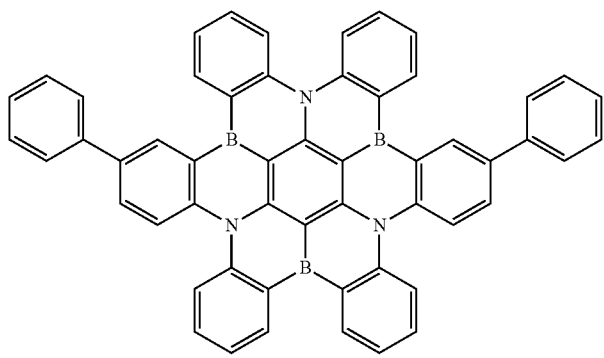

M-12
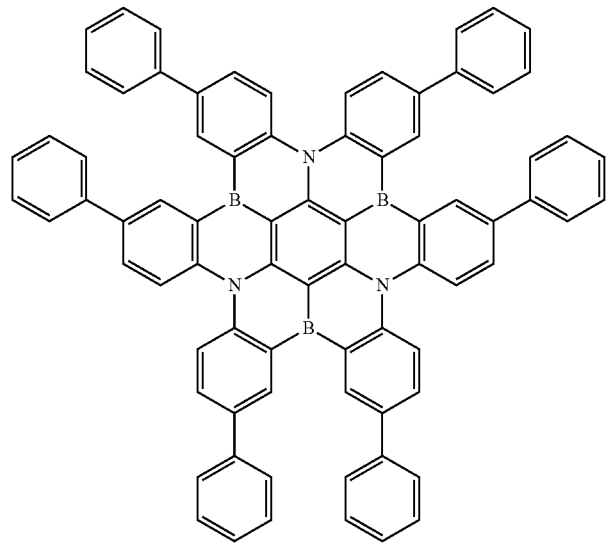
M-13
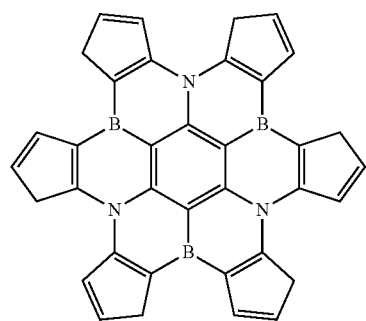
M-14
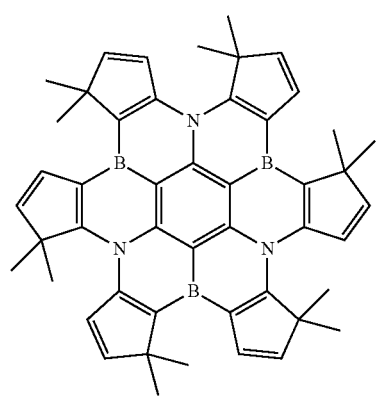

-continued
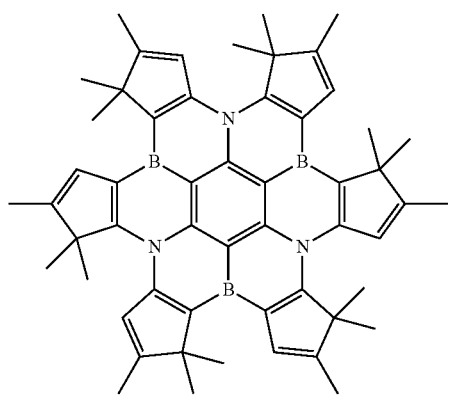
M-15
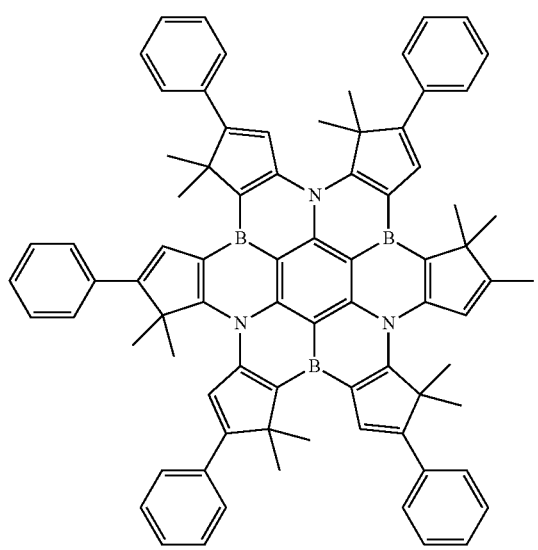
M-16
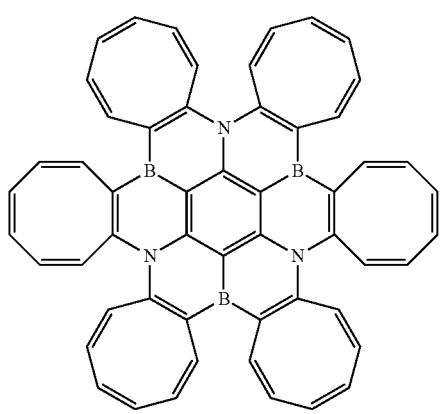
M-17

-continued
M-18
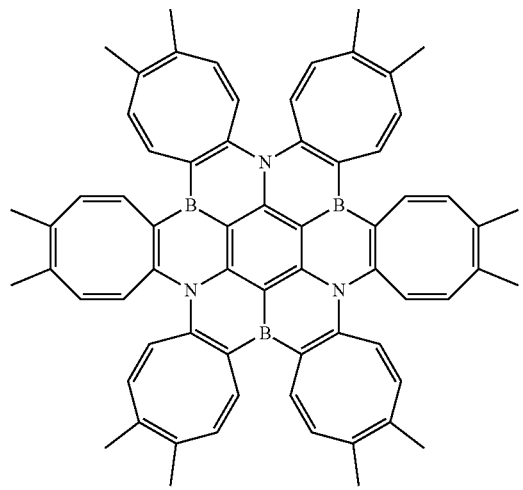
M-19
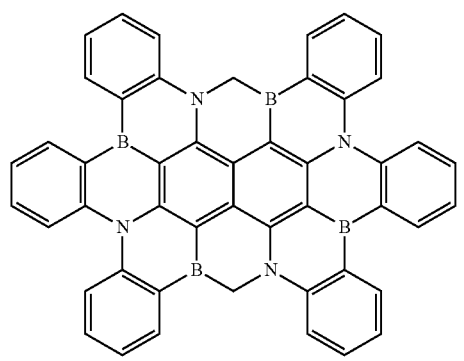
M-20
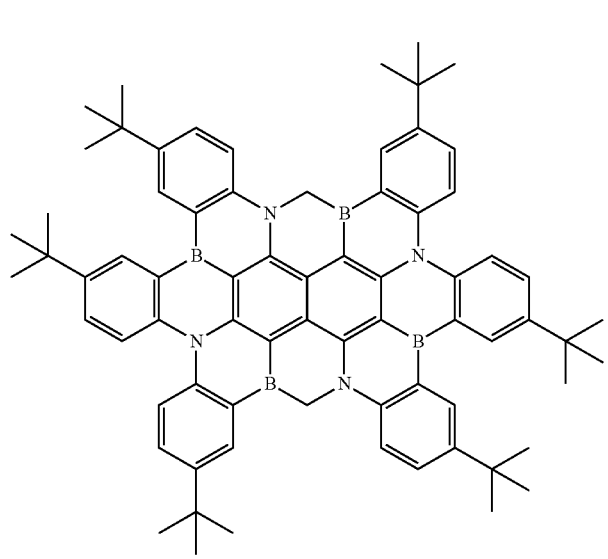

-continued
M-21
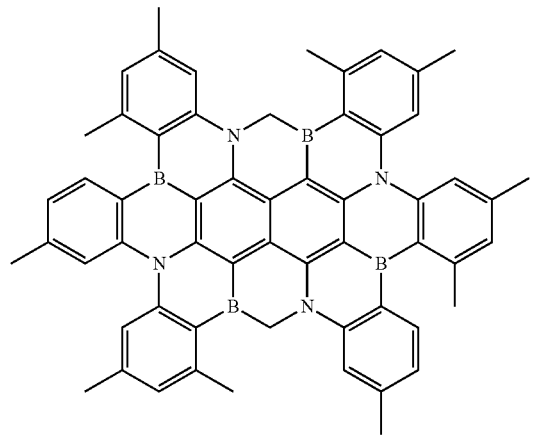
M-22
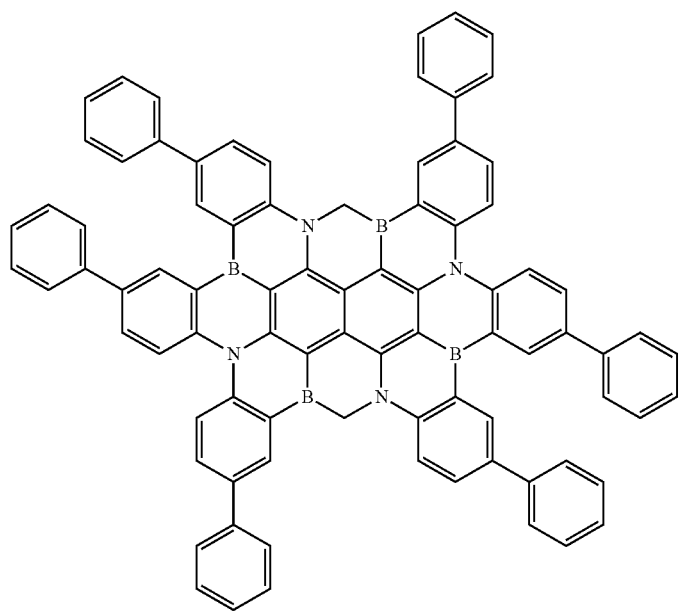
M-23
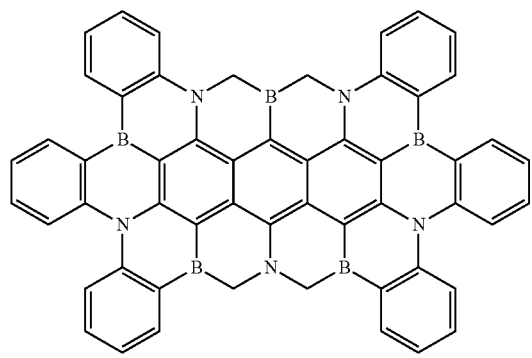

M-24
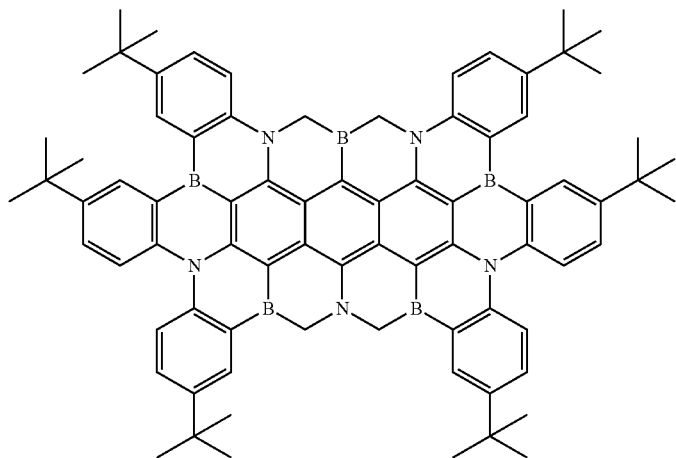
M-25
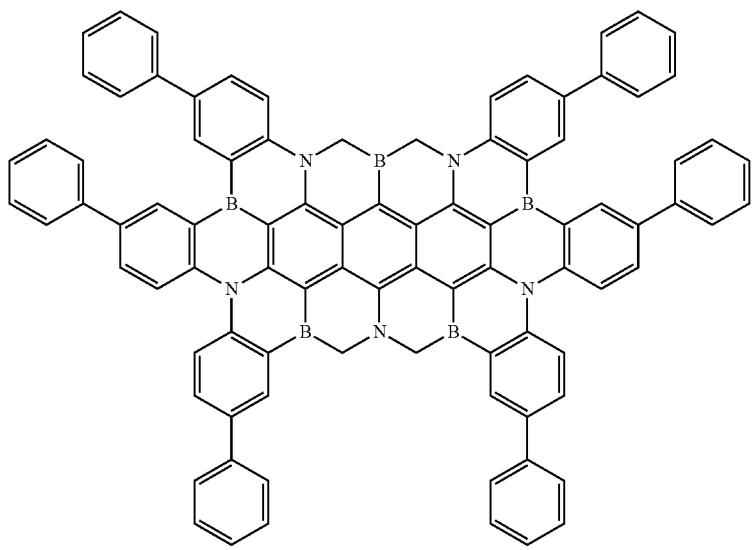
M-26
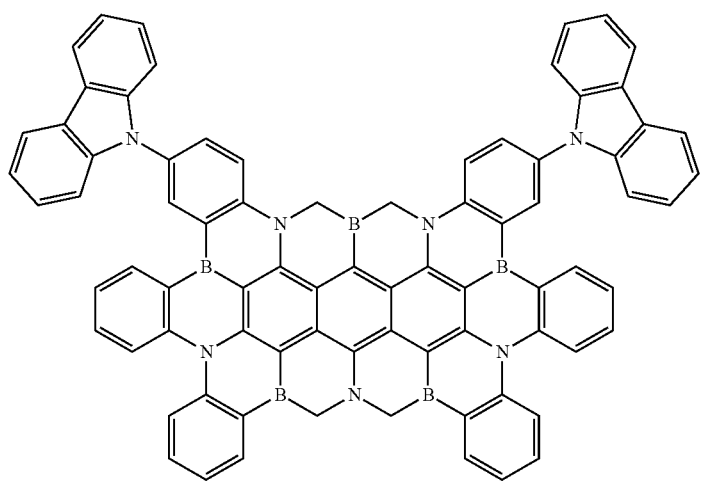

-continued
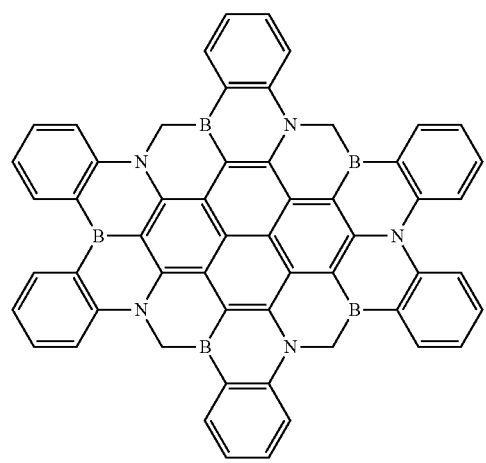
M-27
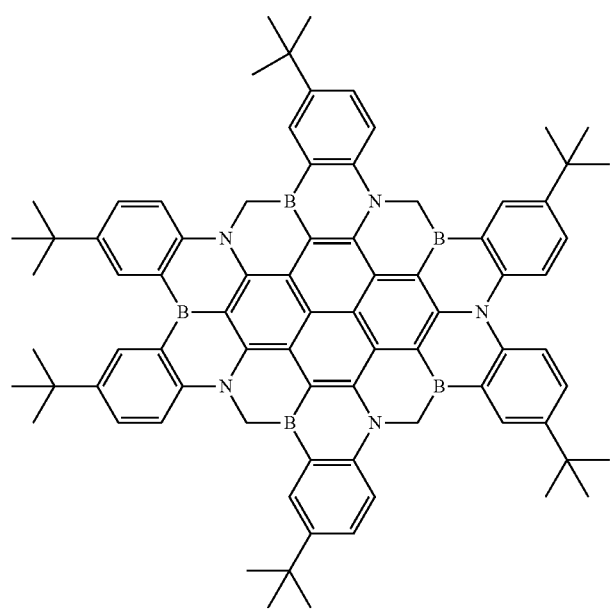
M-28
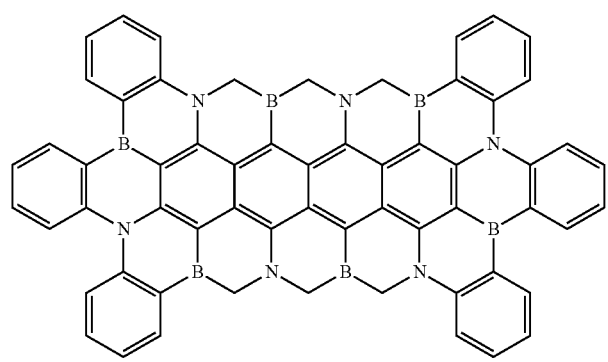
M-29

M-30
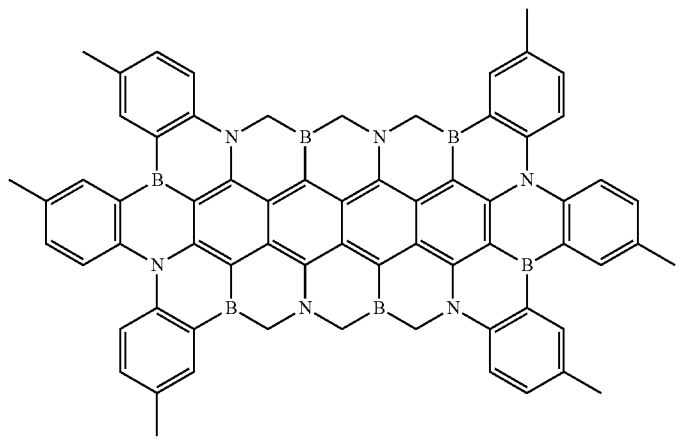
M-31
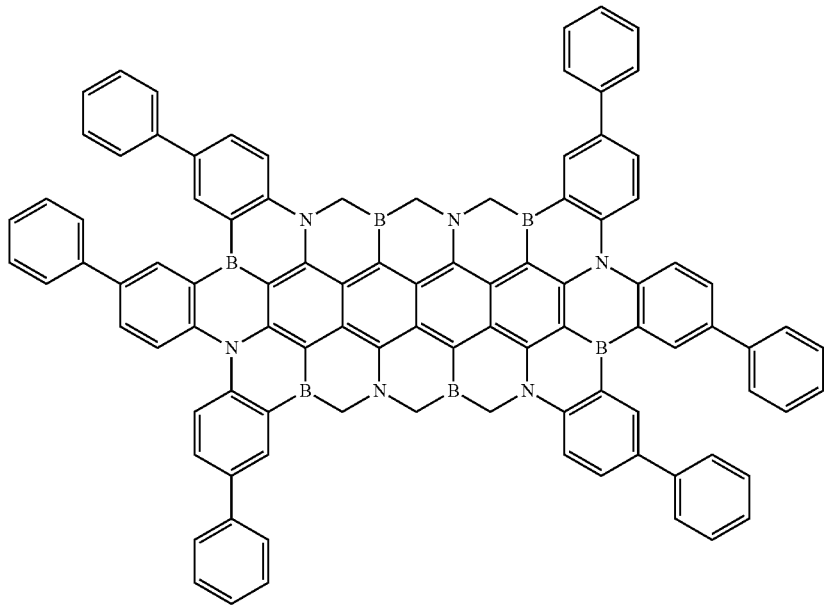
M-32
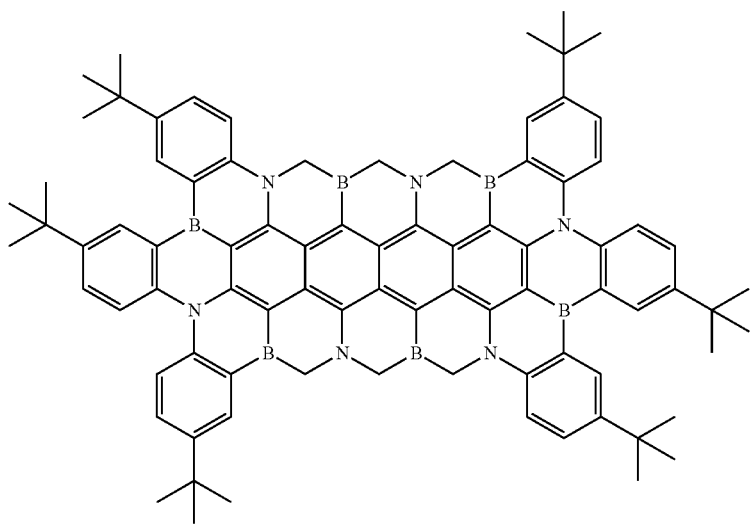

-continued
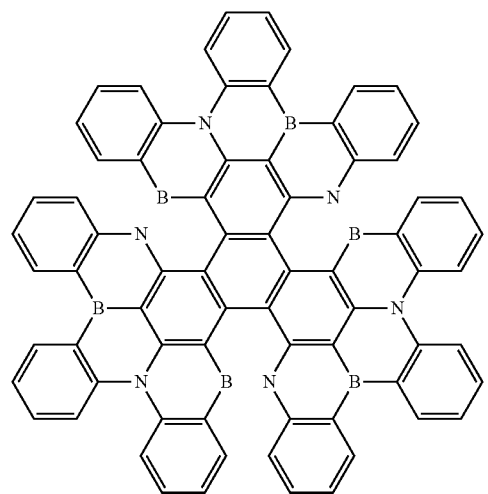
M-33
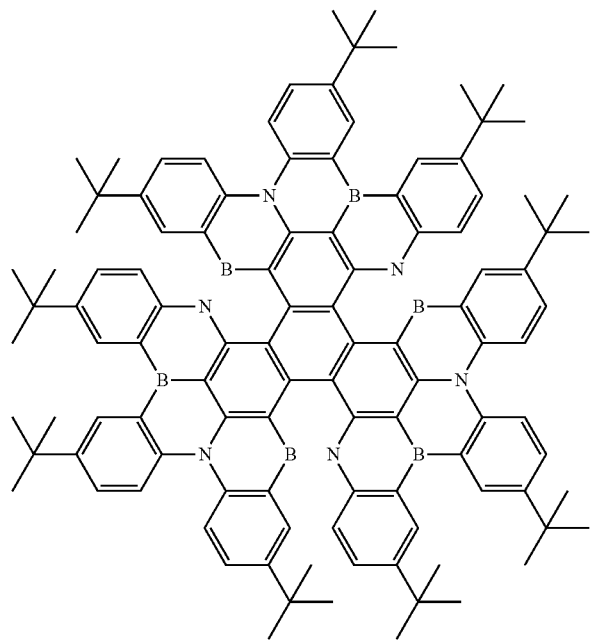
M-34
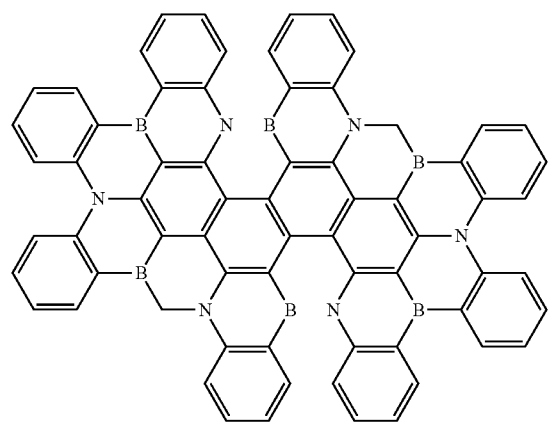
M-35

-continued
M-36
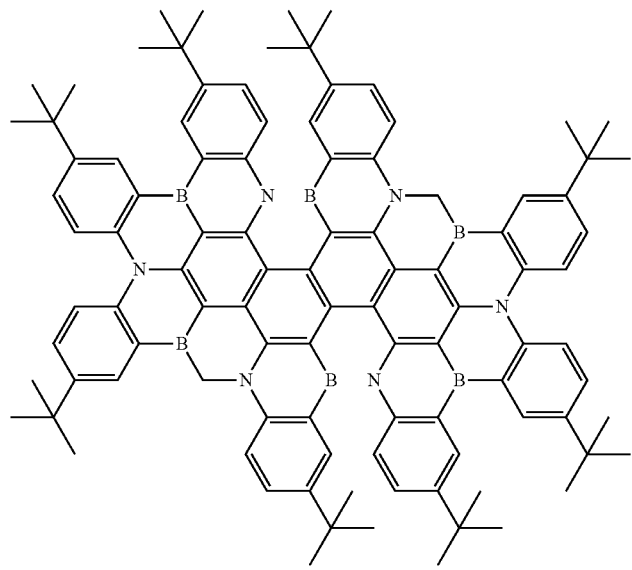
M-37
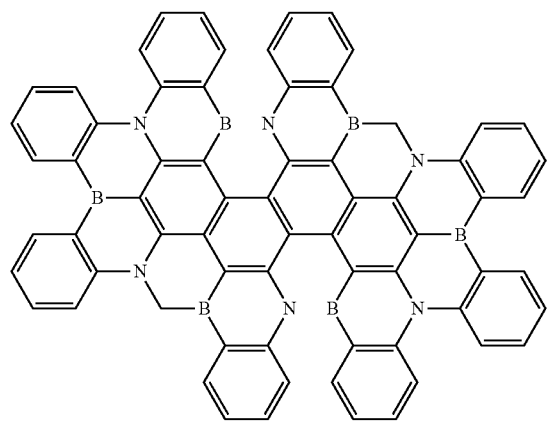
M-38
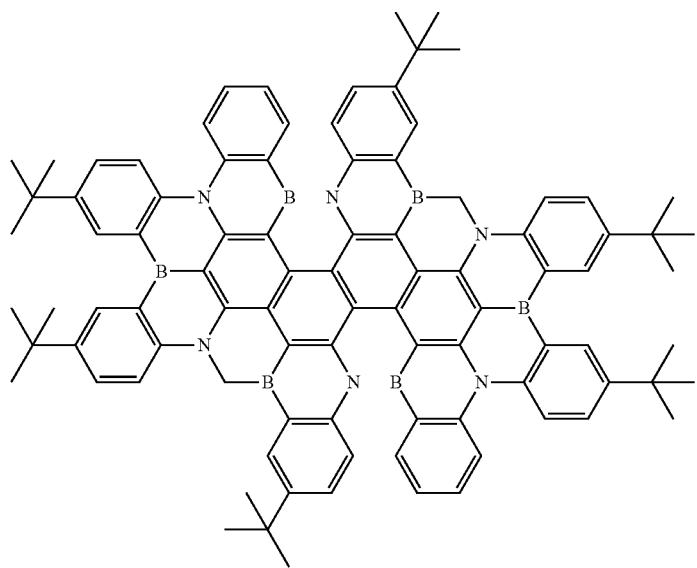

M-39
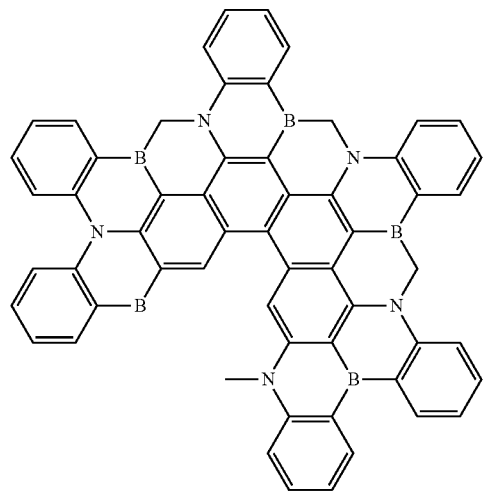
M-40
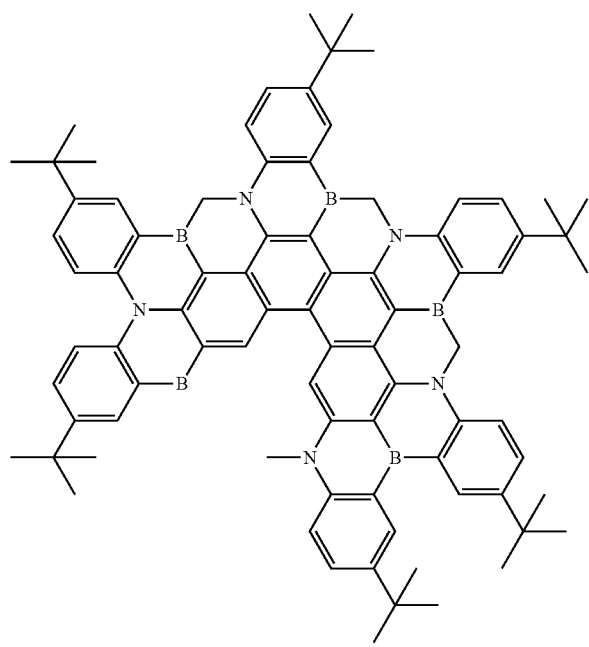
M-41
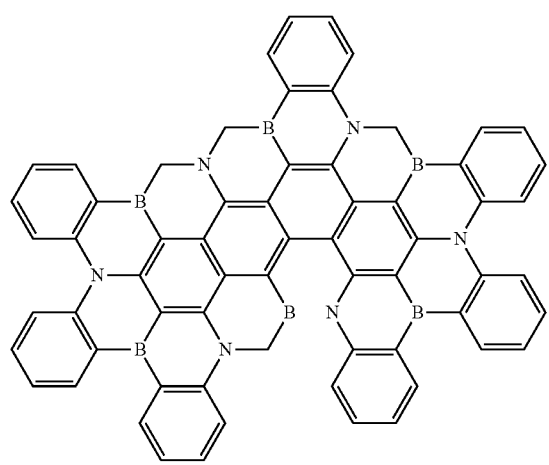

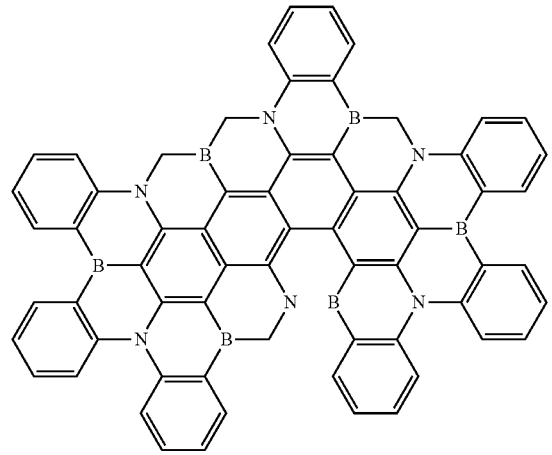
M-42
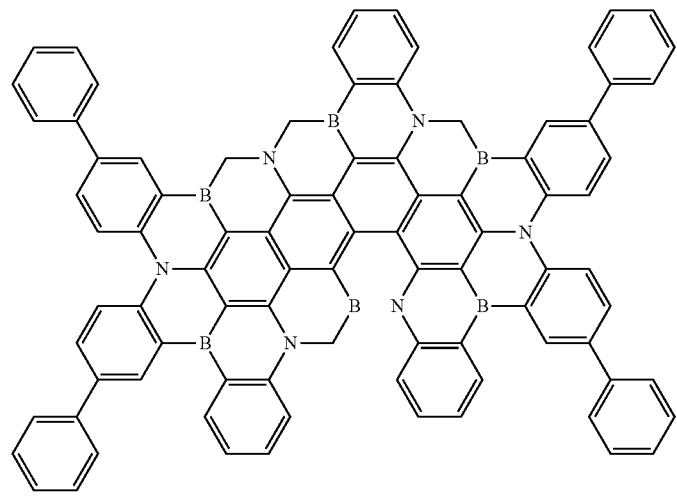
M-43
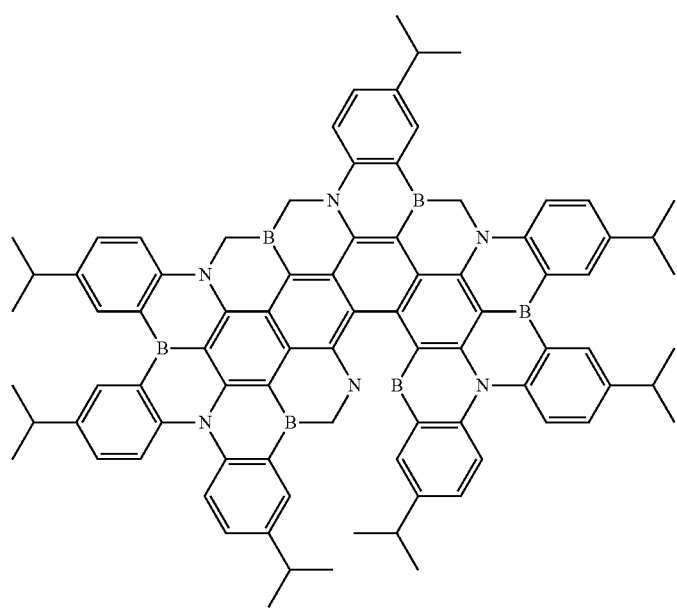
M-44

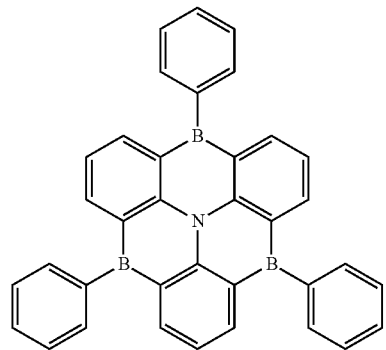
M-45
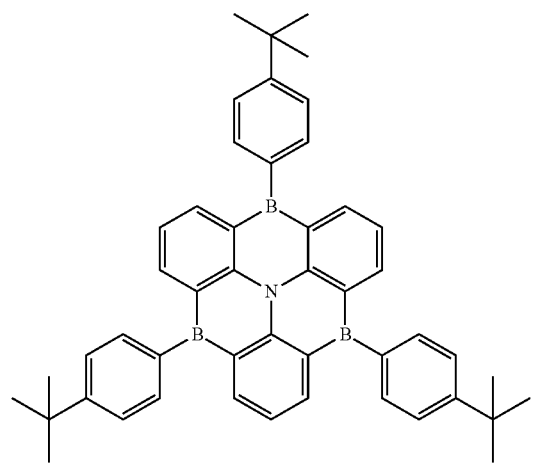
M-46
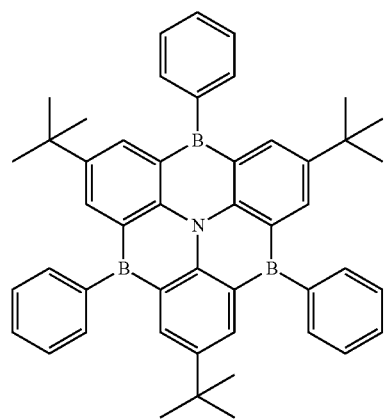
M-47

-continued
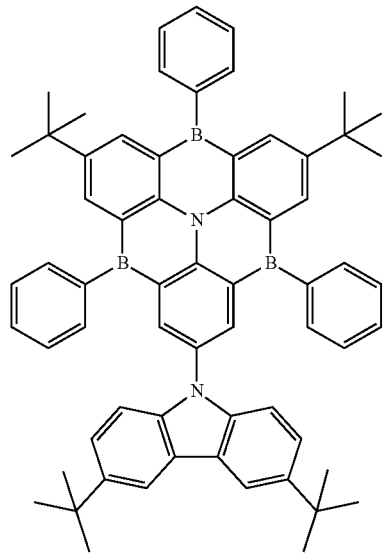
M-48
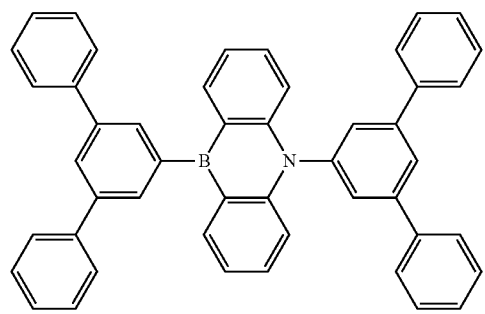
M-49
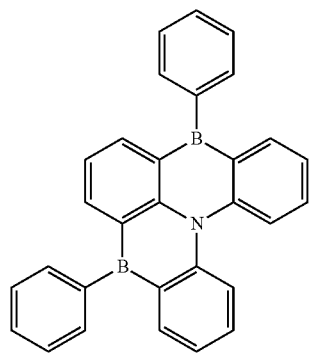
M-50

-continued
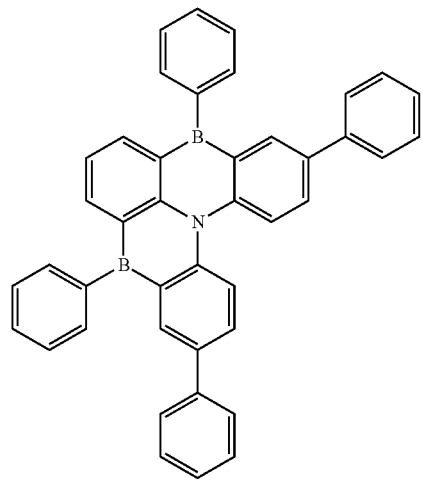
M-51
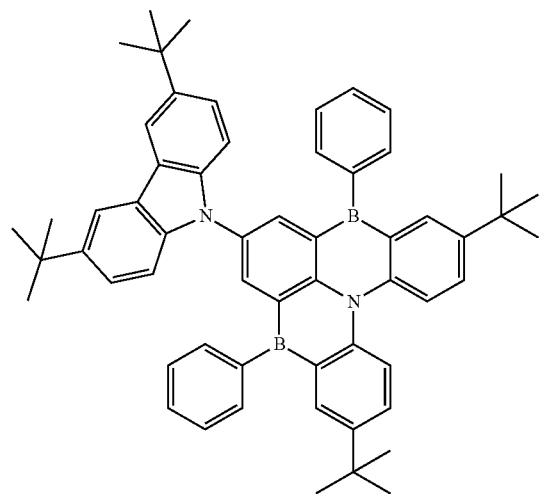
M-52
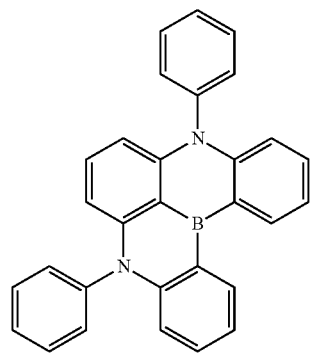
M-53

M-54
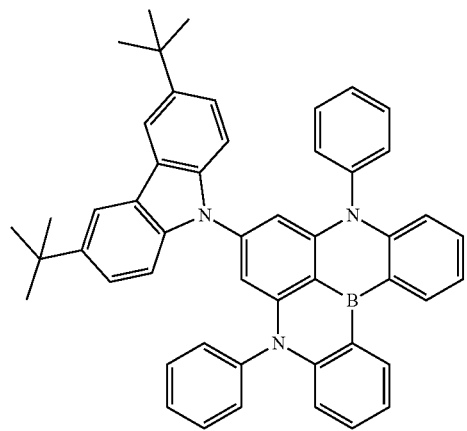
M-55
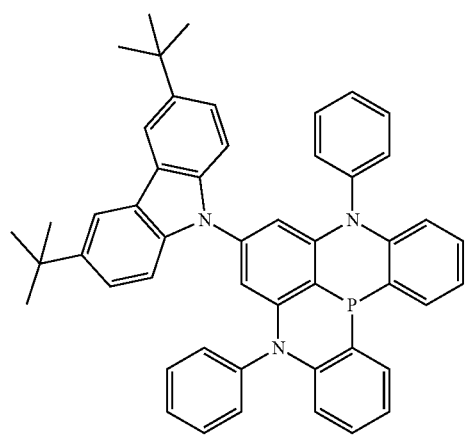
M-56
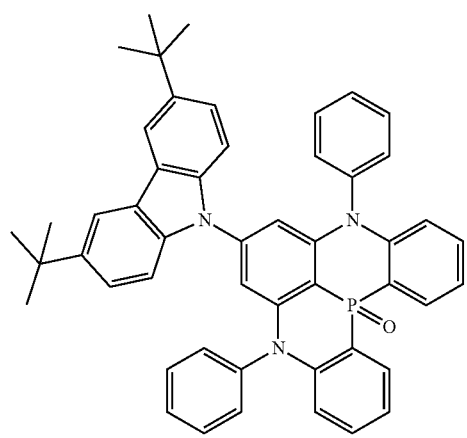

M-57
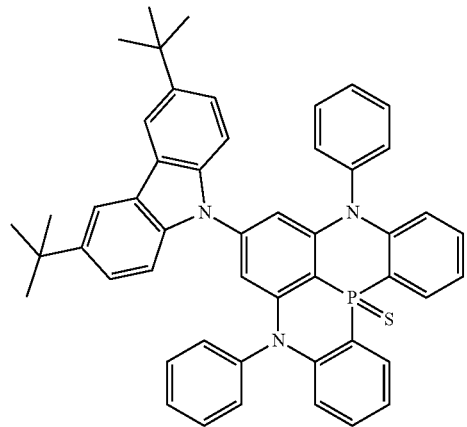
M-58
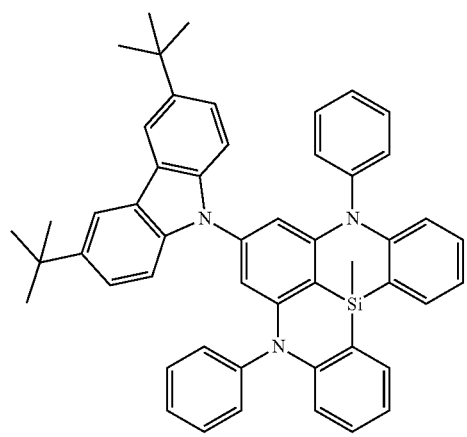
M-59
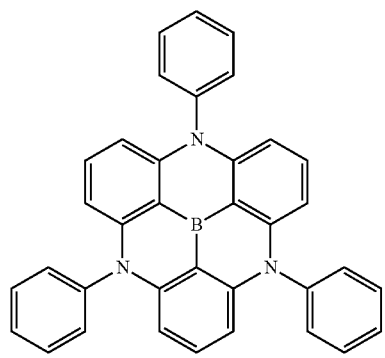

M-60
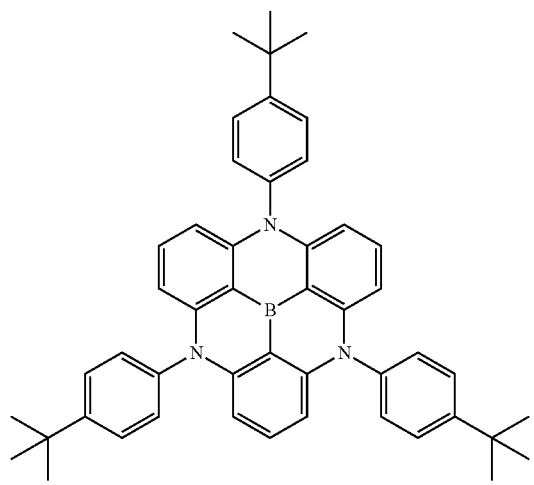
M-61
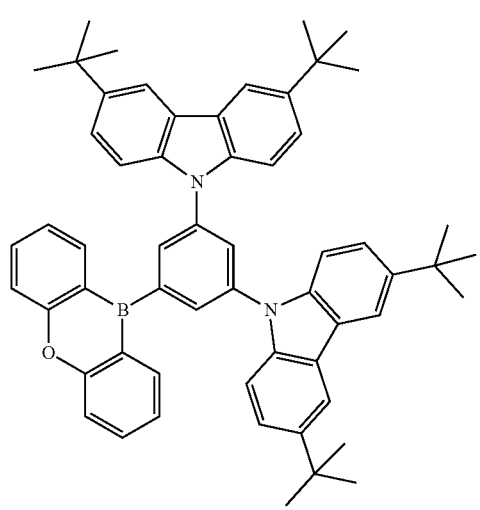
M-62
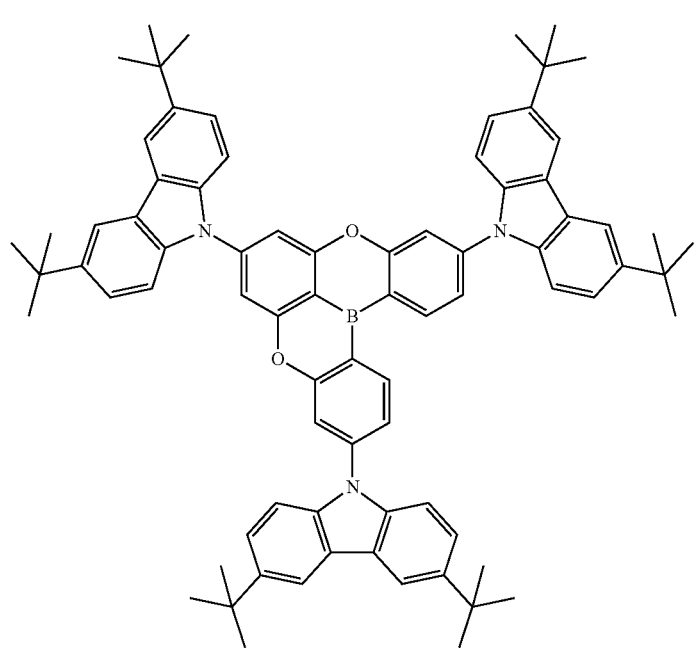

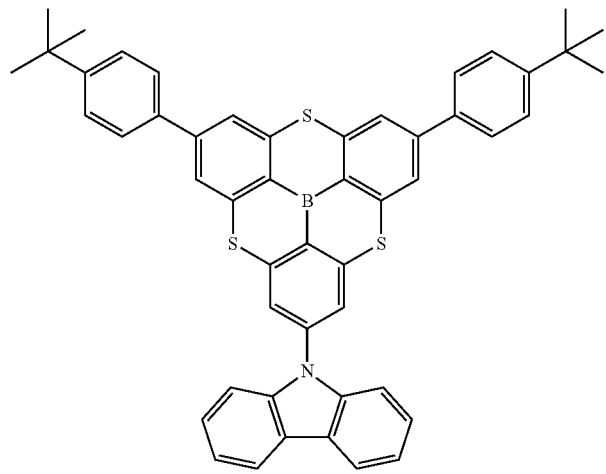
M-63
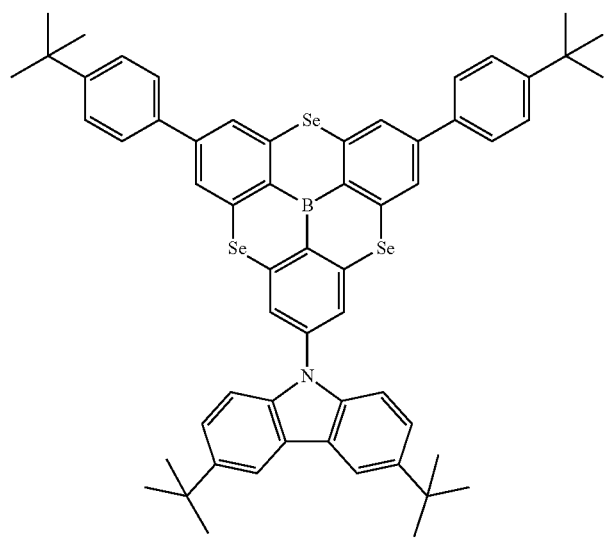
M-64
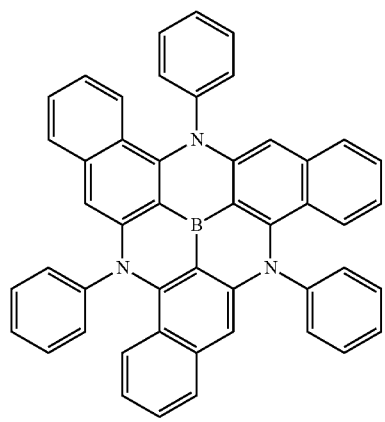
M-65

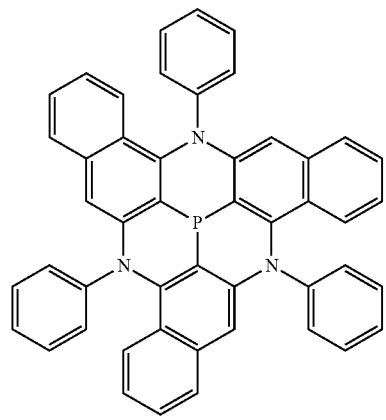
M-66
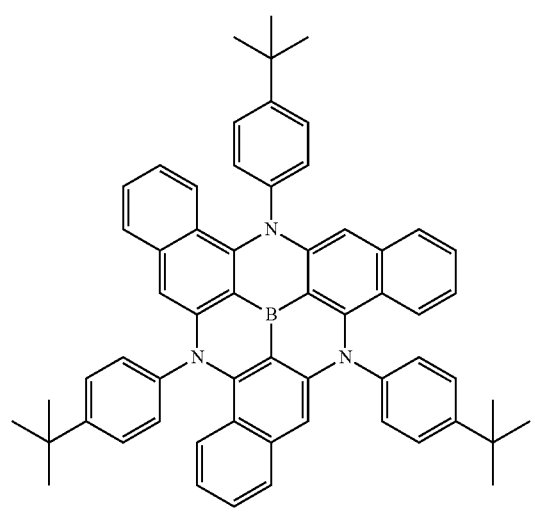
M-67
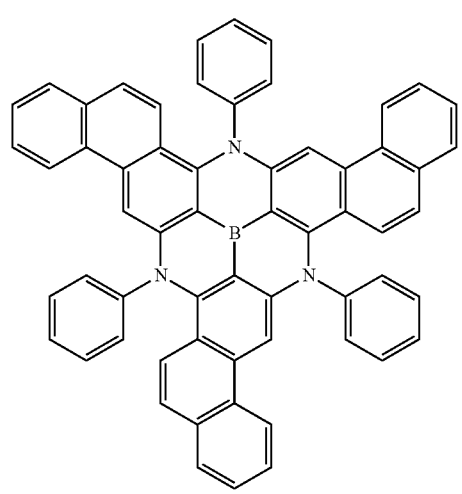
M-68

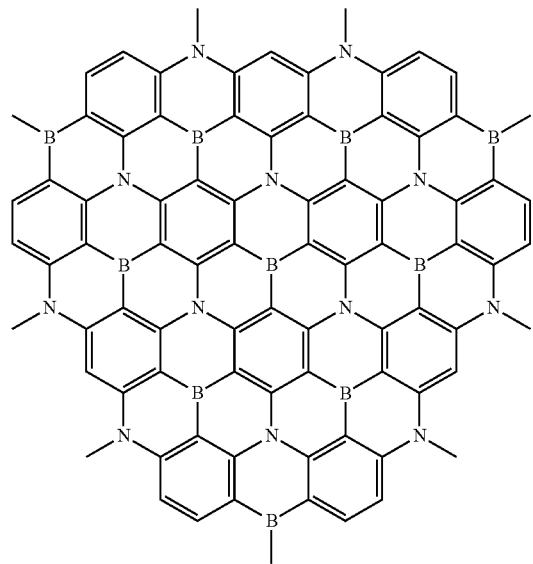
M-69
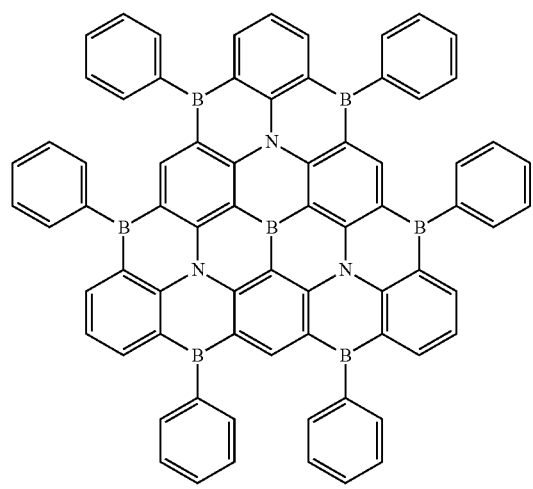
M-70
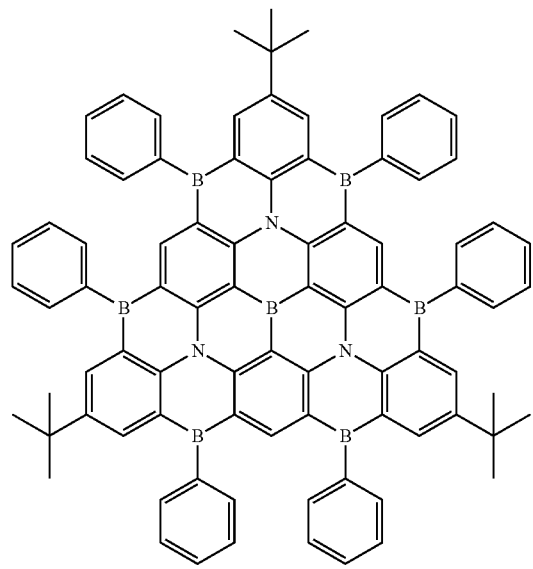
M-71

-continued

M-72

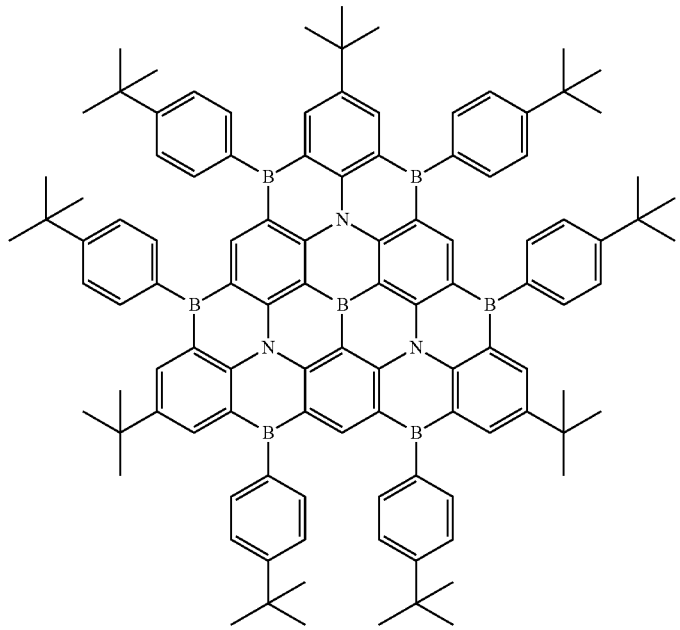

7. The organic electroluminescence device according to claim 1, wherein the resonance thermally activated delayed fluorescent material has a molecular weight of 200-2000.

8. The organic electroluminescence device according to claim 1, wherein the exciplex comprises an electron donor material and an electron acceptor material, the electron donor material being a component having characteristic of hole transporting and containing at least one of carbazolyl, arylamino, silyl, fluorenyl, dibenzothienyl, and dibenzofurylaryl;
and/or, the electron acceptor material being component having characteristic of electron transporting and containing at least one of pyridyl, pyrimidinyl, triazinyl, imidazolyl, phenanthroline, sulfone, heptazinyl, oxadiazolyl, cyano, and diphenyl.

9. The organic electroluminescence device according to claim 8, wherein the weight ratio of the electron donor material to the electron acceptor material in the exciplex is 1:9-9:1.

10. The organic electroluminescence device according to claim 1, wherein the wide bandgap material is a compound comprising at least one of carbazolyl, carbolinyl, spirofluorenyl, fluorenyl, silyl, and phosphonooxy.

11. The organic electroluminescence device according to claim 1, wherein a percentage of the exciplex in the organic light emitting layer is 1 wt %-60 wt %;
a percentage of the wide bandgap material in the organic light emitting layer is 20 wt %-98.9 wt %; and
a percentage of the resonance thermally activated delayed fluorescent material in the organic light emitting layer is 0.1 wt %-20 wt %.

12. A display apparatus, comprising the organic electroluminescence device according to claim 1.

13. A method for preparing an organic electroluminescence device, comprising the following steps: forming an organic light emitting layer by co-evaporation plating of a wide bandgap material, an electron donor material, an electron acceptor material, and a resonance thermally activated delayed fluorescent material.

14. The method for preparing an organic electroluminescence device according to claim 13, wherein before the forming an organic light emitting layer, further comprising:
providing a substrate having an anode material thereon;
performing evaporation plating of a hole transporting region material onto the substrate to form a hole transporting region, wherein the evaporation plating is performed under conditions of $1 \times 10^{-5} \sim 9 \times 10^{-3}$ Pa at an evaporation plating rate of 0.1 to 0.5 nm/s.

15. The method for preparing an organic electroluminescence device according to claim 13, wherein after the forming an organic light emitting layer, the method further comprises: performing evaporation plating of an electron transporting region material on the organic light emitting layer to form an electron transporting region, wherein an evaporation plating rate is 0.1-0.5 nm/s.

16. The method for preparing an organic electroluminescence device according to claim 13, further comprising a step of forming a cathode over the organic light emitting layer: performing evaporation plating of a cathode material to form a cathode, and an evaporation plating rate is 0.5 to 1 nm/s.

* * * * *